(12) United States Patent
Foo

(10) Patent No.: US 11,836,385 B2
(45) Date of Patent: Dec. 5, 2023

(54) HIGH SPEED DATA PACKET FLOW PROCESSING

(71) Applicant: fmad engineering kabushiki gaisha, Tokyo (JP)

(72) Inventor: Aaron Foo, Tokyo (JP)

(73) Assignee: fmad engineering kabushiki gaisha, Tokyo (JP)

(*) Notice: Subject to any disclaimer, the term of this patent is extended or adjusted under 35 U.S.C. 154(b) by 0 days.

(21) Appl. No.: 17/835,809

(22) Filed: Jun. 8, 2022

(65) Prior Publication Data
US 2022/0300213 A1   Sep. 22, 2022

Related U.S. Application Data

(63) Continuation of application No. 16/854,071, filed on Apr. 21, 2020, now Pat. No. 11,392,317, which is a
(Continued)

(51) Int. Cl.
*G06F 3/06*      (2006.01)
*G06F 13/28*     (2006.01)
(Continued)

(52) U.S. Cl.
CPC ............ *G06F 3/0659* (2013.01); *G06F 3/061* (2013.01); *G06F 3/0604* (2013.01); *G06F 3/067* (2013.01);
(Continued)

(58) Field of Classification Search
None
See application file for complete search history.

(56) References Cited

U.S. PATENT DOCUMENTS

| 5,193,071 A | 3/1993 | Umina et al. |
| 5,317,734 A * | 5/1994 | Gupta ................. G06F 8/45 709/248 |

(Continued)

FOREIGN PATENT DOCUMENTS

JP    2015-023323    2/2015

OTHER PUBLICATIONS

"Libpcap File Format," The Wireshark Wiki, https://wiki.wireshark.org/Development/LibpcapFileFormat, 2015, 3 pages.
(Continued)

*Primary Examiner* — Cynthia Britt
*Assistant Examiner* — Rong Tang
(74) *Attorney, Agent, or Firm* — McDonnell Boehnen Hulbert & Berghoff LLP

(57) ABSTRACT

An embodiment may involve a network interface configured to capture data packets into a binary format and a non-volatile memory configured to temporarily store the data packets received by way of the network interface. The embodiment may also involve a first array of processing elements each configured to independently and asynchronously: (i) read a chunk of data packets from the non-volatile memory, (ii) identify flows of data packets within the chunk, and (iii) generate flow representations for the flows. The embodiment may also involve a second array of processing elements configured to: (i) receive the flow representations from the first array of processing elements, (ii) identify and aggregate common flows across the flow representations into an aggregated flow representation, (iii) based on a filter specification, remove one or more of the flows from the aggregated flow representation, and (iv) write information from the aggregated flow representation to the database.

20 Claims, 33 Drawing Sheets

Related U.S. Application Data continuation-in-part of application No. 16/689,867, filed on Nov. 20, 2019, now Pat. No. 11,036,438, which is a continuation-in-part of application No. 16/528,952, filed on Aug. 1, 2019, now Pat. No. 10,831,408, which is a continuation of application No. 15/609,729, filed on May 31, 2017, now Pat. No. 10,423,358.

(51) Int. Cl.
  *G06F 16/182* (2019.01)
  *G11C 29/52* (2006.01)
  *G06F 11/10* (2006.01)

(52) U.S. Cl.
  CPC .......... *G06F 3/0631* (2013.01); *G06F 3/0643* (2013.01); *G06F 11/1068* (2013.01); *G06F 13/287* (2013.01); *G06F 16/182* (2019.01); *G11C 29/52* (2013.01)

(56) References Cited

U.S. PATENT DOCUMENTS

| | | | |
|---|---|---|---|
| 5,442,708 | A | 8/1995 | Adams, Jr. |
| 5,671,237 | A | 9/1997 | Zook |
| 6,021,429 | A | 2/2000 | Danknick |
| 6,052,362 | A | 4/2000 | Somer |
| 6,069,898 | A | 5/2000 | Nakatsugawa |
| 6,098,155 | A | 8/2000 | Chong, Jr. |
| 6,112,294 | A | 8/2000 | Merchant |
| 6,173,333 | B1 | 1/2001 | Jolitz |
| 6,175,571 | B1 | 1/2001 | Haddock et al. |
| 6,236,658 | B1 | 5/2001 | Essbaum |
| 6,272,131 | B1 | 8/2001 | Ofek |
| 6,414,966 | B1 | 7/2002 | Kulkarni et al. |
| 6,571,318 | B1 | 5/2003 | Sander et al. |
| 7,009,967 | B1 | 3/2006 | Hariharasubrahmanian |
| 7,054,911 | B1 | 5/2006 | Ango et al. |
| 7,540,029 | B1 | 5/2009 | Saxena |
| 7,631,193 | B1 | 12/2009 | Hoffman |
| 8,433,777 | B1 | 4/2013 | Liu |
| 8,880,696 | B1 | 11/2014 | Michels |
| 9,426,071 | B1 | 8/2016 | Caldejon et al. |
| 9,674,298 | B1 | 6/2017 | Edwards et al. |
| 9,756,154 | B1 | 9/2017 | Jiang |
| 10,013,200 | B1 * | 7/2018 | Shveidel ............... G06F 3/0613 |
| 2001/0030943 | A1 | 10/2001 | Gregg et al. |
| 2001/0038607 | A1 | 11/2001 | Honda |
| 2002/0188742 | A1 * | 12/2002 | Nie .................. H04L 49/90 709/230 |
| 2003/0037337 | A1 | 2/2003 | Yona |
| 2003/0058872 | A1 | 3/2003 | Berggreen et al. |
| 2003/0081554 | A1 | 5/2003 | Huang |
| 2003/0099250 | A1 | 5/2003 | Blanc et al. |
| 2004/0156313 | A1 * | 8/2004 | Hofmeister ......... H04L 12/4633 370/229 |
| 2004/0193876 | A1 | 9/2004 | Donley et al. |
| 2004/0233846 | A1 | 11/2004 | Khandani et al. |
| 2004/0236982 | A1 | 11/2004 | Greer |
| 2005/0013300 | A1 * | 1/2005 | Akahane .............. H04L 43/00 370/395.3 |
| 2005/0220014 | A1 | 10/2005 | DelRegno et al. |
| 2007/0061492 | A1 * | 3/2007 | van Riel .............. H04L 69/22 710/3 |
| 2007/0116292 | A1 | 5/2007 | Kurita |
| 2007/0248110 | A1 | 10/2007 | Oz et al. |
| 2008/0126449 | A1 | 5/2008 | Haitsma |
| 2008/0148011 | A1 | 6/2008 | Gopal |
| 2008/0158958 | A1 * | 7/2008 | Sokolov ............... G11C 16/26 365/185.08 |
| 2009/0077561 | A1 * | 3/2009 | Feng ..................... G06F 9/5066 718/104 |
| 2009/0164752 | A1 | 6/2009 | McConnell |
| 2009/0310491 | A1 * | 12/2009 | Ginsberg .............. H04L 43/026 370/241 |
| 2010/0054128 | A1 * | 3/2010 | O'Hern ................. H04L 67/306 370/235 |
| 2010/0250709 | A1 | 9/2010 | Mallett |
| 2010/0332671 | A1 | 12/2010 | Alfonso |
| 2011/0026406 | A1 | 2/2011 | Gamage et al. |
| 2011/0145491 | A1 | 6/2011 | Hartwich |
| 2011/0205828 | A1 | 8/2011 | Richter et al. |
| 2012/0137055 | A1 | 5/2012 | Lee et al. |
| 2012/0182891 | A1 | 7/2012 | Lee et al. |
| 2013/0067137 | A1 | 3/2013 | Molloy |
| 2013/0097220 | A1 | 4/2013 | Lyons et al. |
| 2013/0119243 | A1 | 5/2013 | Yuan |
| 2013/0145105 | A1 | 6/2013 | Sawicki |
| 2013/0151584 | A1 | 6/2013 | Westphal |
| 2013/0227236 | A1 | 8/2013 | Flynn et al. |
| 2013/0315237 | A1 | 11/2013 | Kagan |
| 2013/0329744 | A1 | 12/2013 | Tachiya et al. |
| 2014/0010083 | A1 | 1/2014 | Hamdi et al. |
| 2014/0071866 | A1 | 3/2014 | Maciocco et al. |
| 2014/0277850 | A1 * | 9/2014 | Jobs .................. H04M 1/72415 701/2 |
| 2015/0227757 | A1 | 8/2015 | Bestler |
| 2015/0312384 | A1 | 10/2015 | Sankaran |
| 2015/0341473 | A1 | 11/2015 | Dumitrescu et al. |
| 2016/0127276 | A1 * | 5/2016 | Wu ........................ H04L 43/12 709/224 |
| 2016/0156516 | A1 * | 6/2016 | Nishi ..................... H04L 43/16 370/329 |
| 2016/0246710 | A1 | 8/2016 | Shimizu et al. |
| 2016/0259693 | A1 | 9/2016 | Sundararaman et al. |
| 2017/0063992 | A1 | 3/2017 | Baek et al. |
| 2017/0199707 | A1 | 7/2017 | Varghese et al. |
| 2017/0344439 | A1 | 11/2017 | Howe |
| 2018/0095675 | A1 * | 4/2018 | Kachare ............... G06F 3/0688 |

OTHER PUBLICATIONS

"Manpage of TCPDUMP," http://tcpdump.org/manpages/tcpdump.1.html, 2017, 20 pages.

"PlayStation 2 technical specifications," https://en.wikipedia.org/wiki/PlayStation_2_technical_specifications, 2019.

"GitHub—fmadio_pcap_bpfcounter_PCAP Packet counter with multiple BPF filters," https://github.com/fmadio/pcap_bpfcounter, Apr. 22, 2020, 2 pages.

"GitHub—fmadio_pcap2json_High Speed PCAP to JSON conversion utility.pdf," https://github.com/fmadio/pcap2json, Apr. 22, 2020, 5 pages.

Notice of Allowance dated Dec. 9, 2021, issued in connection with U.S. Appl. No. 17/034,593, filed Sep. 28, 2020, 13 pages.

Japanese Office Action for Japanese Application No. 2019-150667 dated Dec. 21, 2020, 6 pages.

Notice of Allowability or Allowance dated May 19, 2021 for U.S. Appl. No. 16/590,855, 22 pages.

Office Action dated Oct. 27, 2021 for U.S. Appl. No. 17/034,593, 25 pages.

Kesavan et al., "Optimal Multicast with Packetization and Network Interface Support", 1997, IEEE, pp. 370-377.

Non-Final Office Action for U.S. Appl. No. 16/689,867 dated Feb. 2, 2021, 40 pages.

Notice of Allowance, U.S. Appl. No. 17/320,393, dated Mar. 8, 2023.

Non-Final Office Action for U.S. Appl. No. 16/590,855 dated Mar. 11, 2021, 38 pages.

Notice of Allowance and Notice of Allowability for U.S. Appl. No. 16/705,884 dated Feb. 3, 2021, 25 pages.

Notice of Allowance, U.S. Appl. No. 17/216,014, dated Mar. 14, 2023.

* cited by examiner

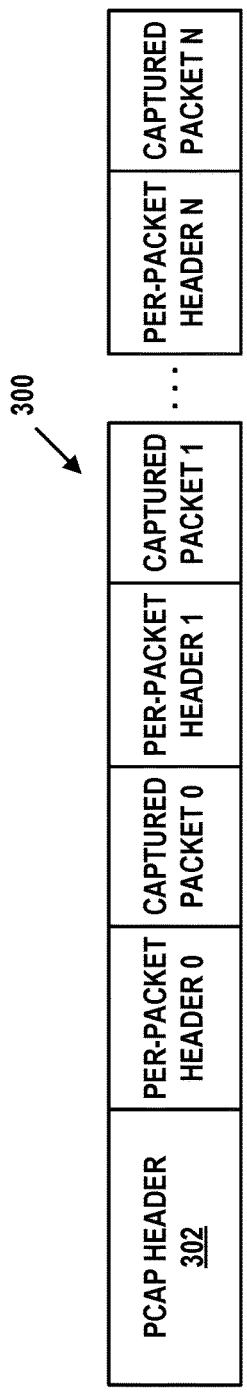
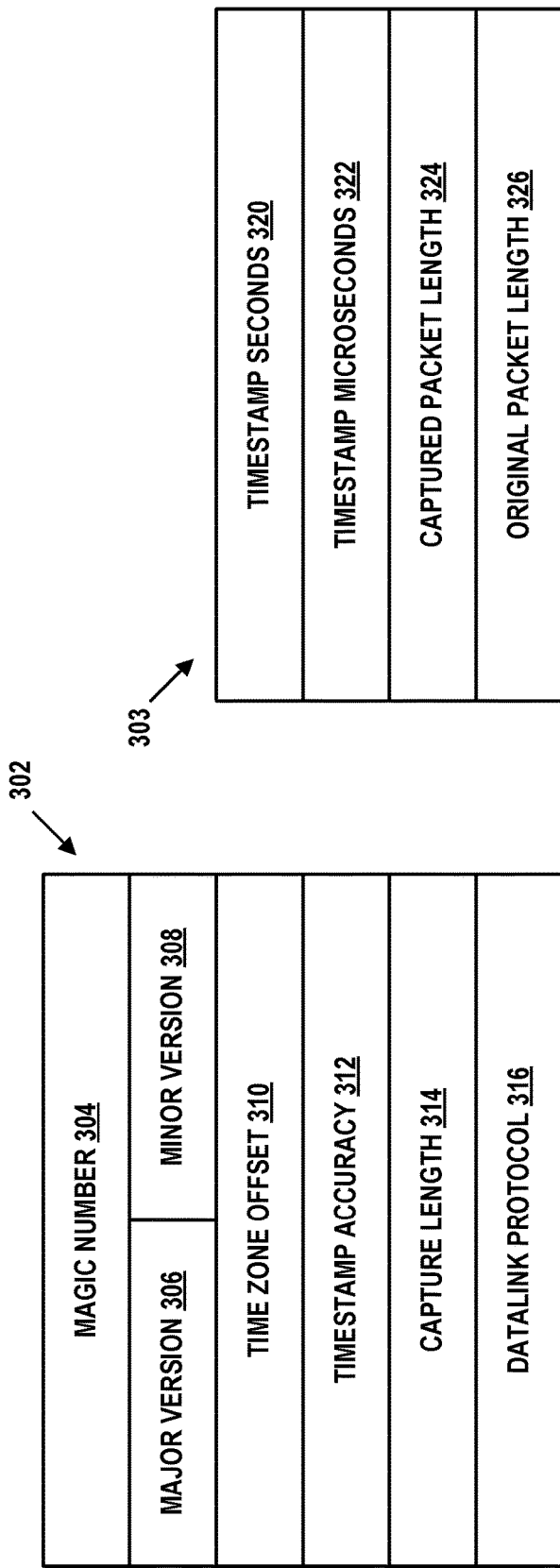
FIG. 3A
FIG. 3B
FIG. 3C

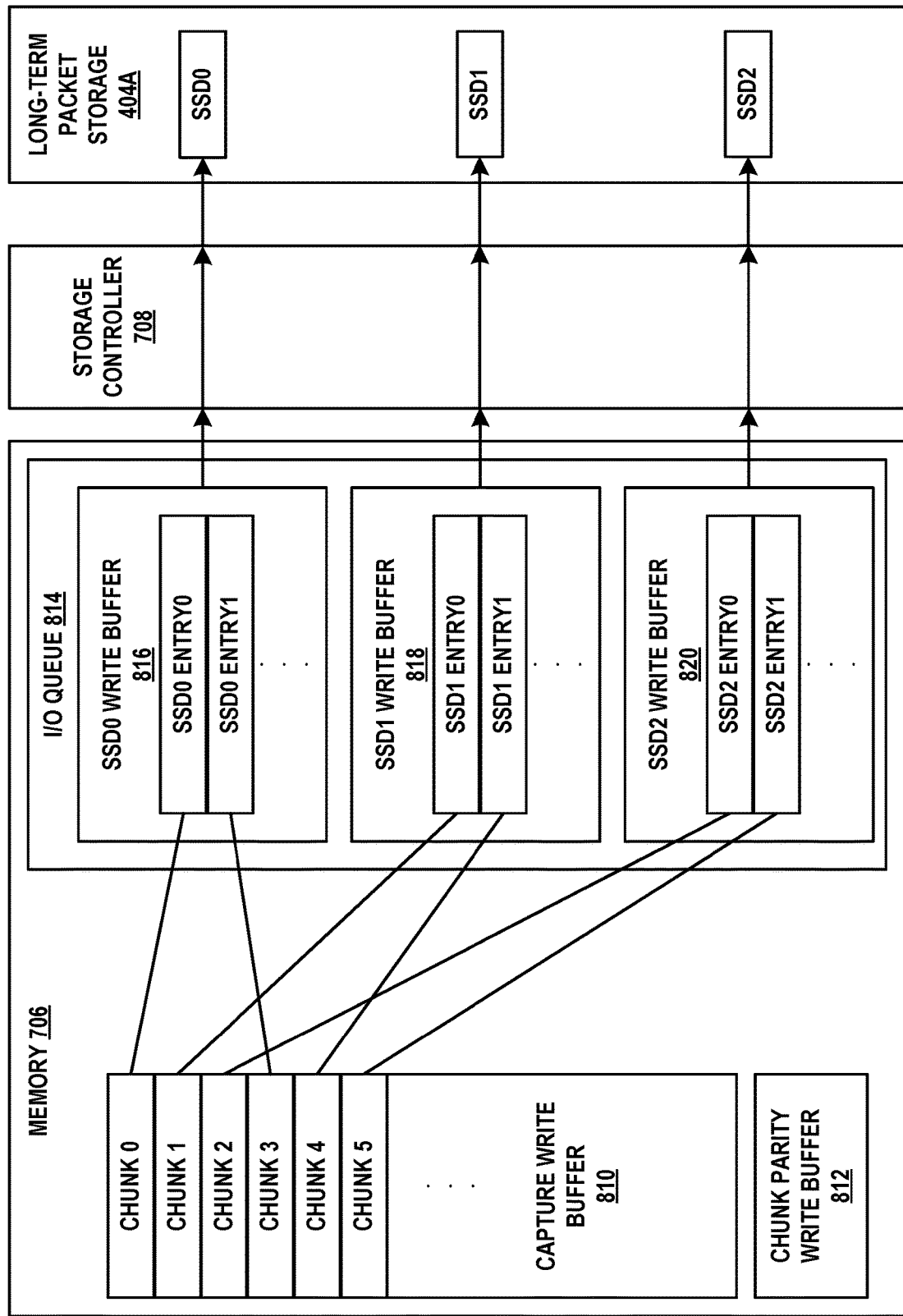

```
{
"timestamp":1497015593700,
"FlowCnt":0,
"Device":"100v2-228",
"hash":"f12f2b43d6b775da29216a33c43327a20c644a8c",
"TotalPkt":1393327,
"TotalByte":1914431298,
"TotalBits":15315450384,
"TotalFCS":0,
"MACSrc":"7c:e2:ca:bd:ff:d9",
"MACDst":"00:0e:52:80:e3:16",
"MACProto":"IPv4",
"VLAN.0":null,
"VLAN.1":null,
"MPLS.0.Label":null,
"MPLS.0.TC":null,
"MPLS.1.Label":null,
"MPLS.1.TC":null,
"MPLS.2.Label":null,
"MPLS.2.TC":null,
"IPv4.Src":"192.168.0.14",
"IPv4.Dst":"192.168.0.30",
"IPv4.Proto":"UDP",
"IPv4.DSCP":null,
"UDP.Port.Src":10662,
"UDP.Port.Dst":5004,
"TCP.Port.Src":null,
"TCP.Port.Dst":null,
"TCP.FIN":null,
"TCP.SYN":null,
"TCP.RST":null,
"TCP.PSH":null,
"TCP.ACK":null,
"TCP.WindowMin":null,
"TCP.WindowMax":null,
"TCP.SACK":null
}
```
← 1410

```
{
"timestamp":1497015593702,
"FlowCnt":0,
"Device":"100v2-228",
"hash":"f12f2b43d6b775da29216a33c43327a20c644a8c",
"TotalPkt":1393328,
"TotalByte":1914432298,
"TotalBits":15315458384,
"TotalFCS":0,
"MACSrc":"7c:e2:ca:bd:ff:d9",
"MACDst":"00:0e:52:80:e3:16",
"MACProto":"IPv4",
"VLAN.0":null,
"VLAN.1":null,
"MPLS.0.Label":null,
"MPLS.0.TC":null,
"MPLS.1.Label":null,
"MPLS.1.TC":null,
"MPLS.2.Label":null,
"MPLS.2.TC":null,
"IPv4.Src":"192.168.0.14",
"IPv4.Dst":"192.168.0.30",
"IPv4.Proto":"UDP",
"IPv4.DSCP":null,
"UDP.Port.Src":10662,
"UDP.Port.Dst":5004,
"TCP.Port.Src":null,
"TCP.Port.Dst":null,
"TCP.FIN":null,
"TCP.SYN":null,
"TCP.RST":null,
"TCP.PSH":null,
"TCP.ACK":null,
"TCP.WindowMin":null,
"TCP.WindowMax":null,
"TCP.SACK":null
}
```
← 1412

FIG. 14B

PERFORM, BY A FIRST ARRAY OF PROCESSING ELEMENTS AND IN AN INDEPENDENT AND ASYNCHRONOUS FASHION, A FIRST SET OF OPERATIONS THAT INVOLVE: (I) READING A CHUNK OF DATA PACKETS FROM A NON-VOLATILE MEMORY, WHEREIN THE DATA PACKETS WERE RECEIVED BY WAY OF A NETWORK INTERFACE MODULE IN A BINARY FORMAT, AND WHEREIN THE NON-VOLATILE MEMORY IS CONFIGURED TO TEMPORARILY STORE THE DATA PACKETS, (II) IDENTIFYING FLOWS OF DATA PACKETS WITHIN THE CHUNK, AND (III) GENERATING FLOW REPRESENTATIONS FOR THE FLOWS, WHEREIN THE FLOW REPRESENTATIONS ARE IN AN INTERMEDIATE FORMAT THAT AGGREGATES HEADER INFORMATION AND METADATA ASSOCIATED WITH THE DATA PACKETS RESPECTIVELY CORRESPONDING TO THE FLOWS ←—1420

PERFORM, BY A SECOND ARRAY OF PROCESSING ELEMENTS, A SECOND SET OF OPERATIONS, WHEREIN THE SECOND SET OF OPERATIONS INVOLVE: (I) RECEIVING THE FLOW REPRESENTATIONS FROM THE FIRST ARRAY OF PROCESSING ELEMENTS, (II) IDENTIFYING AND AGGREGATING COMMON FLOWS ACROSS THE FLOW REPRESENTATIONS INTO AN AGGREGATED FLOW REPRESENTATION, (III) BASED ON A FILTER SPECIFICATION, REMOVING ONE OR MORE OF THE FLOWS FROM THE AGGREGATED FLOW REPRESENTATION, AND (IV) WRITING, BY WAY OF AN INTERFACE, INFORMATION FROM THE AGGREGATED FLOW REPRESENTATION TO A DATABASE ←—1422

FIG. 14C

PERFORM, BY A FIRST ARRAY OF PROCESSING ELEMENTS IN AN INDEPENDENT AND ASYNCHRONOUS FASHION, A FIRST SET OF OPERATIONS THAT INVOLVE: (I) READING A CHUNK OF DATA PACKETS FROM A NON-VOLATILE MEMORY, WHEREIN THE DATA PACKETS WERE RECEIVED BY WAY OF A NETWORK INTERFACE MODULE IN A BINARY FORMAT (II) FILTERING THE DATA PACKETS WITHIN THE CHUNK SO THAT A SUBSET OF THE DATA PACKETS REMAIN, (III) READING A CONTENT SPECIFICATION FOR A PARTICULAR TYPE OF DATA PACKET, WHEREIN THE CONTENT SPECIFICATION INDICATES HOW TO CONSTRUCT UNIQUE TRANSACTION KEYS FOR THE PARTICULAR TYPE OF DATA PACKET, AND (IV) DECODING THE DATA PACKETS IN THE SUBSET FROM THE BINARY FORMAT TO AN INTERMEDIATE FORMAT BASED ON THE CONTENT SPECIFICATION, WHEREIN THE INTERMEDIATE FORMAT INCLUDES A TRANSACTION KEY ←—1570

PERFORM, BY A SECOND ARRAY OF PROCESSING ELEMENTS, A SECOND SET OF OPERATIONS, WHEREIN THE SECOND SET OF OPERATIONS INVOLVE: (I) RECEIVING THE DATA PACKETS AS DECODED BY THE FIRST ARRAY OF PROCESSING ELEMENTS, (II) STORING, IN A HASH TABLE INDEXED BY THE TRANSACTION KEY, THE DATA PACKETS AS DECODED IN THE INTERMEDIATE FORMAT, (III) READING THE DATA PACKETS AS STORED, (IV) ANALYZING THE DATA PACKETS AS READ TO IDENTIFY A PRE-DETERMINED SET OF CHARACTERISTICS, AND (V) WRITING, BY WAY OF AN INTERFACE, THE CHARACTERISTICS IDENTIFIED BY THE ANALYSIS TO A DATABASE ←—1572

FIG. 15E

HIGH SPEED DATA PACKET FLOW PROCESSING

CROSS-REFERENCE TO RELATED APPLICATIONS

This application is a continuation of and claims priority to U.S. patent application Ser. No. 16/854,071, filed Apr. 21, 2020, which is hereby incorporated by reference in its entirety.

U.S. patent application Ser. No. 16/854,071 is a continuation-in-part of and claims priority to U.S. patent application Ser. No. 16/689,867, filed Nov. 20, 2019, which is hereby incorporated by reference in its entirety.

U.S. patent application Ser. No. 16/689,867 is a continuation-in-part of and claims priority to U.S. patent application Ser. No. 16/528,952, filed Aug. 1, 2019, which is hereby incorporated by reference in its entirety.

U.S. patent application Ser. No. 16/528,952 is a continuation of and claims priority to U.S. patent application Ser. No. 15/609,729, filed May 31, 2017, which is hereby incorporated by reference in its entirety.

BACKGROUND

Data packet capture devices have been used for many years to carry out network troubleshooting and testing. Such a device, which may be a general purpose computer, is configured to capture copies of some or all data packets traversing a network segment (e.g., Ethernet or Wifi) to which the device is connected. The captured data packets are either displayed in a user-readable fashion in real-time, or more commonly, stored in simple binary files of a standard file system.

As networking speeds have increased by orders of magnitude over the last several decades (e.g., from 10 megabit-per-second Ethernet to 100 gigabit-per-second Ethernet), the volume of data packets than can be captured has far outstripped the processing and storage capabilities of most computing devices and their associated peripherals. As a result, current capture devices, such as network switches and general purpose computers executing packet capture software, cannot maintain full packet capture abilities at high speed. One way in which these devices accommodate for their limited performance is through capturing just a sample of data packets—e.g., one in every 10 or 100 data packets. But doing so prevents a full and complete analysis of these data packets, thus providing a limited view into the actual traffic flowing on a network segments.

SUMMARY

A first example embodiment may include a network interface module configured to capture data packets into a binary format. The first example embodiment may also include a non-volatile memory configured to temporarily store the data packets received by way of the network interface module in the binary format. The first example embodiment may also include an interface to a database. The first example embodiment may also include a first array of processing elements configured to independently and asynchronously perform a first set of operations that involve: (i) reading a chunk of data packets from the non-volatile memory, (ii) identifying flows of data packets within the chunk, and (iii) generating flow representations for the flows, wherein the flow representations are in an intermediate format that aggregates header information and metadata associated with the data packets respectively corresponding to the flows. The first example embodiment may also include a second array of processing elements configured to perform a second set of operations, wherein the second set of operations involve: (i) receiving the flow representations from the first array of processing elements, (ii) identifying and aggregating common flows across the flow representations into an aggregated flow representation, (iii) based on a filter specification, removing one or more of the flows from the aggregated flow representation, and (iv) writing, by way of the interface, information from the aggregated flow representation to the database.

A second example embodiment may include performing, by a first array of processing elements and in an independent and asynchronous fashion, a first set of operations that involve: (i) reading a chunk of data packets from a non-volatile memory, wherein the data packets were received by way of a network interface module in a binary format, and wherein the non-volatile memory is configured to temporarily store the data packets, (ii) identifying flows of data packets within the chunk, and (iii) generating flow representations for the flows, wherein the flow representations are in an intermediate format that aggregates header information and metadata associated with the data packets respectively corresponding to the flows. The second example embodiment may also include performing, by a second array of processing elements, a second set of operations, wherein the second set of operations involve: (i) receiving the flow representations from the first array of processing elements, (ii) identifying and aggregating common flows across the flow representations into an aggregated flow representation, (iii) based on a filter specification, removing one or more of the flows from the aggregated flow representation, and (iv) writing, by way of an interface, information from the aggregated flow representation to a database.

A third example embodiment may include a network interface module configured to capture data packets into a binary format. The third example embodiment may also include a non-volatile memory configured to temporarily store the data packets received by way of the network interface module in the binary format. The third example embodiment may also include an interface to a database. The third example embodiment may also include a first array of processing elements configured to independently and asynchronously perform a first set of operations that involve: (i) reading a chunk of data packets from the non-volatile memory, (ii) filtering the data packets within the chunk so that a subset of the data packets remain, (iii) reading a content specification for a particular type of data packet, wherein the content specification indicates how to construct unique transaction keys for the particular type of data packet, and (iv) decoding the data packets in the subset from the binary format to an intermediate format based on the content specification, wherein the intermediate format includes a transaction key. The third example embodiment may also include a second array of processing elements configured to perform a second set of operations, wherein the second set of operations involve: (i) receiving the data packets as decoded by the first array of processing elements, (ii) storing, in a hash table indexed by the transaction key, the data packets as decoded in the intermediate format, (iii) reading the data packets as stored, (iv) analyzing the data packets as read to identify a pre-determined set of characteristics, and (v) writing, by way of the interface, the characteristics identified by the analysis to the database.

A fourth example embodiment may include performing, by a first array of processing elements in an independent and asynchronous fashion, a first set of operations that involve: (i) reading a chunk of data packets from a non-volatile memory, wherein the data packets were received by way of a network interface module in a binary format (ii) filtering the data packets within the chunk so that a subset of the data packets remain, (iii) reading a content specification for a particular type of data packet, wherein the content specification indicates how to construct unique transaction keys for the particular type of data packet, and (iv) decoding the data packets in the subset from the binary format to an intermediate format based on the content specification, wherein the intermediate format includes a transaction key. The fourth example embodiment may also include performing, by a second array of processing elements, a second set of operations, wherein the second set of operations involve: (i) receiving the data packets as decoded by the first array of processing elements, (ii) storing, in a hash table indexed by the transaction key, the data packets as decoded in the intermediate format, (iii) reading the data packets as stored, (iv) analyzing the data packets as read to identify a predetermined set of characteristics, and (v) writing, by way of an interface, the characteristics identified by the analysis to a database.

In a fifth example embodiment, an article of manufacture may include a non-transitory computer-readable medium, having stored thereon program instructions that, upon execution by a computing system, cause the computing system to perform operations in accordance with the first, second, third, and/or fourth example embodiment.

In a sixth example embodiment, a computing system may include at least one processor, as well as memory and program instructions. The program instructions may be stored in the memory, and upon execution by the processor(s), cause the computing system to perform operations in accordance with the first, second, third, and/or fourth example embodiment.

In a seventh example embodiment, a system may include various means for carrying out each of the operations of the first, second, third, and/or fourth example embodiment.

These as well as other embodiments, aspects, advantages, and alternatives will become apparent to those of ordinary skill in the art by reading the following detailed description, with reference where appropriate to the accompanying drawings. Further, this summary and other descriptions and figures provided herein are intended to illustrate embodiments by way of example only and, as such, that numerous variations are possible. For instance, structural elements and process steps can be rearranged, combined, distributed, eliminated, or otherwise changed, while remaining within the scope of the embodiments as claimed.

BRIEF DESCRIPTION OF THE DRAWINGS

FIG. 3A depicts an arrangement of data in a packet capture file, in accordance with example embodiments.

FIG. 3B depicts a packet capture file header, in accordance with example embodiments.

FIG. 3C depicts a per-packet header in a packet capture file, in accordance with example embodiments.

FIG. 8B depicts data structures in a memory module as well as connectivity between the memory module and long-term packet storage, in accordance with example embodiments.

FIG. 14B depicts JSON representations of flow statistics for captured data packets, in accordance with example embodiments.

FIG. 14C is a flow chart, in accordance with example embodiments.

FIG. 15E is a flow chart, in accordance with example embodiments.

DETAILED DESCRIPTION

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features unless stated as such. Thus, other embodiments can be utilized and other changes can be made without departing from the scope of the subject matter presented herein.

Accordingly, the example embodiments described herein are not meant to be limiting. It will be readily understood that the aspects of the present disclosure, as generally described herein, and illustrated in the figures, can be arranged, substituted, combined, separated, and designed in a wide variety of different configurations. For example, the separation of features into "client" and "server" components may occur in a number of ways.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

The following sections describe a high speed data packet capture system. After that system is describe, standalone and integrated variations of a high speed data packet generator are disclosed. Thus, data packet generator function and the data packet capture function may exist with or without one another across various embodiments.

I. EXAMPLE COMPUTING DEVICE AND PACKET CAPTURE THEREON

As noted above, packet capture on conventional computing devices is limited due to these devices not being optimized for processing a high sustained rate of incoming packets. This section reviews these devices for purposes of comparison, focusing on their bottlenecks. This section also introduces a popular file format for storing captured packets.

A. Example Computing Device

Figure 1:
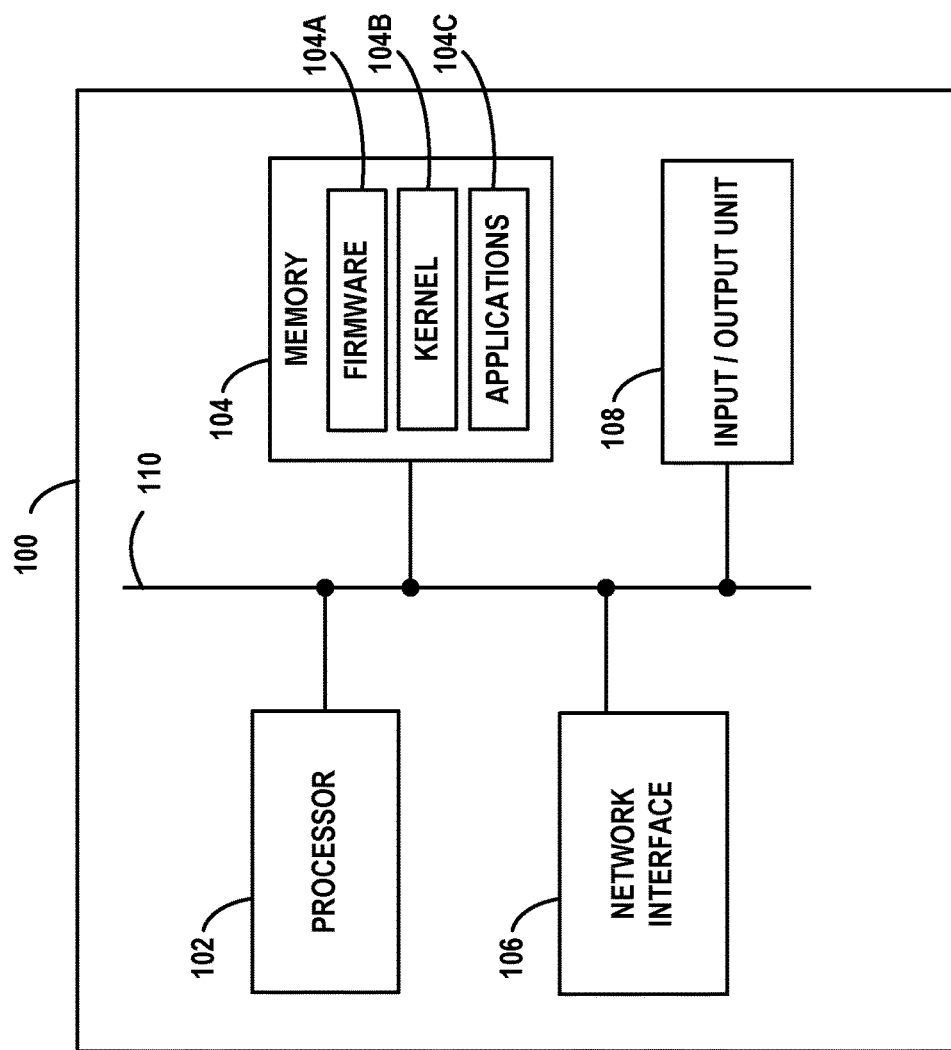
FIG. 1 illustrates a schematic drawing of a computing device, in accordance with example embodiments.

FIG. 1 is a simplified block diagram exemplifying a computing device 100, illustrating some of the components that could be included in such a computing device. Computing device 100 could be a client device (e.g., a device actively operated by a user), a server device (e.g., a device that provides computational services to client devices), or some other type of computational platform.

In this example, computing device 100 includes processor 102, memory 104, network interface 106, and an input/output unit 108, all of which may be coupled by system bus 110 or a similar mechanism. In some embodiments, computing device 100 may include other components and/or peripheral devices (e.g., detachable storage, printers, and so on).

Processor 102 may represent one or more of any type of computer processing unit, such as a central processing unit (CPU), a co-processor (e.g., a mathematics, graphics, or encryption co-processor), a digital signal processor (DSP), a network processor, and/or a form of integrated circuit or controller that performs processor operations. In some cases, processor 102 may be a single-core processor, and in other cases, processor 102 may be a multi-core processor with multiple independent processing units. Processor 102 may also include register memory for temporarily storing instructions being executed and related data, as well as cache memory for temporarily storing recently-used instructions and data.

Memory 104 may be any form of computer-usable memory, including but not limited to register memory and cache memory (which may be incorporated into processor 102), as well as random access memory (RAM), read-only memory (ROM), and non-volatile memory (e.g., flash memory, hard disk drives (HDDs), solid state drives (SSDs), compact discs (CDs), digital video discs (DVDs), and/or tape storage). Other types of memory may be used. In some embodiments, memory 104 may include remote memory, such as Internet Small Computer Systems Interface (iSCSI).

Memory 104 may store program instructions and/or data on which program instructions may operate. As shown in FIG. 1, memory may include firmware 104A, kernel 104B, and/or applications 104C. Firmware 104A may be program code used to boot or otherwise initiate some or all of computing device 100. Kernel 104B may be an operating system, including modules for memory management, scheduling and management of processes, input/output, and communication. Kernel 104B may also include device drivers that allow the operating system to communicate with the hardware modules (e.g., memory units, networking interfaces, ports, and busses), of computing device 100. Applications 104C may be one or more user-space software programs, such as web browsers or email clients, as well as any software libraries used by these programs. Each of firmware 104A, kernel 104B, and applications 104C may store associated data (not shown) in memory 104.

Network interface 106 may include one or more wireline interfaces, such as Ethernet (e.g., Fast Ethernet, Gigabit Ethernet, and so on). Network interface 106 may also support communication over non-Ethernet media, such as coaxial cables or power lines, or over wide-area media, such as Synchronous Optical Networking (SONET) or digital subscriber line (DSL) technologies. Network interface 106 may further include one or more wireless interfaces, such as IEEE 802.11 (Wifi), BLUETOOTH®, global positioning system (GPS), or a wide-area wireless interface. However, other forms of physical layer interfaces and other types of standard or proprietary communication protocols may be used over network interface(s) 106. As an example, some embodiments of computing device 100 may include Ethernet, BLUETOOTH®, and Wifi interfaces.

Input/output unit 108 may facilitate user and peripheral device interaction with computing device 100. Input/output unit 108 may include one or more types of input devices, such as a keyboard, a mouse, a touch screen, and so on. Similarly, input/output unit 108 may include one or more types of output devices, such as a screen, monitor, printer, and/or one or more light emitting diodes (LEDs). Additionally or alternatively, computing device 100 may communicate with other devices using a universal serial bus (USB) or high-definition multimedia interface (HDMI) port interface, for example.

Computing device 100 may be used for packet capture. In particular, modifications to kernel 104B and applications 104C may facilitate such capture. Computing device 100 may receive packets by way of network interface 106, optionally filter these packets in kernel 104B, and then provide the filtered packets to a packet capture application. The latter may be one of applications 104C. In some cases, the filtering may take place in the packet capture application itself. Regardless, the packet capture application may obtain a series of data packets for storage and/or display.

B. Example Protocol Stack

Figure 2:
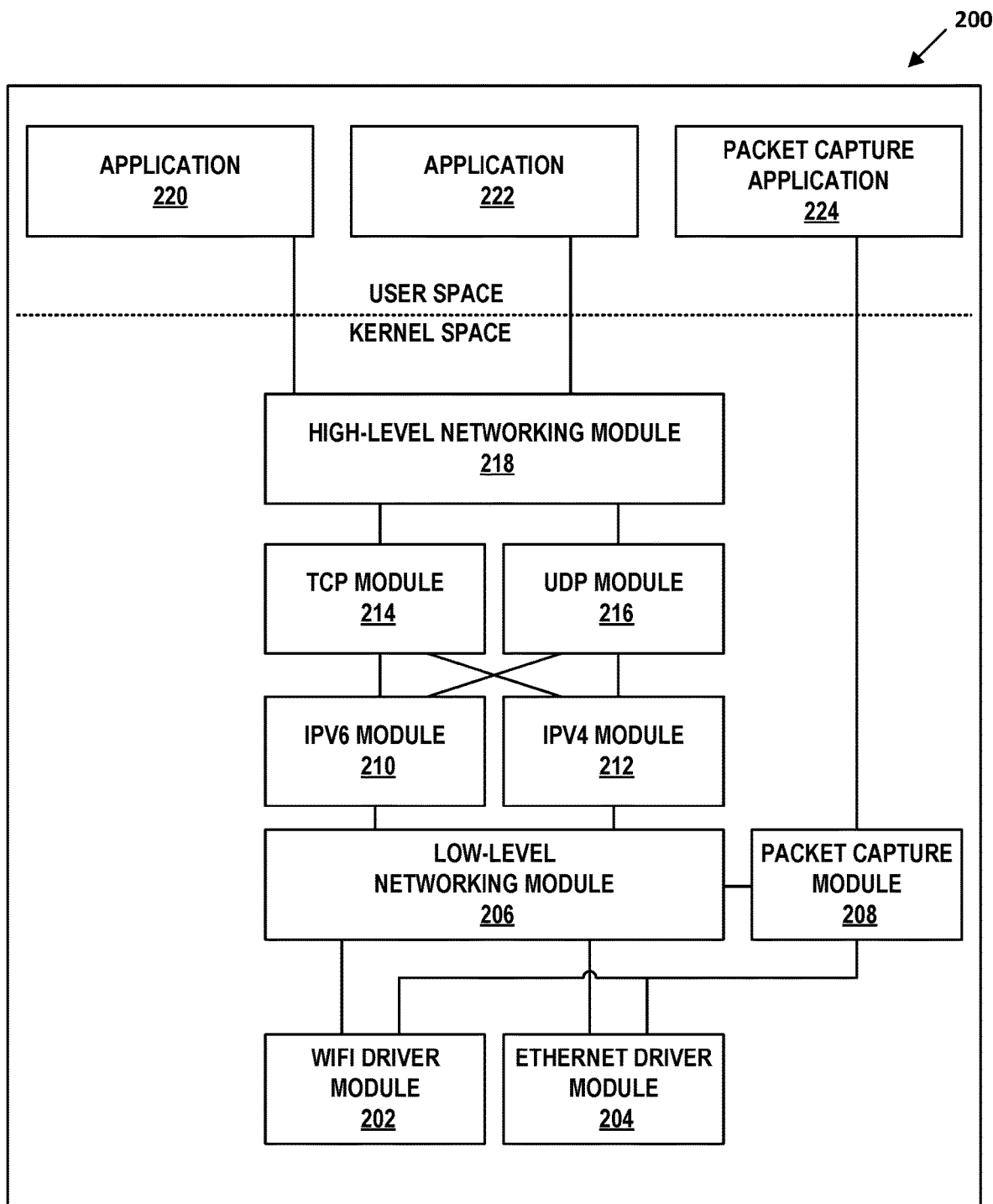
FIG. 2 illustrates packet processing in a kernel space and a user space that support packet capture, in accordance with example embodiments.

FIG. 2 depicts a protocol stack of a general purpose computer, such as computing device 100. Captured packets may traverse at least part of protocol stack 200.

Protocol stack 200 is divided into two general sections—kernel space and user space. Kernel-space modules carry out operating system functions while user-space modules are end-user applications or services that may be designed to execute on computing devices that support a specific type of kernel. Thus, user-space modules may rely on memory management, communication, and input/output services provided by the kernel. Kernel space in FIG. 2 may refer to part of kernel 104B in FIG. 1, while user space in FIG. 2 may refer to part of applications 104C in FIG. 1.

In full generality, protocol stack 200 may include more or fewer software modules. Particularly, the kernel space may contain additional kernel-space software modules to carry out operating system operations, and the user space may include additional user-space software modules to carry out application operations.

Wifi driver module 202 may be a kernel-space software module that operates and/or controls one or more physical Wifi hardware components. In some embodiments, Wifi driver module 202 provides a software interface to Wifi hardware, enabling kernel 104B of computing device 100 to access Wifi hardware functions without needing to know precise control mechanisms of the Wifi hardware being used. When data packets are transmitted or received by way of Wifi hardware, these packets may pass through Wifi driver module 202.

Similarly, Ethernet driver module 204 is a kernel-space software module that operates and/or controls one or more physical Ethernet hardware components. In some embodiments, Ethernet driver module 204 provides a software interface to Ethernet hardware, enabling kernel 104B of computing device 100 to access Ethernet hardware functions without needing to know precise control mechanisms of the Ethernet hardware being used. When data packets are transmitted or received by way of Ethernet hardware, these packets may pass through Ethernet driver module 204.

Protocol stack 200 may also include other driver modules not shown in FIG. 2. For instance, BLUETOOTH®, cellular, and/or GPS driver modules may be incorporated into protocol stack 200. Further, either or both of Wifi driver module 202 and Ethernet driver module 204 may be omitted.

Low-level networking module 206 routes inbound and outbound data packets between driver software modules and network layer software modules (e.g., IPv6 module 210 and IPv4 module 212). Thus, low-level networking module 206 may serve as a software bus or switching mechanism, and may possibly provide application programming interfaces between driver software modules and network layer software modules. For instance, low-level networking module 206 may include one or more queues in which inbound data packets are placed so that they can be routed to one of IPv6 module 210 and IPv4 module 212, and one or more queues in which outbound data packets can be placed so that they can be routed to one of Wifi driver module 202 and Ethernet driver module 204. In some embodiments, low-level networking module 206 might not be present as a separate kernel-space software module, and its functionality may instead be incorporated into driver modules and/or network layer (e.g., IPv6 and/or IPv4) software modules.

IPv6 module 210 operates the Internet Protocol version 6 (IPv6). IPv6 is a version of the Internet Protocol that features an expanded address space, device auto-configuration, a simplified header, integrated security and mobility support, and improved multicast capabilities. IPv6 module 210 encapsulates outbound data packets received from higher-layer modules (including those of TCP module 214 and UDP module 216) in an IPv6 header. Conversely, IPv6 module 210 also decapsulates inbound IPv6 data packets received from low-level networking module 206. Although it is not shown in FIG. 2, IPv6 module 210 may be associated with an ICMPv6 module that provides support for error and informational messages related to IPv6, as well as multicasting and address resolution.

IPv4 module 212 operates the Internet Protocol version 4 (IPv4). IPv4 is a version of the Internet Protocol that features a smaller address space than IPv6. Similar to IPv6 module 210, IPv4 module 212 encapsulates outbound data packets received from high-layer modules (including those of TCP module 214, and UDP module 216) in an IPv4 header. Conversely, IPv4 module 212 also decapsulates inbound data packets received from low-level networking module 206. Although it is not shown in FIG. 2, IPv4 module 212 may be associated with an ICMPv4 module that provides support for simple error reporting, diagnostics, and limited configuration for devices, as well as messages that report when a destination is unreachable, a packet has been redirected from one router to another, or a packet was discarded due to experiencing too many forwarding hops.

As used herein, the terms "Internet Protocol" and "IP" may refer to either or both of IPv6 and IPv4.

TCP module 214 operates the Transport Control Protocol (TCP). TCP is a reliable, end-to-end protocol that operates on the transport layer of a networking protocol stack. TCP is connection-oriented, in the sense that TCP connections are explicitly established and torn down. TCP includes mechanisms in which it can detect likely packet loss between a sender and recipient, and resend potentially lost packets. TCP is also a modified sliding window protocol, in that only a limited amount of data may be transmitted by the sender before the sender receives an acknowledgement for at least some of this data from the recipient, and the sender may operate a congestion control mechanism to avoid flooding an intermediate network with an excessive amount of data.

UDP module 216 operates the User Datagram Protocol (UDP). UDP is a connectionless, unreliable transport-layer protocol. Unlike TCP, UDP maintains little state regarding a UDP session, and does not guarantee delivery of application data contained in UDP packets.

High-level networking module 218 routes inbound and outbound data packets between (i) user-space software modules and (ii) network-layer or transport-layer software modules (e.g., TCP module 214 and UDP module 216). Thus, high-level networking module 218 may serve as a software bus or switching mechanism, and may possibly provide application programming interfaces between user-space software modules and transport layer software modules. For instance, high-level networking module 218 may include one or more queues in which inbound data packets are placed so that they can be routed to a user-space software module, and one or more queues in which outbound data packets can be placed so that they can be routed to one of TCP module 214 and UDP module 216. In some embodiments, high-level networking module 218 may be implemented as a TCP/IP socket interface, which provides well-defined function calls that user-space software modules can use to transmit and receive data.

As noted above, user-space programs, such as application 220 and application 222 may operate in the user space of computing device 100. These applications may be, for example, email applications, social networking applications, messaging applications, gaming applications, or some other type of application. Through interfaces into the kernel space (e.g., high-level networking module 218 and/or other interfaces), these applications may be able to carry out input and output operations.

The modules of FIG. 2 described so far represent software used for incoming (received) and outgoing (transmitted) packet-based communication. Examples of incoming and outgoing packet processing follows.

When the Ethernet hardware receives a packet addressed for computing device 100, it may queue the packet in a hardware buffer and send an interrupt to Ethernet driver module 204. In response to the interrupt, Ethernet driver module 204 may read the packet out of the hardware buffer, validate the packet (e.g., perform a checksum operation), determine the higher-layer protocol to which the packet should be delivered (e.g., IPv6 module 210 or IPv4 module 212), strip off the Ethernet header and trailer bytes, and pass the packet to low-level networking module 206 with an indication of the higher-layer protocol.

Low-level networking module 206 may place the packet in a queue for the determined higher-layer protocol. Assuming for the moment that this protocol is IPv4, low-level networking module 206 may place the packet in a queue, from which it is read by IPv4 module 212.

IPv4 module 212 may read the packet from the queue, validate the packet (e.g., perform a checksum operation and verify that the packet has not been forwarded more than a pre-determined number of times), combine it with other packets if the packet is a fragment, determine the higher-layer protocol to which the packet should be delivered (e.g., TCP module 214 or UDP module 216), strip off the IPv4 header bytes, and pass the packet to the determined higher-layer protocol. Assuming for the moment that this protocol is TCP, IPv4 module 212 may provide the packet to TCP module 214. In some cases, this may involve placing the packet in the queue, or IPv4 module 212 may provide TCP module 214 with a memory address at which the packet can be accessed.

TCP module 214 may read the packet from the queue, validate the packet, perform any necessary TCP congestion control and/or sliding window operations, determine the application "socket" to which the packet should be delivered, strip off the TCP header bytes, and pass the payload of the packet to the high-level networking module 218 along with an indication of the determined application. At this point, the "packet" does not contain any headers, and in most cases is just a block of application data.

High-level networking module 218 may include queues associated with the socket communication application programming interface. Each "socket" may represent a communication session and may be associated with one or more applications. Incoming data queued for a socket may eventually be read by the appropriate application. Assuming for the moment that the application data from the packet is for application 220, high-level networking module 218 may hold the application data in a queue for a socket of application 220.

Application 220 may read the application data from the socket and then process this data. At this point, the incoming packet processing has ended.

Outgoing packet processing may begin when an application, such as application 220, writes application data to a socket. The socket may be, for instance, a TCP or UDP socket. Assuming that the application data is for a TCP socket, application 220 may provide the application data to high-level networking module 218, which in turn may queue the application data for TCP module 214.

TCP module 214 may read the application data from the queue, determine the content of a TCP header for the application data, and encapsulate the application data within the TCP header to form a packet. Values of fields in the TCP header may be determined by the status of the associated TCP session as well as content of the application data. TCP module 214 may then provide the packet to either IPv6 module 210 or IPv4 module 212. This determination may be made based on the type of socket from which the application data was read. Assuming for the moment that the socket type indicates IPv4, TCP module 214 may provide the packet to IPv4 module 212. In some cases, this may involve placing the packet in a queue, or TCP module 214 may provide IPv4 module 212 with a memory address at which the packet can be accessed.

IPv4 module 212 may determine the content of an IPv4 header for the packet, and encapsulate the packet within the IPv4 header. Values of fields in the IPv4 header may be determined by the socket from which the application data was read as well as content of the application data. IPv4 module 212 may then look up the destination of the packet (e.g., its destination IP address) in a forwarding table to determine the outbound hardware interface. Assuming for the moment that this interface is Ethernet hardware, IPv4 module 212 may provide the packet to low-level networking module 206 with an indication that the packet should be queued for Ethernet driver module 204.

Low-level networking module 206 may receive the packet and place it in a queue for Ethernet driver module 204. Alternatively, IPv4 module 212 may provide the packet directly to Ethernet driver module 204.

Regardless, Ethernet driver module may encapsulate the packet in an Ethernet header and trailer, and then provide the packet to the Ethernet hardware. The Ethernet hardware may transmit the packet.

In some environments, the term "frame" is used to refer to framed data (i.e., application data with at least some header or trailer bytes appended to it) at the data-link layer, the term "packet" is used to refer to framed data at the network (IP) layer, and the term "segment" is used to refer to framed data at the transport (TCP or UDP) layer. For sake of simplicity, the nomenclature "packet" is used to represent framed application data regardless of layer.

C. Packet Capture

Given protocol stack 200 and the operations performed by each of its modules, it is desirable for a packet capture architecture to be able to intercept and capture copies of both incoming (received) and outgoing (transmitted) packets. Packet capture module 208 exists in kernel space to facilitate this functionality.

One or more of Wifi driver module 202, Ethernet driver module 204, and low-level networking module 206 may have an interface to packet capture module 208. This interface allows these modules to provide, to packet capture module 208, copies of data packets transmitted and received by computing device 100. For instance, Wifi driver module 202 and Ethernet driver module 204 may provide copies of all packets they receive (including Wifi and Ethernet headers) to packet capture module 208, even if those packets are not ultimately addressed to computing device 100. Furthermore, Wifi driver module 202 and Ethernet driver module 204 may provide copies of all packets they transmit. This allows packets generated by computing device 100 to be captured as well.

Regarding the capture of received packets, network interface hardware components, such Wifi and/or Ethernet hardware, normally will discard any incoming packets without a destination Wifi or Ethernet address that matches an address used by computing device 100. Thus, Wifi driver module 202 and Ethernet driver module 204 might only receive incoming packets with a Wifi or Ethernet destination address that matches an address used by computing device 100, as well as any incoming packets with a multicast or broadcast Wifi or Ethernet destination address. However, the Wifi and/or Ethernet hardware may be placed in "promiscuous mode" so that these components do not discard any incoming packets. Instead, incoming packets that normally would be discarded by the hardware are provided to Wifi driver module 202 and Ethernet driver module 204. These modules provide copies of the packets to packet capture module 208.

In some embodiments, Wifi driver module 202 and Ethernet driver module 204 may provide incoming packets to low-level networking module 206, and low-level networking module 206 may provide copies of these packets to packet capture module 208. In the outgoing direction, low-level networking module 206 may also provide copies of data packets to packet capture module 208. In order to provide Wifi and Ethernet header and trailer information in these outgoing packets, low-level networking module 206 may perform Wifi and Ethernet encapsulation of the packets prior to providing them to packet capture module 208. Low-level networking module 206 may also provide copies of these encapsulated packets to Wifi driver module 202 and/or Ethernet driver module 204 which in turn may refrain from adding any further encapsulation, and may instead provide the packets as received to their respective hardware interfaces.

Packet capture module 208 may operate in accordance with packet capture application 224 to capture packets. Particularly, packet capture application 224 may provide a user interface through which one or more packet filter expressions may be entered. The user interface may include a graphical user interface, a command line, or a file.

The packet filter expressions may specify the packets that are to be delivered to packet capture application 224. For example, the packet filter expression "host 10.0.0.2 and tcp" may capture all TCP packets to and from the computing device with the IP address 10.0.0.2. As additional examples, the packet filter expression "port 67 or port 68" may capture all Dynamic Host Configuration Protocol (DHCP) traffic, while the packet filter expression "not broadcast and not multicast" may capture only unicast traffic.

Packet filter expressions may include, as shown above, logical conjunctions such as "and", "or", and "not." With these conjunctions, complex packet filters can be defined. Nonetheless, the packet filter expressions shown above are for purpose of example, and different packet filtering syntaxes may be used. For instance, some filters may include a bitstring and an offset, and may match any packet that includes the bitstring at the offset number of bytes into the packet.

After obtaining a packet filter expression, packet capture application 224 may provide a representation of this expression to packet capture module 208. Packet capture application 224 and packet capture module 208 may communicate, for example, using raw sockets. Raw sockets are a special type of socket that allows communication of data packets and commands between an application and a kernel module without protocol (e.g., IPv4, IPv6, TCP, or UDP) processing. Other types of sockets and APIs, however, may be used for packet capture instead of raw sockets.

In some embodiments, packet capture module 208 may compile the representation of the packet filter expression into bytecode or another format. Packet capture module 208 may then execute this bytecode for each packet it receives to determine whether the packet matches the specified filter. If the packet does not match the filter, the packet may be discarded. If the packet does match the filter, packet capture module 208 may provide the packet the packet capture application 224. Thus, packet capture application 224 may provide the packet filter expression to packet capture module 208 at the beginning of a packet capture session, and may receive a stream of data packets matching this filter.

D. Packet Capture Formats

Packet capture application may store the received packets in one of several possible formats. One such format is the PCAP (packet capture) format, illustrated in FIG. 3A. File 300 represents a series of N+1 captured packets in the PCAP format, stored in order of the time they were captured. PCAP header 302 is a data structure defined in FIG. 3B. Each of the N+1 captured packets may be preceded by a per-packet header, as well as all protocol header and payload bytes. An example per-packet header 303 is shown in FIG. 3C.

File 300 may be a binary file that can be stored within short-term storage (e.g., main memory) or long-term storage (e.g., a disk drive) of computing device 100. In some cases, representations of the captured packets displayed in real-time on computing device 100 as packet capture occurs. Thus, later-captured packets may be added to file 300 while earlier-captured packets are read from file 300 for display. In other embodiments, file 300 may be written to long-term storage for later processing.

As noted above, FIG. 3B illustrates the contents of PCAP header 302. There may be one instance of PCAP header 302 disposed at the beginning file 300.

Magic number 304 may be a pre-defined marker of the beginning of a file with PCAP header 302, and serves to indicate the byte-ordering of the computing device that performed the capture. For instance, magic number 304 may be defined to always have the hexadecimal value of 0xa1b2c3d4 in the native byte ordering of the capturing device. If the device that reads file 300 finds magic number 304 to have this value, then the byte-ordering of this device and the capturing device is the same. If the device that reads file 300 finds magic number 304 to have a value of 0xd4c3b2a1, then this device may have to swap the byte-ordering of the fields that follow magic number 304.

Major version 306 and minor version 308 may define the version of the PCAP format used in file 300. In most instances, major version 306 is 2 and minor version 308 is 4, which indicates that the version number is 2.4.

Time zone offset 310 may specify the difference, in seconds, between the local time zone of the capturing device and Coordinated Universal Time (UTC). In some cases, the capturing device will set this field to 0 regardless of its local time zone.

Timestamp accuracy 312 may specify the accuracy of any time stamps in file 300. In practice, this field is often set to 0.

Capture length 314 may specify the maximum packet size, in bytes, that can be captured. In some embodiments, this value is set to 65536, but can be set to be smaller if the user is not interested in large-payload packets, for instance. If a packet larger than what is specified in this field is captured, it may be truncated to conform to the maximum packet size.

Datalink protocol 316 may specify the type of datalink interface on which the capture took place. For instance, this field may have a value of 1 for Ethernet, 105 for Wifi, and so on.

FIG. 3C illustrates the contents of per-packet header 303. As shown in FIG. 3A, there may be one instance of per-packet header 303 for each packet represented in file 300. Each instance of per-packet header 303 may precede its associated packet.

Timestamp seconds 320 and timestamp microseconds 322 may represent the time at which the associated packet was captured. As noted above, this may be the local time of the capturing device or UTC time.

Captured packet length 324 may specify the number of bytes of data packets actually captured and saved in file 300. Original packet length 326 may specify the number of bytes in the packet as the packet appeared on the network on which it was captured.

In general, captured packet length 324 is expected to be less than or equal to original packet length 326. For example, if capture length 314 is 1000 bytes and a packet is 500 bytes, then captured packet length 324 and original packet length 326 may both be 500. However, if the packet is 1500 bytes, then captured packet length 324 may be 1000 while original packet length 326 may be 1500.

While the traditional system described in the context of FIGS. 1 and 2 may perform well in limited scenarios, it might not support high speed packet capture in a robust fashion. For instance, modern Ethernet interface hardware support data rates of 10 gigabits per second, 40 gigabits per second, and 100 gigabits per second. Since traditional systems perform packet capture and filtering in software, the maximum speed of these systems is typically limited by the speed of processor 102. If the hardware interfaces are receiving packets at line speed, processor 102 may be unable to process incoming packets quickly enough. Furthermore, processor 102 may be performing other tasks in parallel, such as various operating system tasks and tasks related to other application.

To that point, the number of processor cycles per packet may be insufficient even for fast processors. For example a 3.0 gigahertz multiprocessor with 16 cores only has about 322 cycles per packet when processing 64 byte packets at 100 gigabits per second. In more detail, the processor operates at an aggregate speed of 48,000,000,000 cycles/per second. The interface's 100 gigabits per second provides a maximum of 12,500,000,000 bytes per second. Assuming the worst case scenario of the smallest possible Ethernet packets (64 bytes each with a 12 byte inter-packet gap and an 8-byte preamble), there are about 148,809,523 packets per second arriving. Thus, the processor can use at most 322.56 cycles per packet. This is insufficient for sustained processing.

As a result, some packets may be dropped before they can be filtered or before they can be written to a file. Particularly, packets may be dropped if (i) the network interface hardware buffer fills up at a rate that is faster than its associated driver module can remove packets from it, (ii) any queue associated with packet capture module 208 fills up at a rate that is faster than packet capture module 208 can perform packet filtering operations, or (iii) any queue associated with packet capture application 224 fills up at a rate that is faster than packet capture application 224 can write the associate packets to a file system or display representations of these packets. Notably, writing to a file system on an HDD may involve significant overhead that slows the system's sustainable packet capture rate. Writing to an SSD is faster, but also can create a bottleneck if SSD speed is not taken into account.

This creates problems for applications that rely on accurate and complete packet capture. For instance, if packet capture application 224 is a network protocol analysis tool, missing packets may make debugging a network protocol to be difficult if not impossible. Further, if packet capture application 224 is an intrusion detection system, missing packets may effectively render this system unable to detect network attacks in a robust and timely fashion.

The next section describes the capture-direction procedures for an example high speed packet capture system. This description follows the path of captured packets from the time they are received on a network interface until they are stored in non-volatile memory (e.g., an SSD without a traditional file system). The subsequent section describes how stored packets are read from non-volatile memory for further processing and/or display.

II. EXAMPLE IMPROVED HIGH SPEED PACKET CAPTURE SYSTEM—CAPTURE DIRECTION

Figure 4:
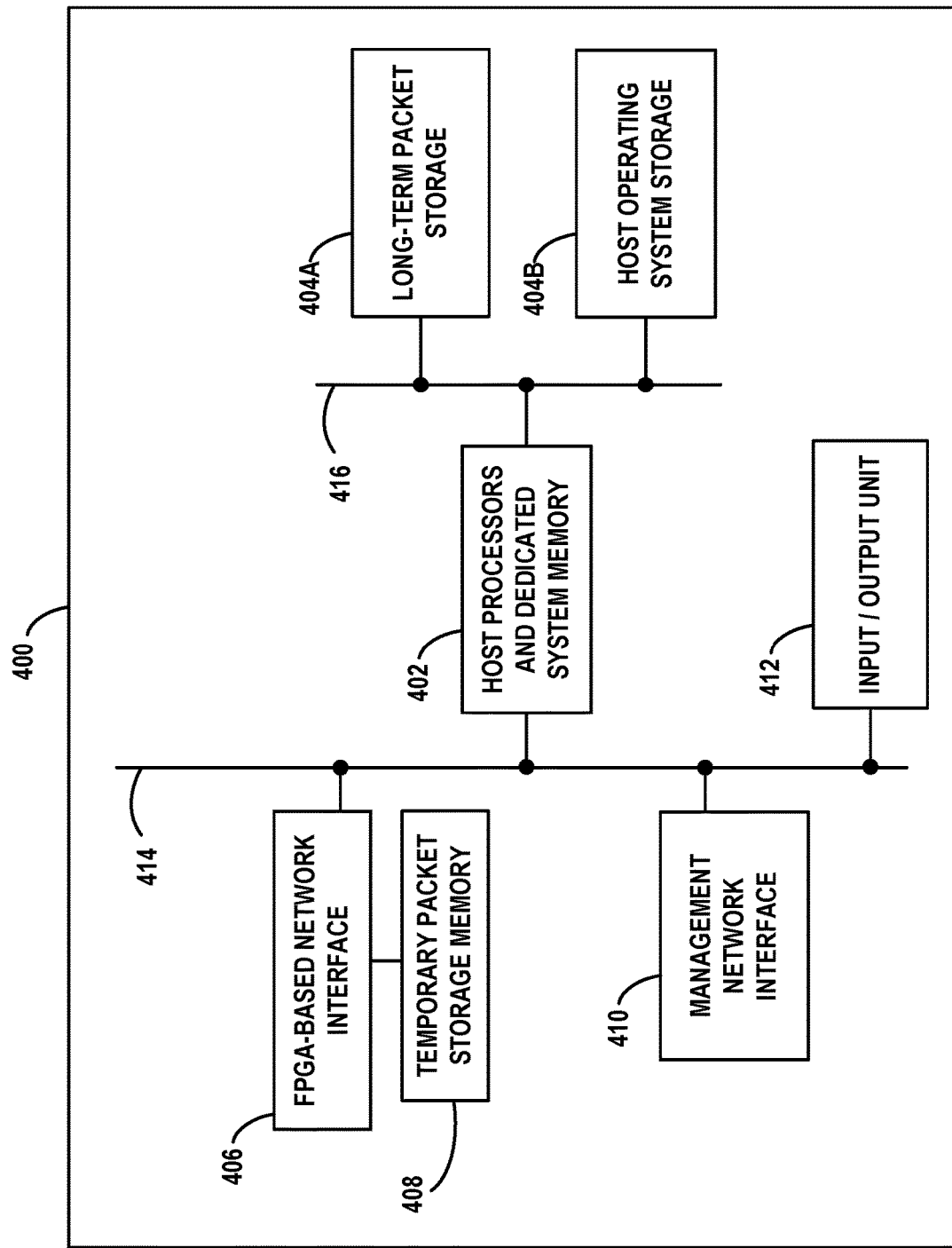
FIG. 4 depicts a schematic drawing of a computing device arranged for high speed packet capture, in accordance with example embodiments.

FIG. 4 depicts an example computing device 400 customized for high speed packet capture. In some embodiments, computing device 400 may include different components and/or its components may be arranged in a different fashion.

Figure 7:
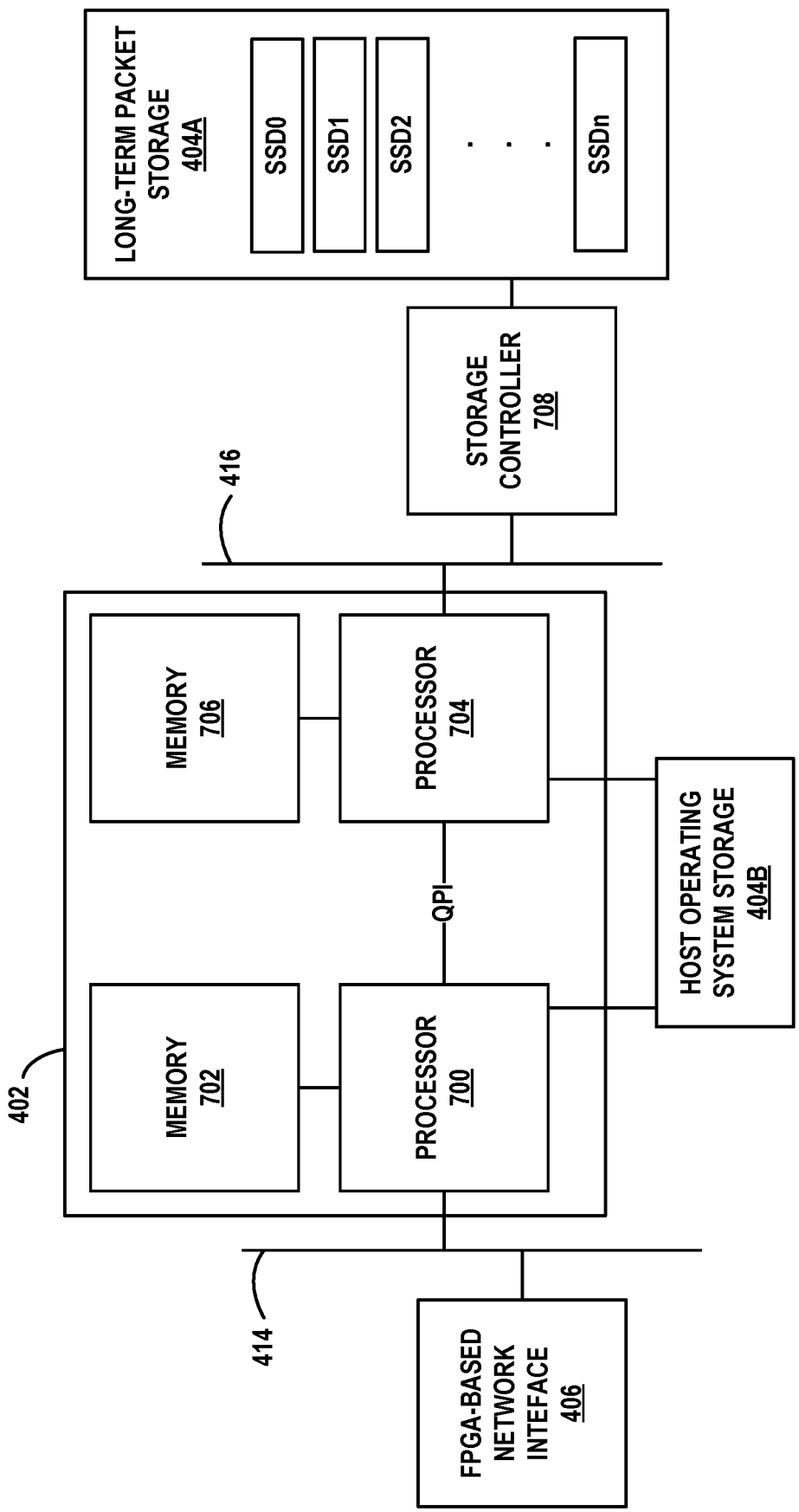
FIG. 7 depicts a host processor and memory arrangement, in accordance with example embodiments.

Host processors and dedicated system memory 402 may include one or more processors, each of which may be coupled to or associated with a dedicated unit of memory (e.g., several gigabytes of RAM). For instance, each processor and its associated unit of memory may be a non-uniform memory access (NUMA) node capable of accessing its own memory and memory in other NUMA nodes, as well as that of long-term packet storage 404A and host operating system storage 404B. A particular arrangement of NUMA nodes is depicted in the embodiment of FIG. 7.

Notably, host processors and dedicated system memory 402 may have connections to system bus 414 and system bus 416. System busses 414 and 416 may each be a peripheral component interconnect express (PCIe) bus, for example. In FIG. 4, system bus 414 communicatively couples host processors and dedicated system memory 402 to FPGA-based network interface 406, management network interface 410, and input/output unit 412. Similarly, system bus 416 communicatively couples host processors and dedicated system memory 402 to long-term packet storage 404A and host operating system storage 404B. Nonetheless, other arrangement are possible, including one in which all of these components are connected by way of one system bus.

Long-term packet storage 404A may include non-volatile storage, such as one or more SSDs. Notably, long-term packet storage 404A may store captured packets in chunks thereof.

Host operating system storage 404B may also include non-volatile storage, such as one or more solid state drives. Unlike long-term packet storage 404A, host operating system storage 404B may store the operating system and file system used by the processors of host processors and dedicated system memory 402.

FPGA-based network interface 406 may be a custom hardware module that can house one or more 100 megabit per second, 1 gigabit per second, 10 gigabit per second, 25 gigabit per second, 40 gigabit per second, or 100 gigabit per second transceivers. FPGA-based network interface 406 may receive packets by way of these interfaces, and then capture and process these packets for storage. As suggested by its name, FPGA-based network interface 406 may be based on a field-programmable gate array or other digital hardware logic (i.e., an actual FPGA might not be used in all embodiments). Although Ethernet is used as the interface type for packet capture in the examples provided herein, other interface types may be possible.

Temporary packet storage memory 408 may include one or more units of RAM configured to hold packets captured by FPGA-based network interface 406 until these packets can eventually be written to a memory in host processors and dedicated system memory 402. FPGA-based network interface 406 may connect to temporary packet storage memory 408 by way of one or more memory controllers.

Network management interface 410 may be one or more network interfaces used for connectivity and data transfer. For instance, while FPGA-based network interface 406 may house one or more high speed Ethernet interfaces from which packets are captured, network management interface 410 may house one or more network interfaces that can be used for remote access, remote configuration, and transfer of files containing captured packets. For instance, a user may be able to log on to computing device 400 by way of network management interface 410, and remotely start or stop a packet capture session.

Input/output unit 412 may be similar to input/output unit 108, in that it may facilitate user and peripheral device interaction with computing device 400. Thus, input/output unit 412 may include one or more types of input devices and one or more types of output devices.

In some embodiments, computing device 400 may include other components, peripheral devices, and/or connectivity. Accordingly, the illustration of FIG. 4 is intended to be for purpose of example and not limiting.

A. Example FPGA-Based Network Interface

Figure 5:
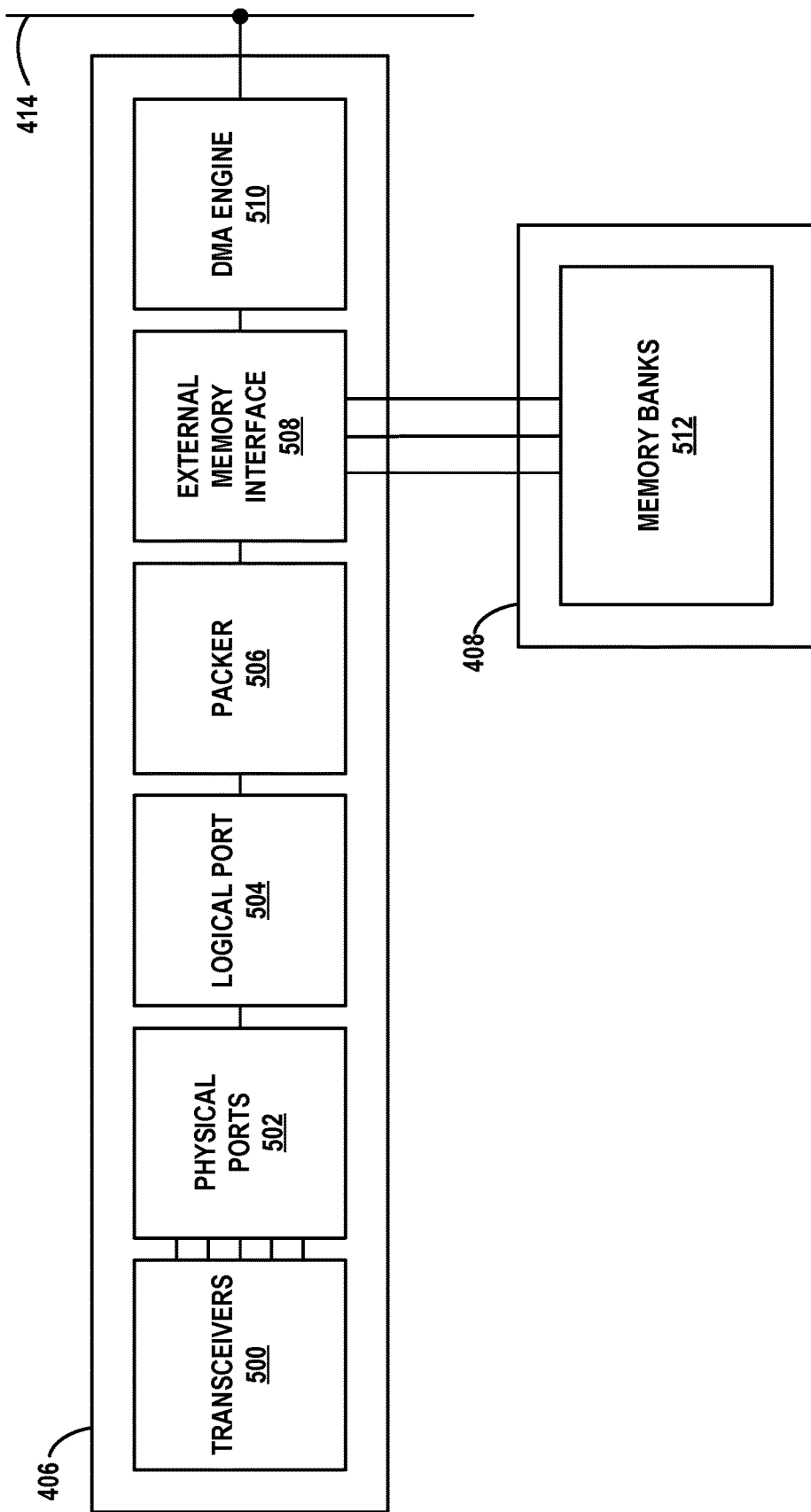
FIG. 5 depicts a network interface unit arranged for high speed packet capture, in accordance with example embodiments.

FIG. 5 depicts a more detailed view of FPGA-based network interface 406 and temporary packet storage memory 408. Particularly, FPGA-based network interface 406 includes transceivers module 500, physical ports module 502, logical port module 504, packer module 506, external memory interface module 508, and direct memory access (DMA) engine module 510. Temporary packet storage memory 408 may include memory banks 512, and may be coupled to external memory interface module 508 by one or more memory controllers. DMA engine module 510 may be coupled to system bus 414, and may control the writing of data packets (e.g., in the form of chunks of one or more packets) to this bus. In FIG. 5, captured data packets generally flow from left to right, with possible temporary storage in temporary packet storage memory 408.

Figure 6A:
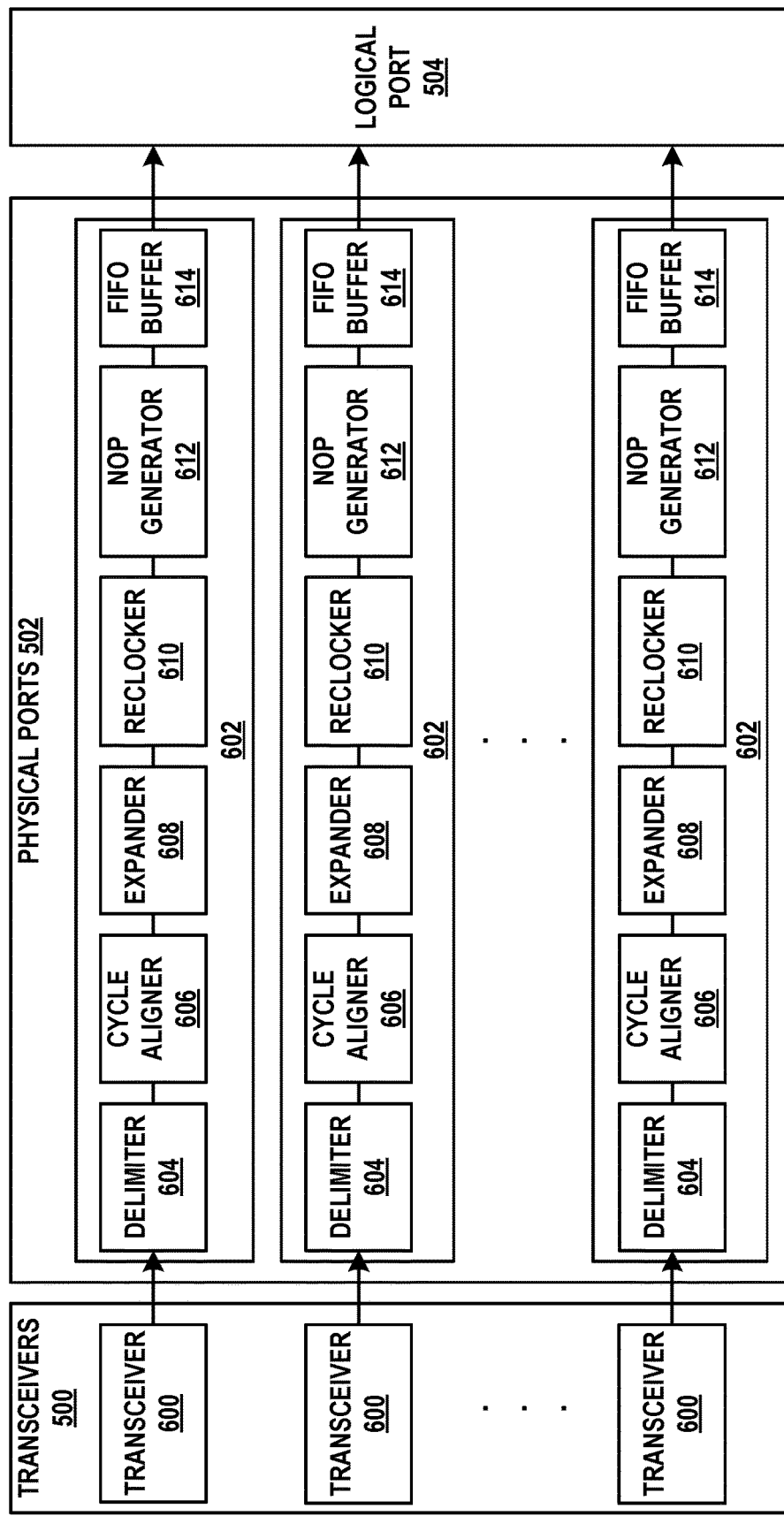
FIG. 6A depicts components of physical ports on the network interface unit, in accordance with example embodiments.

FIG. 6A depicts connectivity between transceivers module 500, physical ports module 502, and logical port module 504, as well as components of physical ports module 502.

Each transceiver 600 of transceivers module 500 may contain both a transmitter and a receiver that are combined and share common circuitry or a single housing. As noted previously, transceivers 600 may be 10 gigabit per second, 40 gigabit per second, or 100 gigabit per second Ethernet transceivers, for example. Each of transceiver 600 may also be coupled to a port 602 of physical ports 502. This coupling may include a unit that performs Ethernet medium access control (MAC), forward error correction (FEC), and physical coding sublayer (PCS) functions (not shown).

Each port 602 may include delimiter 604, cycle aligner 606, expander 608, reclocker 610, NOP generator 612, and first-in-first-out (FIFO) buffer 614 components. In some embodiments, ports 602 may include more or fewer components, and each port may be uniquely numbered (e.g., from 0 to n). Regardless, the flow of data packets (and processing thereof) is generally from left to right.

Delimiter 604 may identify the beginning and end bits of an incoming Ethernet packet by detecting Ethernet preamble and epilogue delimiter bits. This sequence may be represented in hexadecimal as 0xFB 0x55 0x55 0x55 0x55 0x55 0x55 0xD5 (least-significant bit first ordering is used). The bit received immediately after this sequence may be the first of the Ethernet packet. Delimiter 604 may also record a nanosecond timestamp of when the first byte of each packet was received from a high accuracy clock source. This timestamp may be adjusted for propagation delay by a fixed offset.

Cycle aligner 606 may align arrange incoming packets so that there is a maximum of one packet per bus cycle (i.e., larger packets may require multiple cycles). As an example, 100 gigabit Ethernet may use four 128-bit busses from the MAC interface. These busses may be referred to as lanes 0, 1, 2, and 3. In some cases, there may be two packets (more precisely, parts of two packets) output from the MAC interface in a single bus cycle. For instance, lanes 0-2 may contain bits from packet n, while lane 3 contains bits from packet n+1. Cycle aligner 606 arranges these bits across two cycles. In a first cycle, lanes 0-2 contain bits from packet n, while lane 3 is null. In a second cycle, lanes 0-2 are null, while lane 3 contains bits from packet n+1.

Expander 608 aggregates and packs the bits aligned by cycle aligner 606 into a wider bus (e.g., a 2048-bit bus). Expander 608 does this so that the first bit of each packet begins in the same lane. Having a fixed location for the beginning of each packet makes downstream processing less complicated. In some embodiments, expander 608 may place each packet across sixteen 128-bit lanes, such that the first bit of the packet is disposed at the first bit-location of lane 0.

Reclocker 610 may adjust the timing of data packet processing from that of transceiver 600 to that of port 602. In the case of 100 gigabit Ethernet, the reclocking is from 322 megahertz (Ethernet speed) to 250 megahertz (port speed). In the case of 10 gigabit Ethernet, the reclocking is from 156 megahertz (Ethernet speed) to 250 megahertz (port speed).

NOP generator 612 may generate bursts of single cycle full width packets, with a payload of 0x00 bytes (e.g., 240-byte synthetic null packets with a 16 byte header for a transfer size of 256 bytes) that can be used to flush the capture pipeline of FPGA-based network interface 406 all the way to long-term packet storage 404A. NOP generator 612 may be triggered to do so either by inactivity (e.g., no packets being received for a pre-determined amount of time) or by way of an explicit request through software (such an interface not shown in FIG. 6A).

FIFO buffer 614 may hold a number of received packets in a queue until these packets can be read from port 602 by logical port module 504.

Figure 6B:
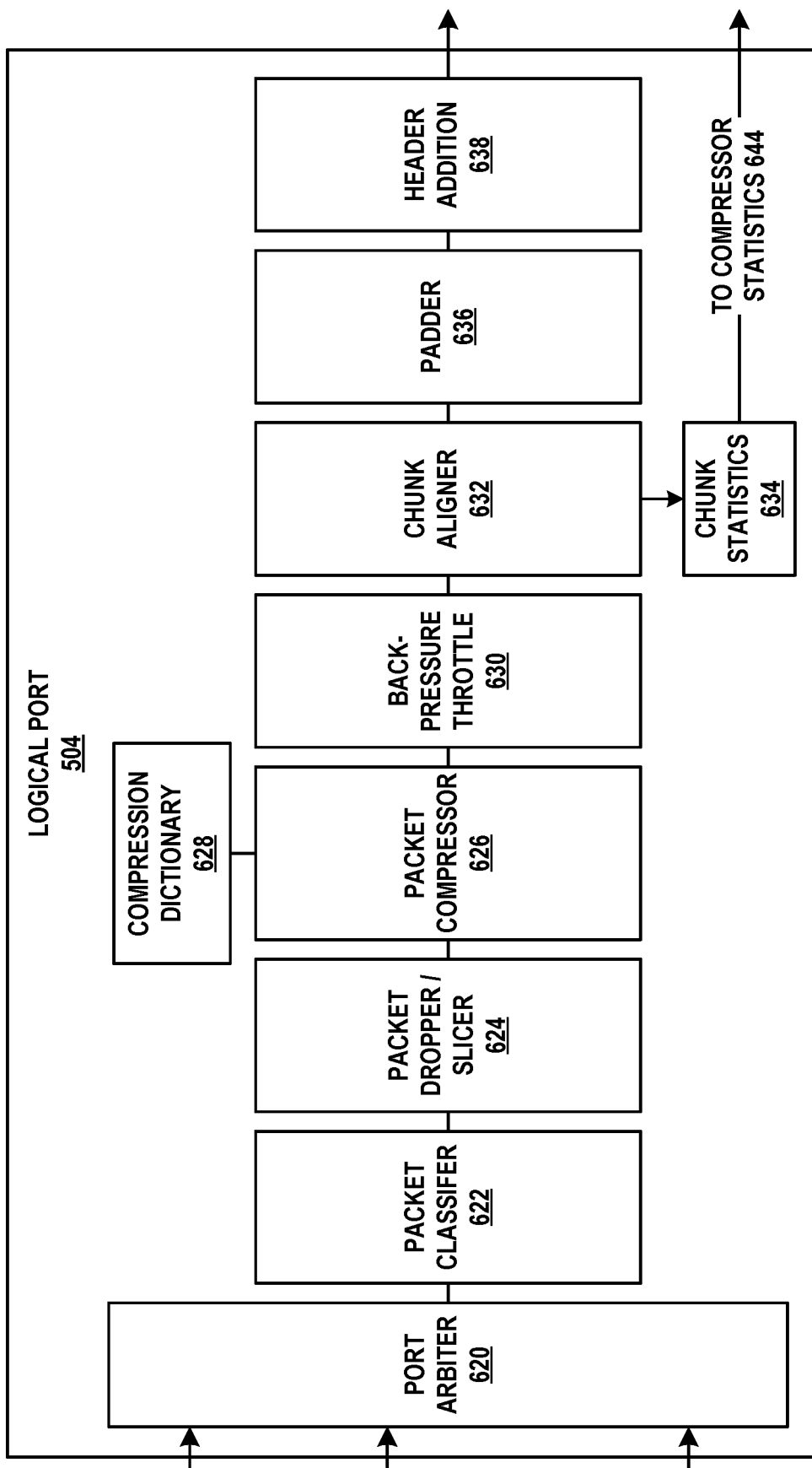
FIG. 6B depicts a logical port on the network interface unit, in accordance with example embodiments.

FIG. 6B illustrates the components of logical port module 504. These components are presented for purpose of example. More or fewer components may be present in such a logical port module. Similar to the previous drawings, the flow of data packets (and processing thereof) is generally from left to right.

Port arbiter 620 is connected to FIFO buffer 614 for each of ports 602. On each clock cycle, port arbiter 620 retrieves one or more packets from each of ports 602—more precisely, from the respective instances of FIFO buffer 614. If more than one of ports 602 has a packet ready in this fashion, port arbiter retrieves these packets in a pre-defined order (e.g., from the lowest port number to the highest port number).

Packet classifier 622 classifies each incoming packet based on pre-defined rules. The classifications may include two designations, drop and slice (explained below). The rules may include bit-wise logical "and" and "compare" operations on the first 64, 128, 256, or 512 bytes of the packet, for example. A total of 16-512 rules may be supported, and these rules may be software programmable. A packet may match multiple rules. As an example, if a packet matches one or more of the rules, it may be classified for slicing, but if the packet does not match any rules, it may be classified for dropping.

Packet dropper/slicer 624 may either drop or slice a packet based on the packet's classification. A dropped packet is effectively deleted and is no longer processed. A sliced packet is reduced in size—for instance, any bytes beyond the first 64, 128, 256, or 512 bytes of the packet may be removed. Doing so makes storage of data packets more efficient when full packet payloads are not of interest.

Packet compressor 626 is an optional component that may compress a packet's header (e.g., Ethernet, IP, TCP, UDP headers) and/or payload, and replace that with the compressed version. When this occurs, packet compressor 626 may also set a flag bit in one of the packet's capture headers indicating that compression has been performed. In some embodiments, packet compressor 626 may use compression dictionary 628. The latter may contain a list of common byte strings that are represented by shorter, unique encodings in compressed packets.

Back-pressure throttle 630 may apply back-pressure from downstream modules and/or components when those modules and/or components are unable to keep up with the incoming flow of data packets. For instance, back-pressure may be applied when system bus 414 is temporarily congested and cannot transmit data at the requested rate. This back-pressure may be a signal from back-pressure throttle 630 to port arbiter 620 or one or more of FIFO buffers 614 to skip processing of incoming packets for one or more clock cycles. In the rare case where a packet is dropped, back-pressure throttle 630 may maintain counts of total dropped packets and counts per dropped packet for each back-pressure signal. These back-pressure signals are respectively received from DMA engine 510 (due to congestion on bus 414), chunk aligner 632, and padder 636.

Chunk aligner 632 aligns a set of captured packets so that they can be packed into a chunk. Each chunk is 128 kilobytes to 32 megabytes in size, and holds such a set of captured packets such that no packet crosses a chunk boundary, and the first packet of a chunk begins at an offset of 0 within the chunk. Chunk aligner 632 may determine the amount of padding needed so that the last packet in a chunk fills any remaining space in that chunk.

Chunk statistics 634 collates statistics for the data within a chunk. These statistics include timestamps of the first and last packets within the chunk, the total number of data packets within the chunk (possibly including separate counts of the total number of TCP packets and total number of UDP packets in the chunk), the total number of bytes within the chunk (not including padding), the total number of compressed bytes within the chunk, the number of data packets classified to be dropped by packet classifier 622, and various other internal performance metrics. These statistics are passed on to compressor statistics 644 (see FIG. 6C).

Padder 636 adds the number of padding bytes specified by chunk aligner 632 to the last packet of a chunk. The padding bytes may be all 0's, and this padding may be applied after the last byte of the received packets.

Header addition 638 appends a custom header at the beginning of each packet. The contents of the custom header may be similar or the same as that of the PCAP per-packet header 303. In alternative embodiments, the header may be 16 bytes in length and may consist of one or more of the following fields: a NOP field that may be set when the packet contains NOP data from NOP generator 612, a frame check sequence (FCS) fail flag that may be set when the FCS the packet's Ethernet header indicates a corrupted packet, a pad flag that may be set when the chunk contains padding from padder 636, a timestamp field that may contain the time (in nanoseconds and sourced from delimiter 604) of when the packet was captured, a packet capture size field that may indicate the number of bytes of the packet that were actually captured, a packet wire size field that may indicate the actual size of the packet prior to capture, and a portID field that may identify the physical port on which the packet was received. Other fields are possible, and more or less fields may be present. The packet capture size may be less than the packet wire size when packet dropper/slicer 624 and/or compressor 626 is configured to reduce the size of captured packets.

Figure 6C:
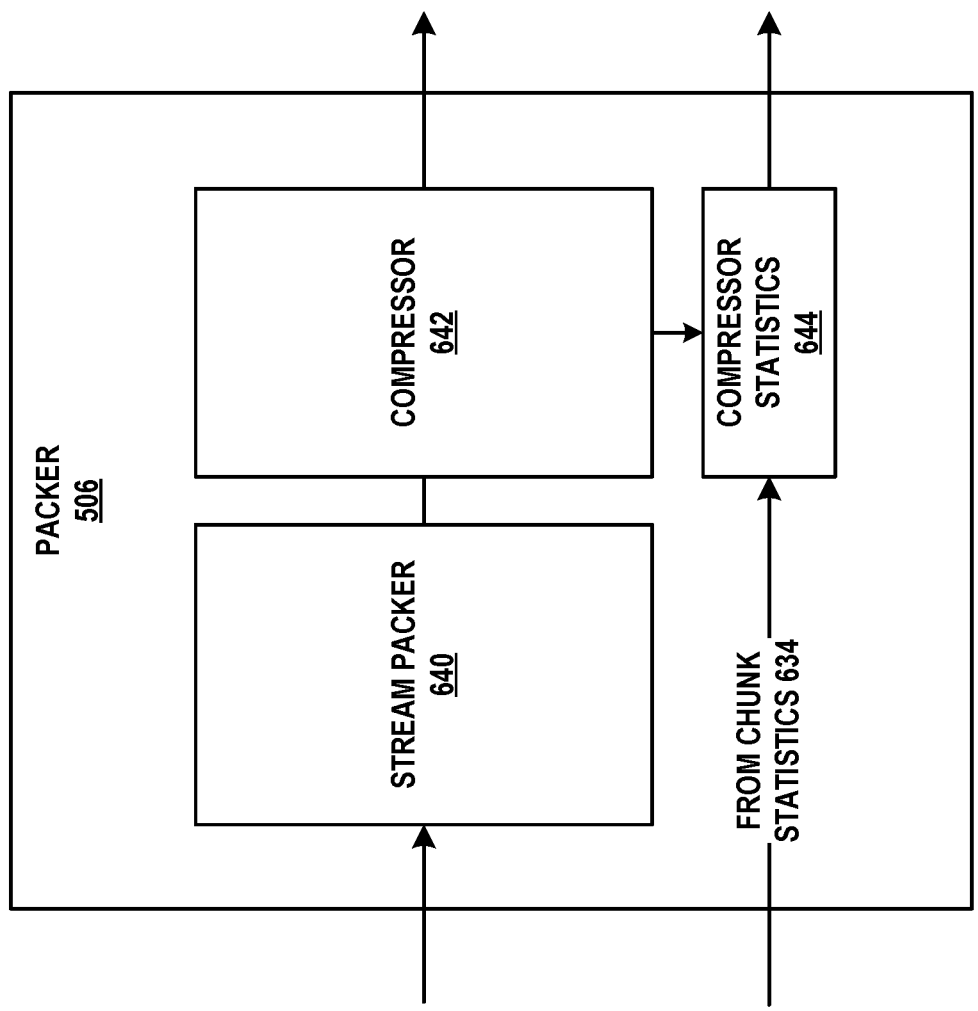
FIG. 6C depicts a packer module on the network interface unit, in accordance with example embodiments.

FIG. 6C illustrates the components of packer 506. These components are presented for purpose of example. More or fewer components may be present in such a logical port module. Similar to the previous drawings, the flow of data packets (and processing thereof) is generally from left to right.

Stream packer 640 may receive packets from header addition 638. Stream packer 640 may arrange these packets into a packed byte stream that may be 512, 1024, 2048, or 4096 bits wide, for example, based on bus width. For instance, suppose that the bus is 2048 bits (256 bytes) wide. Data enters stream packer 640 at a rate of at most one packet per cycle. Suppose that an 80-byte data packet n arrives during cycle 0, an 80-byte data packet n+1 arrives during cycle 1, and a 128-byte data packet n+2 arrives during cycle 2. This sequence leaves at least half of the 2048-bit bus unused during each cycle.

Stream packer 640 arranges these packets so that the full bus is used, if possible, during each cycle. Thus, the first output cycle of stream packer 640 would include all of data packet n, all of data packet n+1, and the first 96 bytes of data packet n+2, for a grand total of 2048 bits. The second output cycle of stream packer 640 would include the remaining 32 bytes of data packet n+2, followed by any further packets. Stream packer 640 forms packets into chunks that are 128 kilobytes to 32 megabytes in size. Thus, each chunk may include multiple packets, perhaps hundreds or thousands of data packets.

Compressor 642 may compress the packed byte stream from stream packer 640. These compression operations are optional and may be omitted if compressor 642 is unable to compress packets into chunks at the incoming data rate. Instead, compressor 642 can, when it is overloaded, write the packets in a pass-through mode in order to maintain line-speed performance.

In some embodiments, a general compression scheme, such as Lempel-Ziv-Welch (LZW) may be used. While this scheme can increase the effective number of data packets stored in long-term packet storage by a factor of 2 or 3, it may be too slow for line rate compression for data incoming from high speed interfaces (e.g., 40 gigabits per second or 100 gigabits per second). A trigger for pass-thru mode may be when the input queue becomes full (or beyond a high water mark), then chunks bypass the compressor until the input queue reaches a low water mark.

Compressor statistics 644 receives information from chunk statistics 634 and provides further information from compressor 642. This information may include the compressed payload size and a cyclic redundancy check (CRC) per chunk.

Figure 6D:
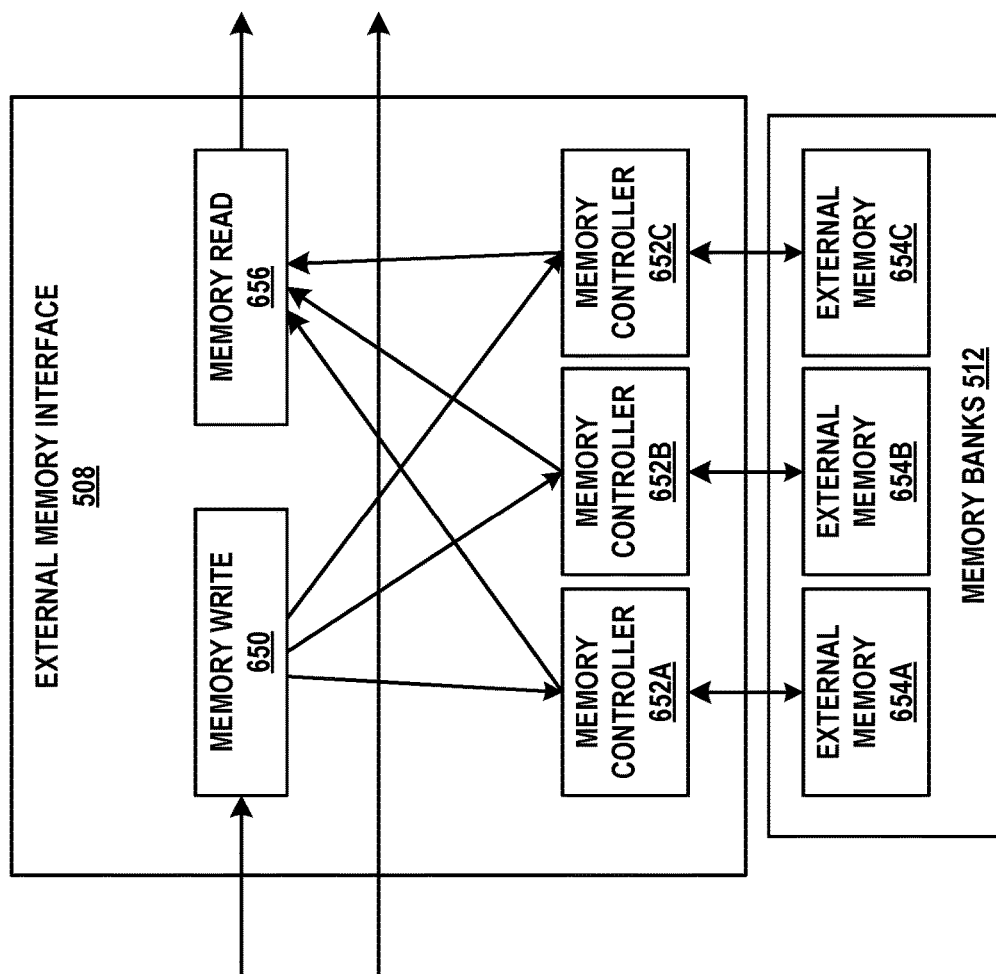
FIG. 6D depicts an external memory interface module on the network interface unit, in accordance with example embodiments.

FIG. 6D illustrates the components of external memory interface 508. These components are presented for purpose of example. More or fewer components may be present in such a memory interface. Similar to the previous drawings, the flow of data packets (and processing thereof) is generally from left to right (with a detour through memory banks 512).

External memory interface 508 may serve to buffer incoming chunks in memory banks 512. Doing so helps avoid congestion on system bus 414 that might otherwise cause these chunks to be dropped. System bus 414 may be too busy to transfer chunks due to usage by host processors and dedicated system memory 402, input/output unit 412, or other peripherals. This congestion may last anywhere from 10 microseconds to several milliseconds or longer.

External memory interface 508 may operate at the full-duplex line speed of the interface(s) through which packets are being captured. For example, if a 100 gigabit per second Ethernet interface is being used to capture packets, reading and writing between external memory interface 508 and memory banks 512 may take place at up to 200 gigabits per second (e.g., 100 gigabits per second reading and 100 gigabits per second writing).

Memory write module 650 may receive chunks from compressor 642 and write these chunks to memory banks 512, by way of memory controllers 652A, 652B, and 652C. Chunks may be written to memory in discrete blocks, the size of which may be based on the bus width between memory controllers 652A, 652B, and 652C and external memory 654A, 654B, and 654C. For each of these blocks, memory write module 650 may calculate a CRC, and store the respective CRCs with the blocks. In some embodiments, memory write module 650 may write these blocks across external memory 654A, 654B, and 654C in a round robin fashion, or in some other way that roughly balances the load on each of external memory 654A, 654B, and 654C.

Memory read module 656 may retrieve, by way of memory controllers 652A, 652B, and 652C, the blocks from memory banks 512, and reassemble these blocks into chunks. In doing so, memory read module 656 may re-calculate the CRC of each block and compare it to the block's stored CRC to determine whether the block has been corrupted during storage.

Although three memory controllers and three external memories are shown in FIG. 6D, more or fewer memory controllers and external memories may be used. Each memory controller may synchronize its refresh cycle so all external memory refresh cycles occur at the same time. This may improve memory throughput when multiple separate memory banks are used in unison.

Figure 6E:
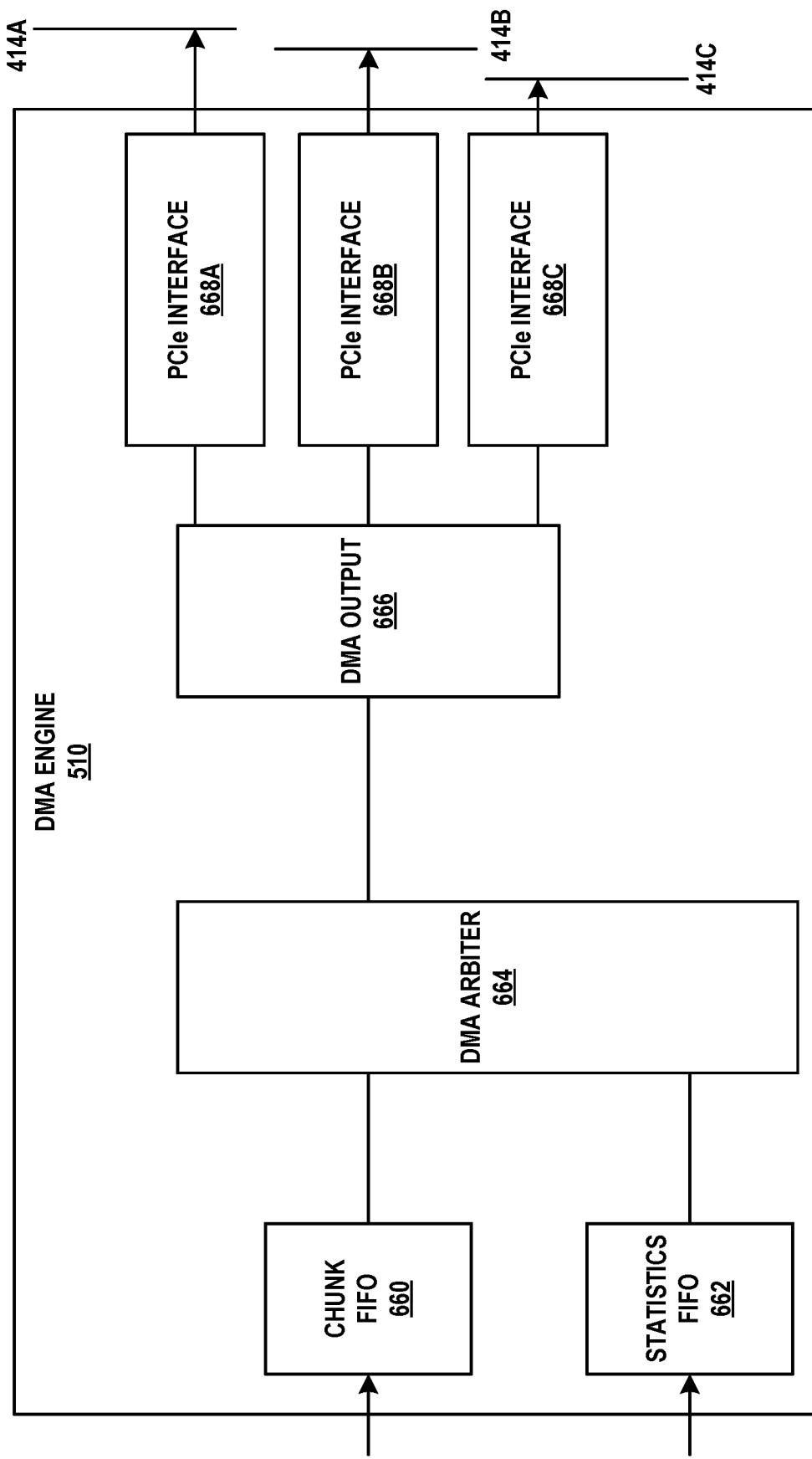
FIG. 6E depicts a direct memory access engine module on the network interface unit, in accordance with example embodiments.

FIG. 6E illustrates the components of DMA engine 510. These components are presented for purpose of example. More or fewer components may be present in a DMA engine. Similar to the previous drawings, the flow of data packets (and processing thereof) is generally from left to right.

Chunk FIFO 660 is a buffer that receives chunks from memory read module 656 and temporarily stores these chunks for further processing by DMA engine 510. Similarly, statistics FIFO 662 is another buffer that receives statistics from various units of FPGA-based network interface 406 for a particular chunk. These statistics may include, but are not limited to, data from chunk statistics 634 and compressor statistics 644. This data may include, for example, first and last timestamps of data packets within a chunk, a number of data packets within a chunk, the compressed size of a chunk, and various FIFO levels and/or hardware performance metrics at the present clock cycle. Chunk FIFO 660 and Statistics FIFO 662 operate independently, although in practice (and by design) data in chunk FIFO 660 and statistics FIFO 662 usually refer to the same chunk.

Data from both chunk FIFO 660 and statistics FIFO 662 are read by DMA arbiter 664. DMA arbiter 664 multiplexes this data from both FIFOs, as well as status updates from capture ring 800 (see FIG. 8A). These status updates indicate the next memory location in capture ring 800 that is available for chunk storage. DMA arbiter 664 assigns the highest priority to processing status updates from capture ring 800, the second highest priority to output from statistics FIFO 662, and the lowest priority to chunks from chunk FIFO 660.

System bus 414 may consist of multiple independent busses 414A, 414B, and 414C. Although three busses are shown in FIG. 6E, more or fewer busses may be used. DMA output 666 schedules data from chunk FIFO 660 and statistics FIFO 662 to be written by way of PCIe interfaces 668A, 668B, and 668C to busses 414A, 414B, and 414C, respectively. For instance, DMA output 666 may multiplex and write this data as maximum sized bus packets (e.g., 256 bytes) to busses 414A, 414B, and 414C according to a fair round-robin scheduler.

A DMA performance monitor (not shown) may be incorporated into either DMA arbiter 664 or DMA output 666. For instance, if busses 414A, 414B, and 414C are PCIe busses, this module may monitor their performance by determining the number of minimum credits, maximum credits, occupancies, stall durations, and so on for each bus. This includes the allocation of PCIe credits on each bus (for flow control on these busses) and the allocation of DMA credits for flow control related to capture ring buffer 800 of a NUMA node (see FIG. 8A, below).

The latter mechanism may be based on a credit token system. For instance, one token may equate to a 256-byte write operation (a maximum sized PCIe write operation) to capture ring buffer 800. DMA arbiter 664 maintains a number of DMA credits. This is initialized to be the number of entries in capture ring buffer 800. Every time a full sized PCIe write operation is occurs, the DMA credit count is decremented. If the total number of DMA credits is zero, then back pressure is signaled which eventually leads to back pressure throttle 630 dropping packets. Also, when DMA credit is zero, no PCIe write operations are issued. Software operating on one of the NUMA nodes adds DMA credits after a chunk has been processed and removed from capture ring buffer 800, essentially freeing that memory area so the hardware can write a new chunk into it.

B. Example Host Processor and Dedicated Memory Architecture

FIG. 7 depicts host processors and dedicated memory 402, which provides the connectivity between FPGA-based network interface 406 and long-term packet storage 404A. Particularly, host processors and dedicated memory 402 may include processor 700, memory 702, processor 704, and memory 706. Both processor 700 and processor 704 may represent multiple (e.g., 2, 4, or 8) individual processors.

FPGA-based network interface 406 connects by way of system bus 414 to processor 700. Processor 700 and memory 702 may be components of a first NUMA node. Similarly, processor 704 and memory 706 may be components of a second NUMA node which may be connected to the first NUMA node by way of a quick path interconnect (QPI) interface, or some other type of processor interconnect.

The second NUMA node may also be connected, by way of system bus 416, to storage controller 708. Like system bus 414, system bus 416 may include multiple independent busses. This decoupling of the NUMA node communications further improves packet capture performance by separating the throughput and latency characteristics of writes from FPGA-based network interface 406 to memory 702 and writes from memory 706 to long-term packet storage 404A.

In some embodiments, processor 700 may be referred to as a network interface processor (because processor 700 reads data packets from FPGA-based network interface 406) and processor 704 may be referred to as a storage processor (because processor 704 writes data packets and/or chunks thereof to long-term packet storage 404A). In various arrangements, processor 700 and processor 704 each may be able to read from and/or write to memory 702 and memory 706.

Storage controller 708 may be a host bus adapter (HBA) controller, for example. Storage controller 708 may provide the second NUMA node with access to long-term packet storage 404A. Long-term packet storage 404A may include an array of n solid state drives, or some other form of non-volatile storage. In some embodiments, multiple storage controllers may be used to support a packet storage rate of 100 gigabits per second. The first and/or second NUMA node may further be connected to host operating system storage 404B.

In summary, chunks of data packets are written directly from FPGA-based network interface 406 to memory 702. Processor 700 reads these chunks from memory 702, and applies some additional processing such as generating CRCs and/or calculating chunk statistics. Processor 700 then writes the chunks to memory 706. Processor 700 and/or processor 704 run input/output schedulers which instruct storage controller 708 to write, from memory 706, the chunks to a specified location on one of the units of storage in long-term packet storage 404A. Storage controller 708 responsively performs these writes. This sequence of operations is further illustrated in FIGS. 8A-8D.

Figure 8A:
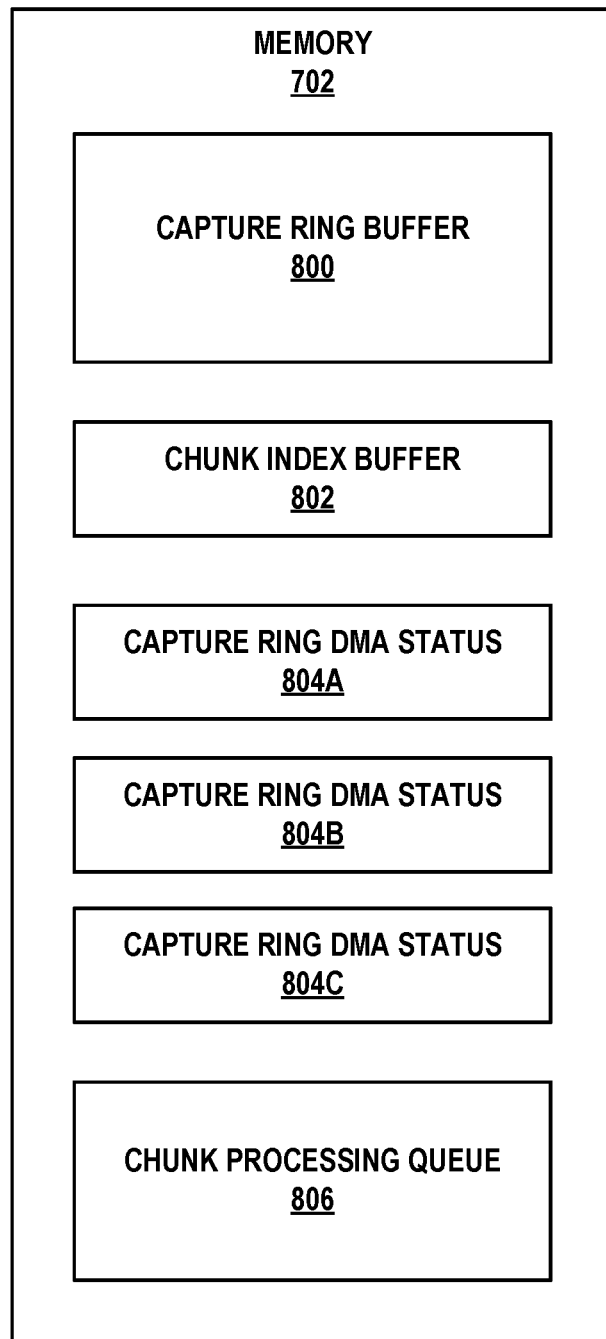
FIG. 8A depicts data structures in a memory module, in accordance with example embodiments.

FIG. 8A illustrates example data structures for packet storage and management in memory 702. Capture ring buffer 800 holds chunks transferred by DMA output 666, and operates as a conventional ring buffer. Capture ring buffer may be 4 gigabytes in size in some embodiments, but can be of any size (e.g., 1, 2, 8, 16 gigabytes, etc.).

The ring buffers herein, such as capture ring buffer 800, are usually implemented as fixed sized arrays of b entries, with pointers referring to the current head and tail locations. A producer writes a new entry to the current location of the tail, while a consumer removes the oldest entry from the head. These head and tail pointers are incremented modulo b for each read and write, so that the buffer logically wraps around on itself.

Chunk index buffer 802 may store information from statistics FIFO 662 (which ultimately originated at chunk statistics 634 and compressor statistics 644 among other possible sources) for each chunk in capture ring buffer 800. Thus, this information may include timestamps of the first and last data packets within the chunk, the total number of data packets within the chunk, the total number of bytes within the chunk (not including padding), the total number of compressed bytes within the chunk, and so on.

Capture ring DMA status 804A, 804B, and 804C memory locations respectively associated with busses 414A, 414B, and 414C. Their contents can be used to control write access to capture ring buffer 800, as described below.

Chunk processing queue 806 contains references to chunks in capture ring buffer 800 that are ready for writing to memory 706. Use of this structure is also described below.

FIG. 8B illustrates example data structures for packet storage and management in memory 706, as well as their relation to storage controller 708 and long-term packet storage 404A. Capture write buffer 810 temporarily stores chunks transferred from capture ring buffer 800. These chunks are then distributed across n units of non-volatile storage (SSD0-SSDn). In order to do so, each chunk is queued for writing to one of these units. This information is stored in I/O queue 814. For each of the n units of non-volatile storage, I/O queue 814 contains a list of entries. These entries are populated to spread consecutive chunks over the available units. While only 3 units (SSDs) are shown in FIG. 8B for purpose of convenience, more units may be used. Chunk parity write buffer 812 queues redundancy data related to chunks.

For instance, SSD0 entry 0 in SSD0 write buffer 816 may refer to the first chunk (chunk 0) in capture write buffer 810, SSD1 entry 0 in SSD1 write buffer 818 may refer to the second chunk (chunk 1) in capture write buffer 810, and SSD2 entry 0 in SSD2 write buffer 820 may refer to the third chunk (chunk 2) in capture write buffer 810. Similarly, SSD0 entry 1 in SSD0 write buffer 816 may refer to the fourth chunk (chunk 3) in capture write buffer 810, SSD1 entry 1 in SSD1 write buffer 818 may refer to the fifth chunk (chunk 4) in capture write buffer 810, and SSD2 entry 1 in SSD2 write buffer 820 may refer to the sixth chunk (chunk 5) in capture write buffer 810. More entries per SSD may be used. According to this mapping of chunks to SSDs, for a system with d SSDs, chunk c maps to SSD s entry e, where s=c mod d and e=$\lfloor s/d \rfloor$ or the FIFO producer index of SSD0 write buffer 816/SSD1 write buffer 818/SSD2 write buffer 820.

The processing of chunks and related data may take place according to the following description. DMA output 666 may write chunks from chunk FIFO 660 to respective locations in capture ring buffer 800, while data from statistics FIFO 662 may be written to respective locations in chunk index buffer 802. DMA output 666 may also broadcast updates to capture ring DMA status 804A, 804B, and 804C by way of busses 414A, 414B, and 414C. The data written may be pointers to the next available location in capture ring buffer 800. Thus, the contents of capture ring DMA status 804A, 804B, and 804C might not take on the same value when at least one of busses 414A, 414B, and 414C is operating more slowly than the others (e.g., it is congested or stalled). This mechanism also serves to allow multiple simultaneous writes to capture ring buffer 800 and chunk index buffer 802 without using memory locking.

Processor 700 may repeatedly read capture ring DMA status 804A, 804B, and 804C for the location of the oldest transferred chunk. The oldest transferred chunk may be the chunk in the location of capture ring buffer 800 pointed to by the "lowest" of any of capture ring DMA status 804A, 804B, and 804C, taking into account the fact that these values wrap around from the end to the beginning of the ring buffer as they advance. This maintains the completion of all writes into capture ring buffer 800 for a specific chunk, regardless of any splitting or re-ordering by DMA output 666 or system busses 414A, 414B, or 414C due to system congestion and stalling.

Once this chunk is identified, processor 700 may allocate an entry in I/O queue 814 (e.g., SSD0 entry1, SSD1 entry0, etc.) according to the mapping of chunks to SSDs described above. Further, processor 700 may allocate a new location in which to store the chunk on the selected SSD. Processor 700 may also place, into chunk processing queue 806, the memory location of the chunk, the memory location of the associated chunk index, and an indication of the entry in I/O queue 814.

For every set of j consecutive chunks processed in this manner (where j is anywhere from 2 to 100), r parity chunks (where r is anywhere from 1 to 5) may be generated for purposes of redundancy. For instance, when a non-overlapping set of j consecutive chunks have been processed for representation in chunk processing queue 806, one of processor 700 or processor 704 may calculate one or more Reed-Solomon codes (or other error-correcting codes) based on these chunks. These codes form the parity chunks, and may be stored in one or more parity SSDs (not shown). The parity SSDs may be written to in a fashion similar to that of FIG. 8B and described below. This redundancy procedure is akin to that of RAID5 or RAID6, but supports a higher level of recovery. In principle the system can recover from the failure of a greater number of SSDs.

Chunk parity write buffer 812 is where parity data is stored and queued for write operations to parity SSDs. This process is similar to that of writing chunks to SSDs, except the parity data is handled by the processor and is not used with capture ring buffer 800 or capture write buffer 810.

Regardless, processor 700, processor 704, or both may perform the following set of operations in order to transfer chunks in capture ring buffer 800 of memory 702 to capture write buffer 810 in memory 704. In some cases, multiple processors may operate in parallel on different chunks.

First, a processor reads the head of chunk processing queue 806 to obtain the location of the next chunk in capture ring buffer 800, its associated index in chunk index buffer 802, and its target entry in I/O queue 814. Based on the target entry, the processor writes this chunk to the specified memory location in capture write buffer 810.

Then, from the target entry in I/O queue 814, the processor determines the SSD and the location therein at which the chunk is to be stored. The processor issues a command instructing storage controller 708 to write the chunk from its memory location in capture write buffer 810 to this location in the designated SSD. For instance, if the chunk is referred to by SSD0 entry 1 of SSD0 write buffer 816, the chunk is written to SSD0.

Then, a CRC is calculated over the entire chunk. This CRC enables the integrity of the chunk's data in non-volatile memory to be validated at any time in the future. The value of the CRC, the location of the chunk as stored on the designated SSD, as well as the entry related to the chunk in chunk index buffer 802, are written to host operating system storage 404B. Notably, this allows the chunk to be found through a simple lookup in host operating system storage 404B rather than having to search the SSDs for the chunk. Since entries in chunk index buffer 802 are much smaller than their associated chunks, this makes finding a particular chunk an inexpensive procedure. Other chunk statistics may also be written to host operating system storage 404B.

When storage controller 708 completes writing the chunk (as well as possibly other chunks that are queued for writing) to an SSD, it writes an indication of such to an I/O queue completion buffer (not shown) associated with I/O queue 814. One of processor 700 or 704 may monitor the I/O queue completion buffer to determine when the write completes. After write completion is detected, the processor may update the entry related to the chunk in host operating system storage 404B to indicate that the chunk has been committed to storage.

Figure 8C:
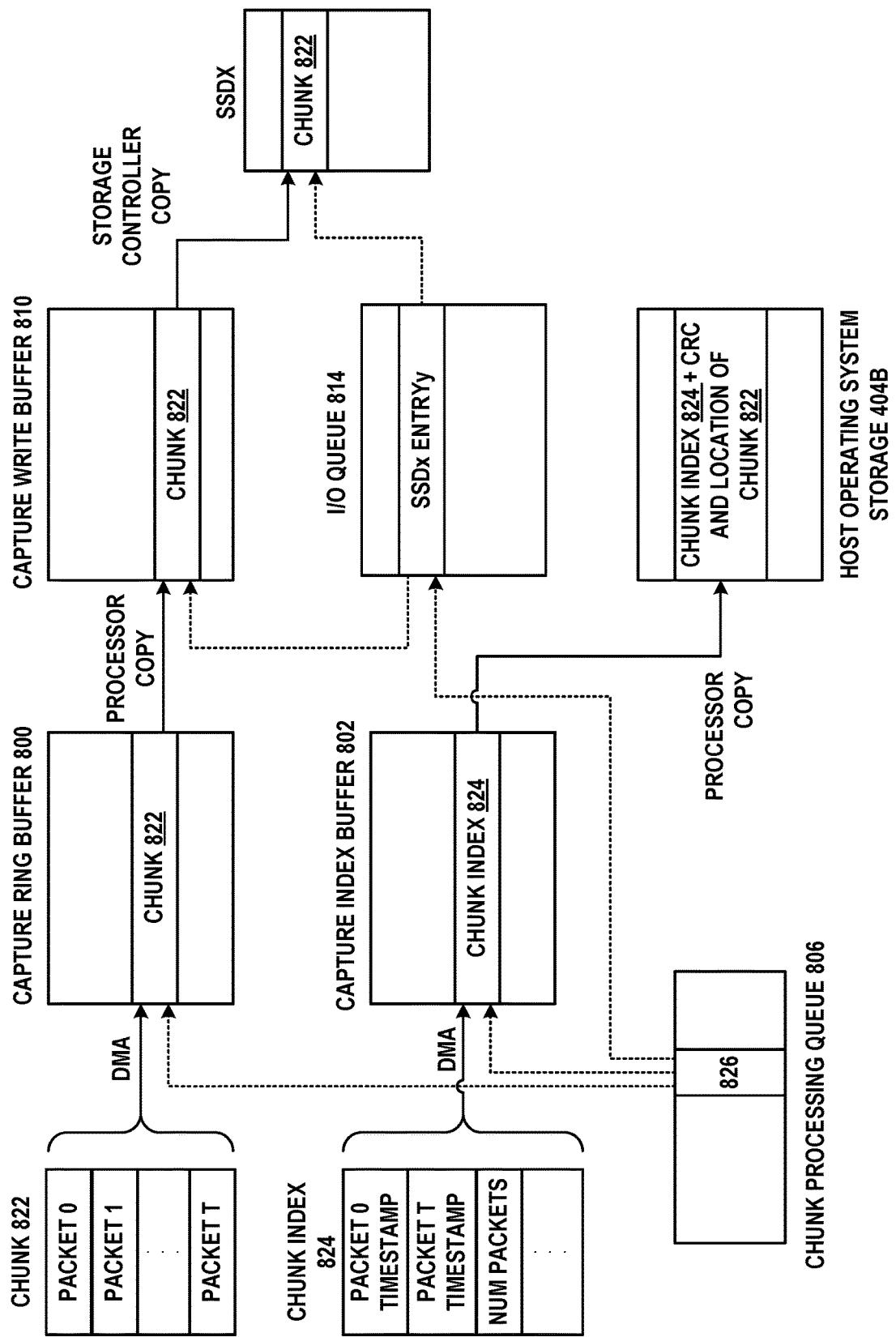
FIG. 8C depicts relationships between the data structures of FIGS. 8A and 8B, in accordance with example embodiments.

FIG. 8C depicts relationships between the data structures of FIGS. 8A and 8B. In particular, FIG. 8C includes example chunk 822 and example chunk index 824. Chunk 822 contains T+1 captured packets, ordered from least-recently captured (packet 0) to most-recently captured (packet T). Chunk index 824 is associated with chunk 822, and contains (among other information) a timestamp representing when packet 0 was captured, a timestamp representing when packet T was captured, and the number of data packets in chunk 822 (T+1).

As described above, chunk 822 and chunk index 824 may be transferred by way of DMA to capture ring buffer 800 and capture index buffer 802, respectively. Any transfer or copying of data may be represented with a solid line in FIG. 8C. On the other hand, relationships between data may be represented with dotted lines.

An entry 826 is added to chunk processing queue 806. This entry refers to the locations of both chunk 822 in capture ring buffer 800 and chunk index 824 in capture index buffer 802, as well as a location in I/O queue 814 that is entry y in the queue for SSDx. A processor copies chunk 822 from capture ring buffer 800 to a location in capture write buffer 810 that is associated with entry y in the queue for SSDx. As part of processing the write queue for SSDx, the processor also instructs a storage controller to write chunk 822 to SSDx. The format used to store chunks in long-term storage, such as an SSD, may vary from the PCAP format described in reference to FIG. 3.

The processor further copies chunk index 824 and the CRC and SSD storage location of chunk 822 to host operating system storage 404B. As steps of this procedure complete, locations in capture ring buffer 800, capture index buffer 802, and capture write buffer 810 used for temporarily storing chunk 822 and chunk index 824 may be freed for other uses.

This arrangement provides for high speed capture and storage of data packets. Particularly, sustained rates of 100 gigabytes per second can be supported. The end to end storage system described herein does so by operating on chunks rather than individual packets, carefully aligning chunks as well as packets within chunks for ease of processing, pipelining chunk processing so that multiple chunks can be processed in parallel, copying each chunk only once (from memory 702 to memory 706), writing chunks sequentially across an array of SSDs (or other storage units) to increase sequential write performance over writing sequentially to the same SSD, and prioritizing chunk writing operations over other operations.

Notably, when writing to a particular SSD, each chunk is written to a sequentially increasing location. This limits SSD stalls due to internal garbage collection and wear-leveling logic.

C. Example Packet Capture Operations

Figure 8D:
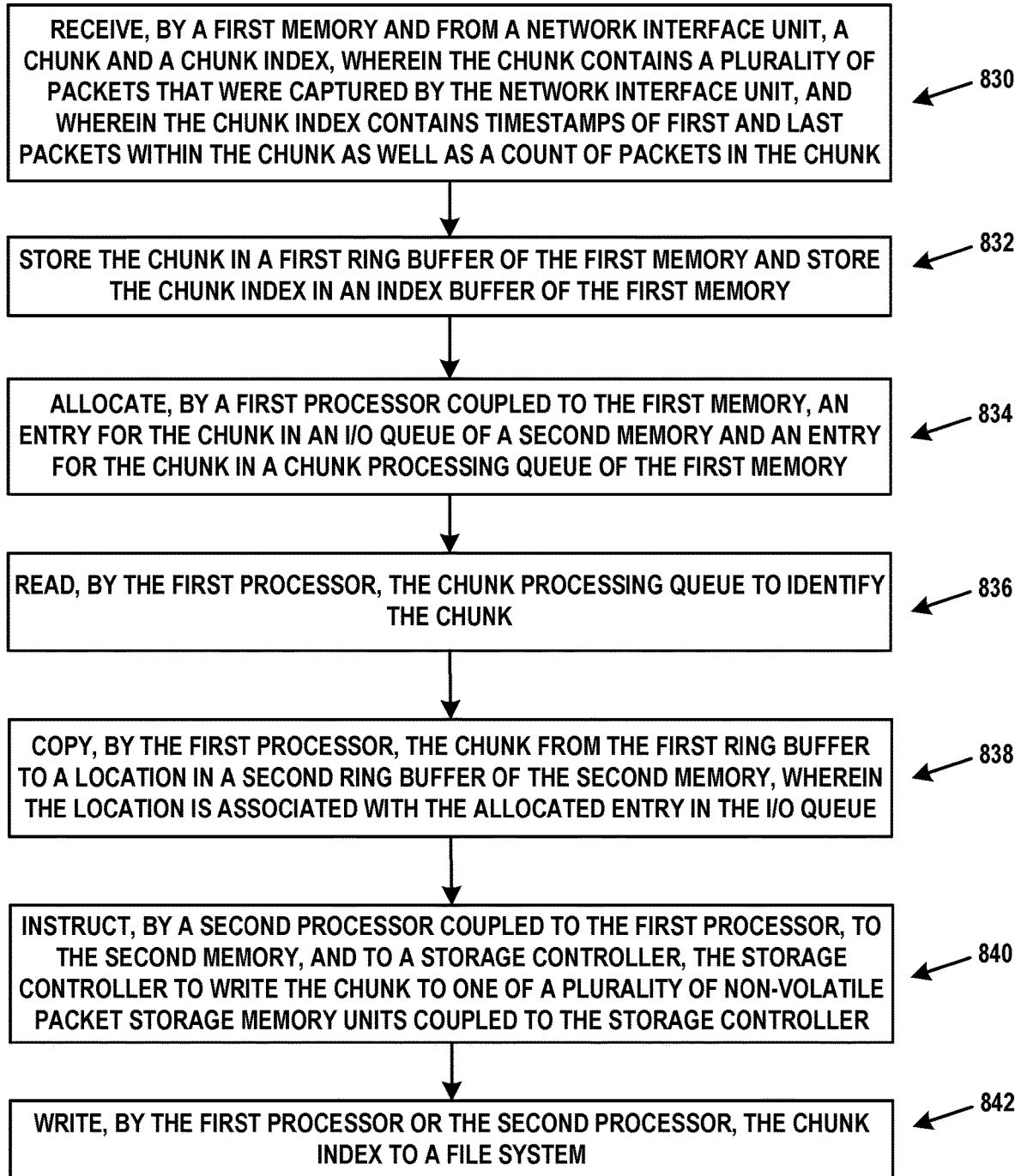
FIG. 8D is a flow chart, in accordance with example embodiments.

FIG. 8D is a flow chart illustrating an example embodiment. The process illustrated by FIG. 8D may be carried out by one or more processors and memories coupled to a network interface and storage controller. The storage controller may, in turn, be coupled to long-term packet storage. The network interface may receive packets and arrange these packets into chunks.

The embodiments of FIG. 8D may be simplified by the removal of any one or more of the features shown therein. Further, these embodiments may be combined with features, aspects, and/or implementations of any of the previous figures or otherwise described herein.

Block 830 may involve receiving, by a first memory and from a network interface, a chunk of data packets and a chunk index. The chunk may contain a plurality of data packets that were captured by the network interface, and the chunk index may contain timestamps of the first and last packets within the chunk as well as a count of data packets in the chunk. The network interface unit may include one or more Ethernet interfaces, each with a line speed of at least 10 gigabits per second.

The count of data packets in the associated chunk indexes may include counts of TCP packets in the associated chunks and/or counts of UDP packets in the associated chunks. In a more general case, the counts of data packets in the associated chunk indexes may include a plurality of independent counters relating to user programmable packet classifiers in the associated chunks.

In some embodiments, the size of each of the chunks is fixed and identical. Each of the chunks may contain an integer number of data packets, and unused space in any of the chunks may be filled with padding bytes.

Block 832 may involve storing the chunk in a first ring buffer of the first memory and storing the chunk index in an index buffer of the first memory.

Block 834 may involve allocating, by a first processor coupled to the first memory, an entry for the chunk in an I/O queue of a second memory and an entry for the chunk in a chunk processing queue of the first memory.

Block 836 may involve reading, by the first processor, the chunk processing queue to identify the chunk.

Block 838 may involve copying, by the first processor, the chunk from the first ring buffer to a location in a second ring buffer of the second memory. The location may be associated with the allocated entry in the I/O queue.

Block 840 may involve instructing, by a second processor coupled to the first processor, to the second memory, and to a storage controller, the storage controller to write the chunk to one of a plurality of non-volatile packet storage memory units coupled to the storage controller. The first processor and the first memory may be part of a first NUMA node, and the second processor and the second memory may be part of a second NUMA node. The plurality of non-volatile packet storage memory units may include a plurality of SSDs.

In some embodiments, the first processor and the first memory are communicatively coupled to the network interface unit by way of a first system bus, and the second processor and the second memory communicatively coupled to the plurality of non-volatile packet storage memory units by way of a second system bus. The network interface unit may include a DMA engine that writes chunks to the first memory by way of the first system bus. The network interface unit may also include a back-pressure throttle that causes delay or dropping of received packets when the DMA engine detects congestion on the first system bus.

Block 842 may involve writing, by the first processor or the second processor, the chunk index to a file system that is separate from the plurality of non-volatile packet storage memory units.

In some embodiments, the first processor or the second processor may also be configured to, for a group of the chunks that are consecutively placed in the chunk processing queue: calculate one or more parity chunks by applying an error-correcting code to the group of chunks, store the one or more parity chunks in a chunk parity write buffer of the second memory, and write the one or more parity chunks across one or more non-volatile parity storage memory units that are separate from the plurality of non-volatile packet storage memory units.

III. EXAMPLE IMPROVED HIGH SPEED PACKET CAPTURE SYSTEM—READ DIRECTION

In addition to storing chunks of data packets, computing device 400 may also be able to retrieve specific packets from particular stored chunks of data packets. These retrieved packets may then be converted into a format, such as the PCAP format, that is compatible with available packet analysis tools.

For instance, a number of chunks of data packets may be stored in long-term packet storage 404A and associated chunk indexes may be stored in host operating system storage 404B. A filter expression may be received. For instance, the filter expression may be provided by a user or read from a file. The filter expression may specify a time period.

Either one of processors 700 or 704 may look up matches to this filter in the chunk indexes stored in host operating system storage 404B. For instance, if the filter specifies a particular time period (e.g., defined by a starting timestamp and an ending timestamp), the matched chunk indexes will be those associated with chunks that contain packets captured within the particular time period. A binary search over the ordered timestamps in the chunk index may be used to locate specific chunks.

Each matched chunk index contains a reference to a storage location, in long-term packet storage 404A, of its associated chunk. Based on these locations, the processor can instruct storage controller 708 to retrieve these chunks. A CRC calculation may be run against each chunk and compared to the CRC calculation in the associated chunk index. If these values do not match, the chunk may be discarded and full chunk data may be re-calculated using the error correcting parity information.

After the CRC is validated, the chunks may be decompressed (if compression had been applied), and individual packets within the chunks that match the filter may be identified. These packets may be extracted from the chunks and stored in a format that is supported by packet analysis tools (e.g., the PCAP format).

Figure 9:
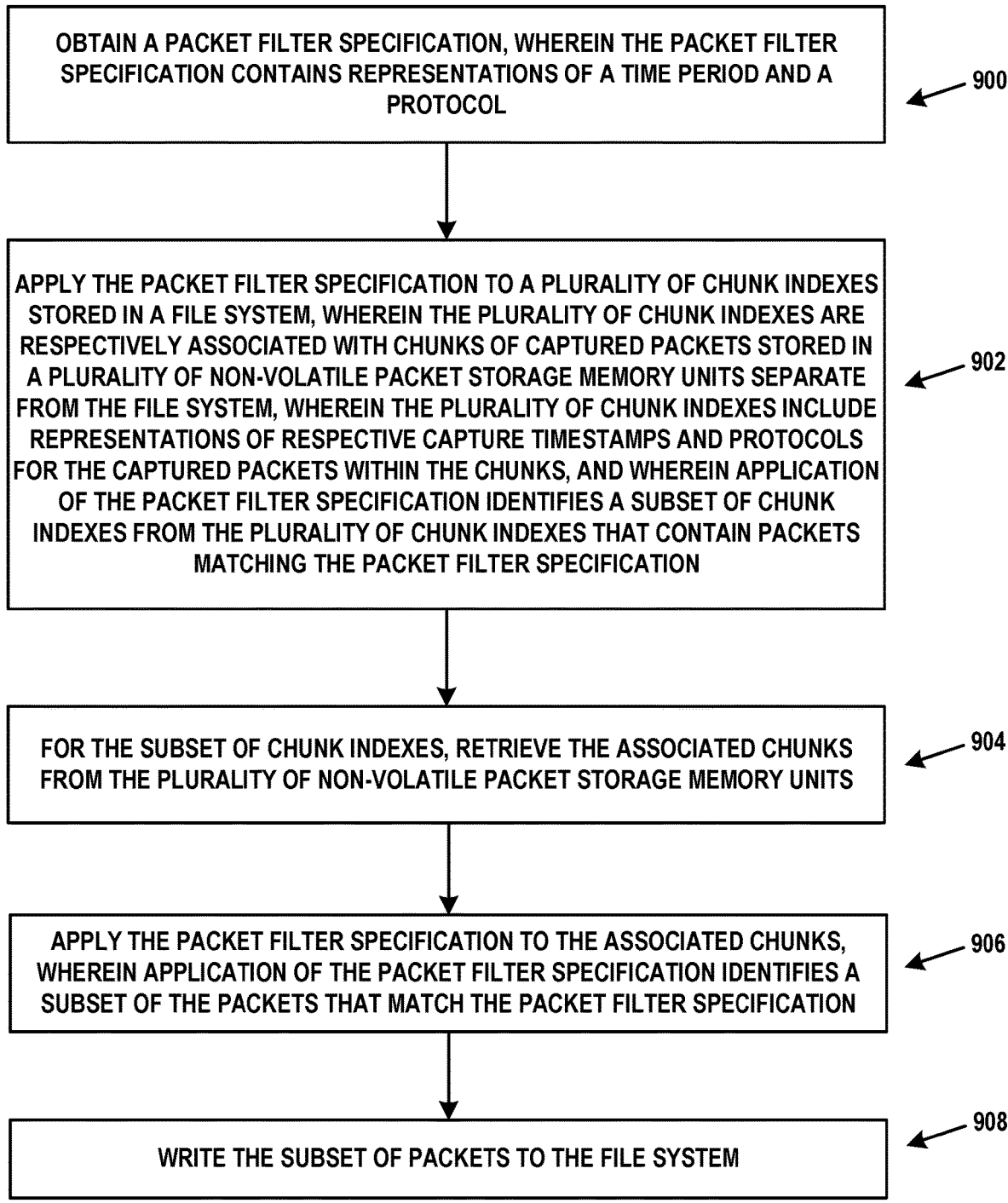
FIG. 9 is another flow chart, in accordance with example embodiments.

FIG. 9 is a flow chart illustrating an example embodiment. The process illustrated by FIG. 9 may be carried out by one or more processors and memories coupled to a network interface and storage controller. The storage controller may, in turn, be coupled to long-term packet storage. The network interface may receive packets and arrange these packets into chunks.

The embodiments of FIG. 9 may be simplified by the removal of any one or more of the features shown therein. Further, these embodiments may be combined with features, aspects, and/or implementations of any of the previous figures or otherwise described herein.

Block 900 may involve obtaining a packet filter specification, wherein the packet filter specification contains representations of a time period and a protocol.

Block 902 may involve applying the packet filter specification to a plurality of chunk indexes stored in a file system. The plurality of chunk indexes may be respectively associated with chunks of captured packets stored in a plurality of non-volatile packet storage memory units separate from the file system. The plurality of chunk indexes may include representations of respective capture timestamps and protocols for the captured packets within the chunks. Application of the packet filter specification may identify a subset of chunk indexes from the plurality of chunk indexes that contain packets matching the packet filter specification.

Block 904 may involve, for the subset of chunk indexes, retrieving the associated chunks from the plurality of non-volatile packet storage memory units.

Block 906 may involve applying the packet filter specification to each packet within the associated chunks. Application of the packet filter specification may identify a subset of the packets that match the packet filter specification.

Block 908 may involve writing the subset of data packets to the file system or output queue. This file system may be local or remote. In some cases, the output queue may be an operating system pipe to another application.

IV. ADVANCED STORAGE ARCHITECTURE

Figure 10:
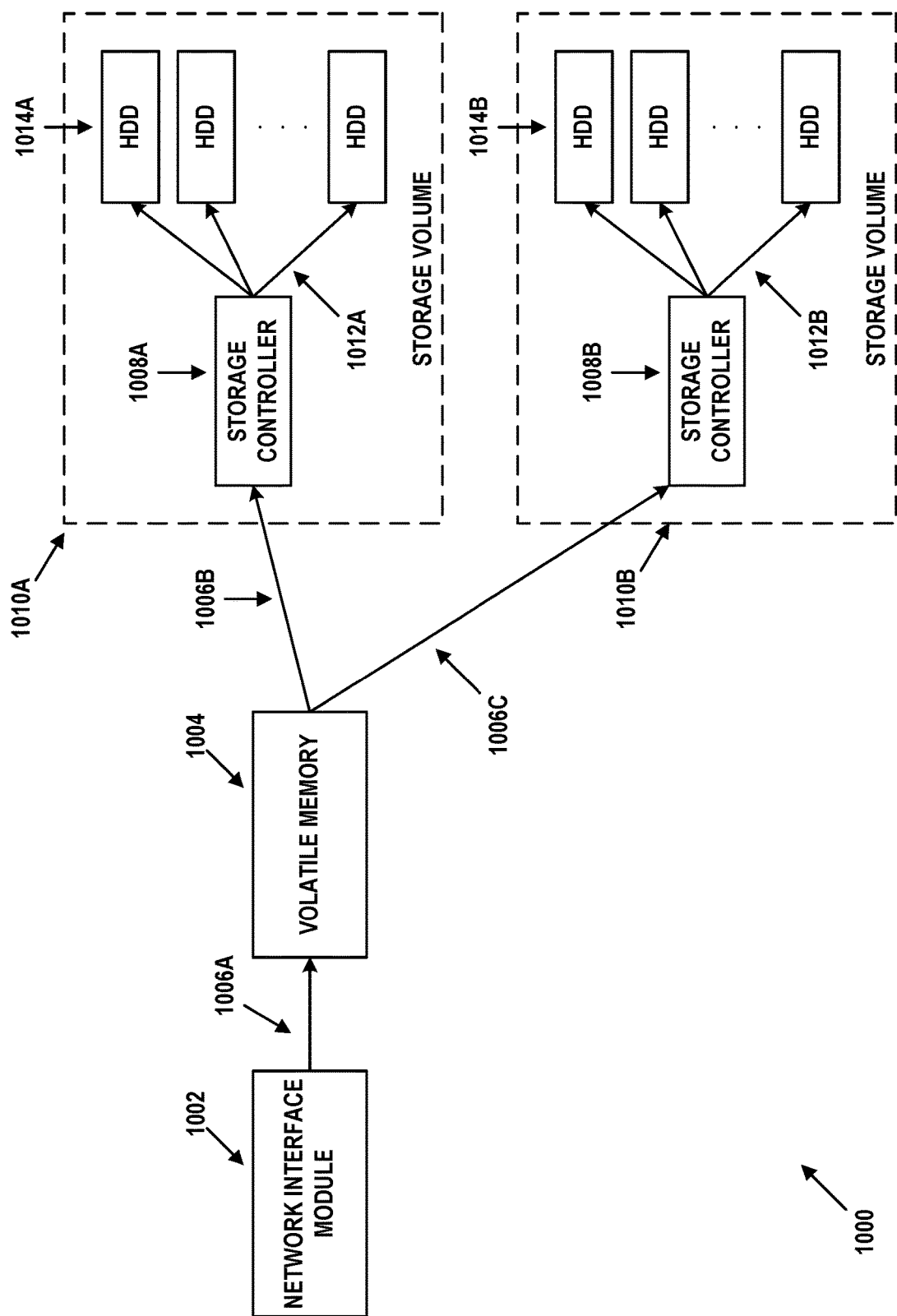
FIG. 10 depicts an example data packet capture system unable to sustain high speed, low-latency capture, in accordance with example embodiments.

As noted above, data packet capture systems that use HDDs for long term storage have limited throughput due to the latency and jitter associated with writing to these drives. FIG. 10 depicts the architecture 1000 of such a data packet capture system and illustrates its limitations.

Architecture 1000 may be simplified to some extent, but generally consists of network interface module 1002, volatile memory 1004, and storage volumes 1010A and 1010B. Network interface module 1002 may be an ASIC or FPGA that receives data packets from a network (e.g., Ethernet) and stores representations of these data packets in volatile memory 1004.

Volatile memory 1004 may be system RAM. One or more processors (not shown in FIG. 10) may manipulate data packets entering, stored in, or exiting volatile memory 1004, such as converting from the format provided by network interface module 1002 to PCAP format, or by arranging data packets storage in PCAP format in chunks of fixed or variable sizes.

Bus 1006A connects network interface module 1002 to volatile memory 1004, and may be any form of high-performance bus, such as PCI Express for example.

Storage volume 1010A may be a redundant array of inexpensive disks (RAID) sub-system that contains storage controller 1008A and HDD array 1014A. Storage controller 1008A may manage storage to and retrieval from HDD array 1014A so that these HDDs appear to the rest of the system as a single unified device. As such, storage controller 1008A may replicate data packets in various ways across multiple HDDs and/or add error-correcting codes to these data packets. HDD array 1014A may be two or more HDDs, often 8, 12, or 16. For data packet storage purposes, these HDDs may be selected to have high write speed (relative to other HDDs) and a large capacity (e.g., several terabytes). Bus 1012A connects storage controller 1008A to HDD array 1014A, and may operate according to serial ATA (SATA), serially-attached SCSI (SAS) or Fiber Channel technologies for example.

Storage volume 1010B may have a similar or the same arrangement as storage volume 1010A. Thus storage volume 1010B contains storage controller 1008B and HDD array 1014B. Bus 1012B connects storage controller 1008B to HDD array 1014B. While only two storage volumes are shown in FIG. 10, more storage volumes may be present.

Bus 1006B connects volatile memory 1004 to storage volume 1010A, and bus 1006C connects volatile memory 1004 to storage volume 1010B. Like bus 1006A, these buses may be any form of high-performance bus, such as PCI Express for example. Further, while the buses shown in FIG. 10 depicts data flowing in the write direction (from network interface module 1002 to HDD storage, each bus may support bi-directional communication.

When data packets are being captured by a system with architecture 1000, they need to be committed to storage in the HDDs at line speed. Thus, if the sustained data packet capture rate is 100 gigabits per second, storage volumes 1010A and 1010B must be able to maintain this rate. If not, volatile memory 1004 is forced to queue more and more of the data packets that are waiting to be written to magnetic storage until the backpressure overwhelms the amount of storage in volatile memory 1004, and data packets are dropped or lost as a result.

In practice, even products that claim to be able to achieve 100 gigabit per second data packet capture and storage speeds cannot sustain such speeds due to the inherent latency and jitter associated with magnetic storage. Furthermore, the magnetic storage cannot be in an external network attached storage (NAS) device because transmission of captured data packets over a network introduces even more latency and jitter.

Figure 11:
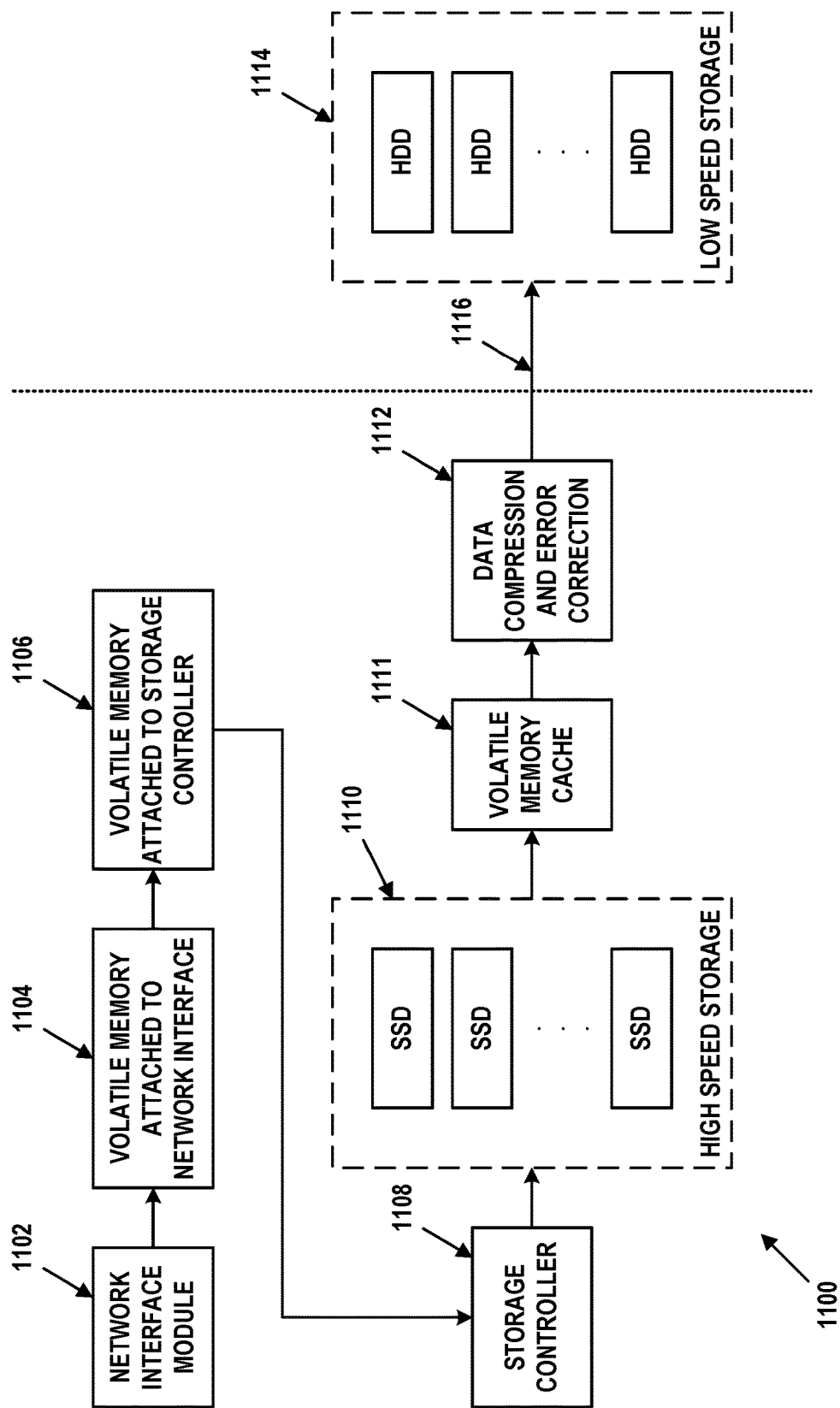
FIG. 11 depicts an example data packet capture system able to sustain high speed, low-latency capture, in accordance with example embodiments.

FIG. 11 depicts an improved architecture that addresses these issues. In particular, packet capture device 1100 contains network interface module 1102, storage controller 1108, high speed storage 1110, volatile memory cache 1111, and data compression and error correction unit 1112. Network interface module 1102 has attached volatile memory 1104, while storage controller 1108 has attached volatile memory 1106. Further, low speed storage 1114 is connected to packet capture device 1100 by interface 1116.

In some embodiments, packet capture device 1100 may contain a variation of the packet capture architecture described above. For example, the data flow through packet capture device 1100 is similar to that of example computing device 400 as described in the context of FIGS. 4 and 7. Notably, network interface module 1102 may be FPGA-based network interface 406, volatile memory 1104 may be temporary packet storage memory 408, volatile memory 1106 may be memory 702 or 706, storage controller 1108 may be storage controller 708, and high speed storage 1110 may be long-term packet storage 404A. But other options are possible. Also, in order to simplify FIG. 11, certain elements have been omitted, such as processors, operating system storage, management interfaces, and end-user input/output mechanisms. Nonetheless, packet capture device 1100 should be considered to be embodied by—but not limited by—the various discloses herein.

Network interface module 1102 receives data packets from one or more network interfaces. These may be of various types and speeds, such as 1 gigabit per second, 10 gigabits per second, 40 gigabits per second, or 100 gigabits per second Ethernet. Network interface module 1102 provides these data packets to volatile memory 1104 for temporary storage and buffering.

One or more processors (not shown) may read chunks of data packets from volatile memory 1104 and write these to volatile memory 1106, as described previously. Storage controller 1108 may obtain chunks of data packets from volatile memory 1106 and write these to high speed storage 1110, also as described previously. These steps may be performed in hard real-time—i.e., with a deterministic amount of latency—so that no data packets are lost between network interface module 1102 and high speed storage 1110.

Once chunks of data packets are committed to high speed storage 1110, another set of one or more processes (or threads) may be operational to transfer these chunks to low speed storage 1114. Advantageously, this transfer need not be in hard real-time. Instead, it can be in soft real-time, where the transfer should happen with no more than a particular amount of latency, but some deviations due to jitter or other factors can be absorbed.

One possible way of distinguishing hard real-time from soft real-time is that hard real-time transactions must have no more than a predetermined latency, while soft real-time transactions have no more than a predetermined average latency. Thus, soft real-time transactions can exhibit some extent of jitter than is absorbed by the system. But other definitions may be possible.

The processes that carry out this transfer may be executed of one or more of the processors (e.g., processor 700, processor 704, and/or a dedicated processor not shown). For example, one variation of these embodiments may contain 32 processors, one to four of which are dedicated to soft real-time processing (e.g., transferring chunks from high speed storage 1110 to low speed storage 1114, as well as other packet formatting and analysis or general management tasks such as handling user interface input and output), while the remainder are dedicated to hard real-time processing (e.g., transferring data packets from network interface module 1102 to high speed storage 1110).

First, the processor reads a data chunk out of high speed storage 1110 into memory (e.g., 702, memory 706, or dedicated memory not shown). Recently-read chunks are stored in volatile memory cache 1111, which may be a 2 gigabyte, 4 gigabyte, or 8 gigabyte unit of RAM, for example. Advantageously, volatile memory cache 1111 reduces the reading load on high speed storage 1110, which can be a bottleneck if multiple processes or processors are attempting to perform soft real-time processing operations on the chunks stored therein.

A unique identifier of each chunk stored in volatile memory cache 1111 (e.g., a chunk index) may be maintained in a list or hash table along with a timestamp of when it was written to volatile memory cache 1111. Thus, the processor may first obtain a chunk index of a desired chunk, and check the list or hash table to determine whether the desired chunk is in volatile memory cache 1111. If so, the processor reads the desired chunk from volatile memory cache 1111. Otherwise, the processor reads the desired chunk from high speed storage 1110, and places a copy in volatile memory cache 1111. The processor may use any cache replacement algorithm, such as least recently used (LRU) or least frequently used (LFU) to determine which stored chunk to replace in volatile memory cache 1111. Then, the processor may update the list or hash table to remove the entry for the replaced chunk and to add the entry for the new chunk.

Step 1112 may involve performing data compression and error correction on the read chunk. The data compression may be high speed lossless compression, and thus may use the LZ4 algorithm, for example. The compression ratio for this step is not as important as compression speed, because of the soft real-time deadlines. Nonetheless, many applications that generate the captured data packets use uncompressed data and have a significant amount of internal redundancy, which lends itself to reasonable compression ratios nonetheless.

The chunks (which may be 256 kilobytes) are stored in blocks of 1 megabyte. Thus, compression may result in 4-8 compressed chunks in each block. In some embodiments, chunks may not cross storage block boundaries, so there may be some unused space per block.

Then, an error correction code (e.g., the chunk parity mechanism described above or some other code) may be calculated over one or more of these blocks. On the other hand, if low speed storage 1114 is a NAS or RAID device, it may handle error correction, and this step can be skipped.

Optionally, step 1112 may include data packet indexing and/or other metadata generation or analysis functions. The indexing may involve, for each data packet in the chunk, reading its metadata. The metadata may include any fields from layer 2, 3, or 4 headers, such as source and destination MAC addresses, source and destination IP addresses, the IP protocol field, as well as source and destination transport layer ports. In some cases, these fields may be extracted from further encapsulation, such as from the inner headers of generic routing encapsulation (GRE). The obtained metadata may be stored in various ways, such as a lookup table or a histogram, that can be later searched to find specific packets with matching metadata. Thus, the chunk's metadata may be stored separately in low speed storage 1114 from the chunk.

The histogram may involve, for example, a count of the number of times each unit of metadata appears in the chunk. Suppose that the IP address 192.168.0.10 appears 57 times in source IP address fields in the chunk and 53 times in destination IP addresses fields in the chunk. Then, the histogram may contain an entry for 192.168.0.10 indicating the number of times it appears as source and destination, respectively. These IP addresses can be arranged in order to facilitate rapid lookup based on a filter expression (alternatively, other data structures such as trees or hash tables may be used). Similar histogram data can be stored for MAC addresses and port numbers.

By storing this separate copy of the metadata, packet searching is much faster than if the chunk itself was searched (especially if the chunk was compressed). This for example, finding a data packet with a specific source IP address in a petabyte of captured data packets can be a lengthy process due to requiring a linear search. With the metadata, searching becomes orders of magnitude faster because the metadata can be rapidly scanned to determine whether the source IP address is present in a chunk.

Other soft real-time processing operations performed by one or more processors that read from high speed storage 1110 and/or volatile memory cache 1111 include (i) converting pluralities of the data packets stored in the chunks to a different format (e.g., a commercial format such as netflow), (ii) generating reverse domain name system entries based on the pluralities of the data packets stored in the chunks (e.g., from the IP addresses of the data packets), (iii) generating transport-layer security certificates based on the pluralities of the data packets stored in the chunks, (iv) indexing the pluralities of the data packets stored in the chunks, (v)

operating an intrusion detection system on the pluralities of the data packets stored in the chunks, or conducting financial market analysis based on the pluralities of the data packets stored in the chunks.

Notably, low speed storage 1114 may be local or remote from packet capture device 1100. Thus, interface 1116 may represent a dedicated link, a local area network, or a wide area network. Notably, physically separating packet capture device 1100 and low speed storage 1114 by a local area network or wide area network is not possible in previous systems because it introduces too much latency and jitter. But the present embodiments can absorb this latency and jitter due to high speed storage 1110 and the aforementioned parallelized storage process (simultaneously writing chunks to high speed storage 1110 and then moving blocks of these chunks to low speed storage 1114). Such separation is helpful when data packets need to be captured at a particular location, but rack space is not available near the capture device. Low speed storage 1114 can be placed at the secondary location. In this fashion, the system can be expanded continuously by adding more low speed storage as needed. The advantage of the NAS style is the storage nodes can be placed anywhere within the same or a different datacenter, as long as there is a reasonable fast (e.g., 40 gigabit per second) link to the capture device.

In order to retrieve data packets stored in this manner, chunk indexes may be stored in host operating system storage 404B. Each chunk index may contain a flag that indicates whether the associated chunk is stored in high speed storage 1110 or low speed storage 1114. Thus, if the chunk index indicates that the associated chunk is in high speed storage 1110, the retrieval process works as described above. Otherwise, the chunk is mapped to a storage block, retrieved and decompressed. As noted above, mapping a chunk to a storage block may involve searching through a set of histograms for each block or chunk, looking for a filter expression that matches one or more packets.

Figure 12:
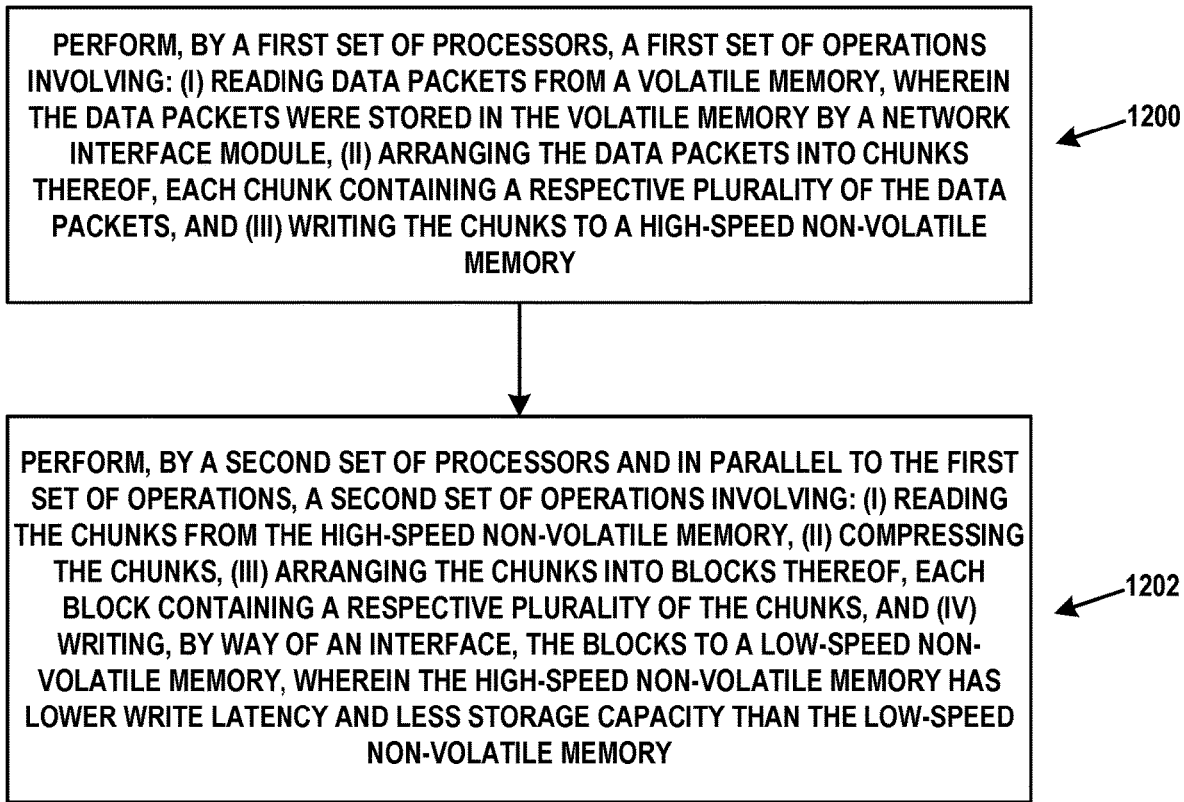
FIG. 12 is a flow chart, in accordance with example embodiments.

FIG. 12 is a flow chart illustrating an example embodiment. The process illustrated by FIG. 12 may be carried out by one or more processors and memories coupled to a network interface module and storage controller. The storage controller may, in turn, be coupled to high speed non-volatile memory. The network interface may receive data packets and arrange these packets into chunks.

Block 1200 may involve performing, by a first set of processors, a first set of operations involving: (i) reading data packets from a volatile memory, wherein the data packets were stored in the volatile memory by a network interface module, (ii) arranging the data packets into chunks thereof, each chunk containing a respective plurality of the data packets, and (iii) writing the chunks to a high speed non-volatile memory;

Block 1202 may involve performing, by a second set of processors and in parallel to the first set of operations, a second set of operations involving: (i) reading the chunks from the high speed non-volatile memory, (ii) compressing the chunks, (iii) arranging the chunks into blocks thereof, each block containing a respective plurality of the chunks, and (iv) writing, by way of an interface, the blocks to a low-speed non-volatile memory, wherein the high speed non-volatile memory has lower write latency and less storage capacity than the low-speed non-volatile memory.

In some embodiments, the interface connects the system to the low-speed non-volatile memory by way of a local-area network. In some embodiments, the interface connects the system to the low-speed non-volatile memory by way of a wide-area network.

In some embodiments, the second set of operations also involves adding error correcting codes to the chunks before writing the blocks to the low-speed non-volatile memory.

In some embodiments, the second set of operations also involves generating packet-identifying metadata for each of the data packets and storing the metadata separately from the blocks in the low-speed non-volatile memory. The metadata may include copies of fields from layer 2, layer 3, or layer 4 headers of the data packets. The metadata may be stored as a histogram of the fields from the layer 2, layer 3, or layer 4 headers of the data packets.

In some embodiments, the first set of operations is performed in hard real-time with latencies within a first threshold. Further, the second set of operations may be performed in soft real-time with average latency within a second threshold, wherein the second threshold is greater than the first threshold.

In some embodiments, the high speed non-volatile memory comprises an array of SSDs. In some embodiments, the low-speed non-volatile memory comprises an array of HDDs.

In some embodiments, non-volatile memory (e.g., an operating system's file system) stores indications of whether each of the chunks is stored in the high speed non-volatile memory or the low-speed non-volatile memory. The first set of operations may also involve setting the indications to specify the high speed non-volatile memory for chunks written to the high speed non-volatile memory. The second set of operations may also involve setting the indications to specify the low-speed non-volatile memory for chunks that are contained within blocks written to the low-speed non-volatile memory. A third set of operations may also involve setting the chunk indexes in a list or table to specify whether a chunk is in a volatile memory cache.

In some embodiments, a volatile memory cache is configured to store copies of the chunks from the high speed non-volatile memory that were recently read by the second set of processors. Reading the chunks from the high speed non-volatile memory comprises: reading a first subset of the chunks from the volatile memory cache when the volatile memory cache contains the first subset of the chunks; and reading a second subset of the chunks directly from the high speed non-volatile memory when the volatile memory cache does not contain the second subset of the chunks.

In some embodiments, the second set of operations also involve one or more of: (i) converting pluralities of the data packets stored in the chunks to a different format, (ii) generating reverse domain name system entries based on the pluralities of the data packets stored in the chunks, (iii) generating transport-layer security certificates based on the pluralities of the data packets stored in the chunks, (iv) indexing the pluralities of the data packets stored in the chunks, (v) operating an intrusion detection system on the pluralities of the data packets stored in the chunks, or (vi) conducting network protocol analysis based on the pluralities of the data packets stored in the chunks.

V. FLOW PROCESSING ARCHITECTURE

As noted above, modern packet data capture systems cannot maintain full capture capabilities on today's high speed networks (e.g., 10 gigabits per second, 40 gigabits per second, or 100 gigabits per second Ethernet). Software-based systems are slow and will drop captured packets before recording them due to buffer overflow. Hardware-based systems that are not specifically designed for or dedicated to data packet capture (e.g., switches and routers)

have adopted schemes where they capture a sample of data packets rather than all data packets. As a result, neither of these types of systems are able to reliably capture all data packets on a high speed segment or even in a single high speed flow. This makes system debugging and verification much more difficult, as it is challenging (or impossible) to obtain complete understanding of the traffic flowing on a network segment or between specific devices.

The embodiments herein overcome these deficiencies by using an arrangement of the high speed data packet storage system discussed above in the context of FIGS. 11 and 12 to facilitate real-time filtering and processing of data packet flows. Particularly, configurable sets of processing elements and associated units of memory may be assigned to one or more particular applications that process some or all captured packets (e.g., in PCAP format) into an intermediate format. But the embodiments herein are not limited to these applications and others may be possible. Further any number of these applications may be executed in parallel by allocating processing and storage resources of the packet capture device (e.g., computing device 400 perhaps arranged as packet capture device 1100) accordingly.

For all applications, captured data packets may be stored. Stored data packets may be represented in an intermediate format such as the eXtensible Markup Language (XML), JavaScript Object Notation (JSON), comma separated values (CSV), or some other textual or binary structured format. In some embodiments, any reasonable human-readable text-based format may be used so that the format can be viewed and easily understood by users. In other embodiments, a binary format may be used to reduce the storage requirements of the overall system.

A further "application" (processing) may organize and write the intermediate format representation of data packets and flows thereof to one or more database(s). The database(s) may be either embedded within or separate from the packet capture device. While the database(s) could be relational, using tables and queries based on the structured query language (SQL), it may be beneficial to use non-relational (e.g., NoSQL) database(s). For example, the intermediate format of sets of data packets can be stored directly in one or more NoSQL database(s) (e.g., ElasticStack, MONGODB®, or SPLUNK®) as a time series and/or in the form of one or more files, and then indexed for efficient search. Further, once the representations of captured data packets are stored in the database(s) and indexed, custom tools and/or web-based interfaces can be used to facilitate search and visualization of these representations.

While this processing module that interfaces with the databases may be referred to and implemented as an "application", it is different in nature than the other applications described above. Notably, the former applications convert and/or decode captured data packets into the intermediate format. In contrast, the processing module receives streams in the intermediate format, and combines, filters, and/or merges these streams into data packet representations ready for storage in the database(s).

Figure 13A:
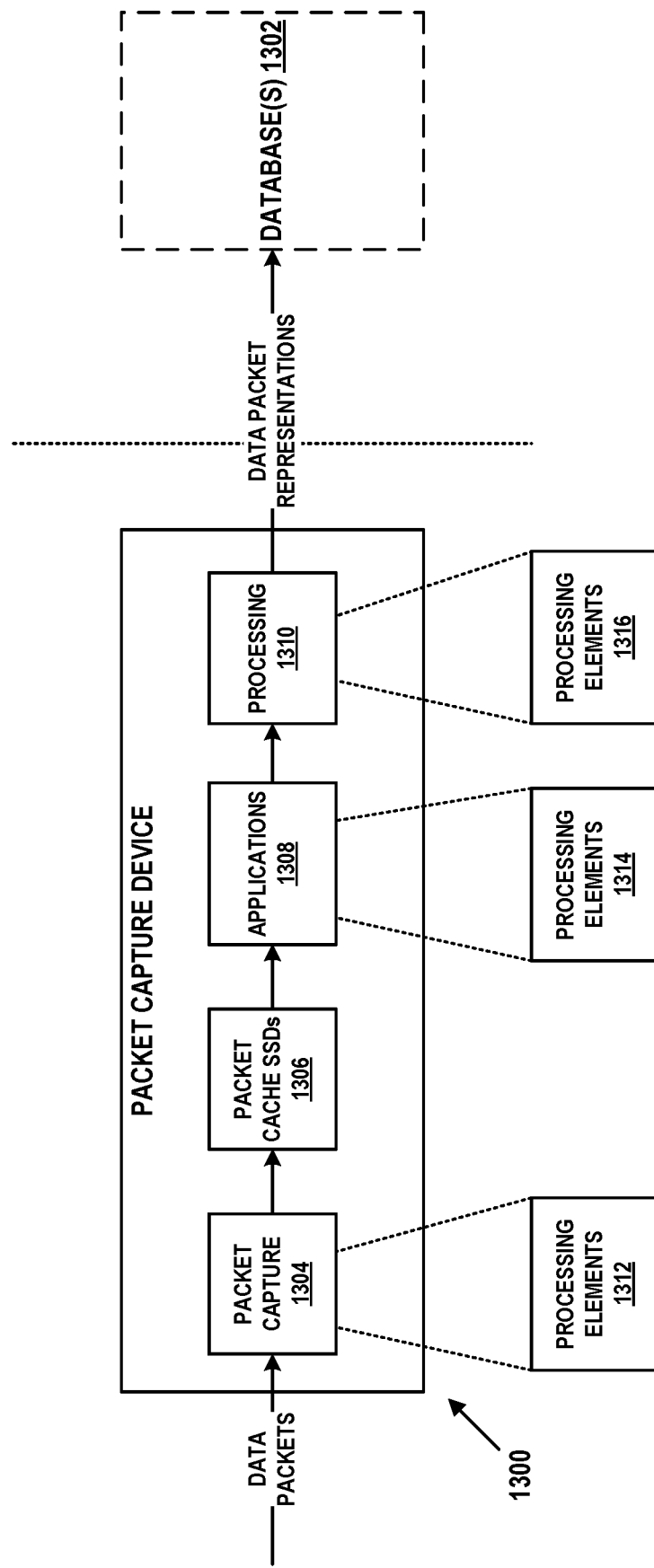
FIG. 13A depicts a packet capture device arranged for flow processing, in accordance with example embodiments.

A high-level overview of this flow processing configuration is shown in FIG. 13A. Therein, packet capture device 1300 represents and may be arranged similarly to packet capture device 1100—thus, packet capture device 1300 is a possible arrangement of computing device 400. Therefore, packet capture device may include a number of processors (e.g., dozens or more) that can be assigned to various tasks. Notably, packet capture device 1300 receives data packets (e.g., by way of one or more high speed Ethernet segments), processes at least some of these data packets into representations in the intermediate format, and then provides the representations to database(s) 1302. As noted above, database(s) 1302 may be NoSQL database(s) or another type of non-relational database(s).

These database(s) may be a cluster of database servers scaled to be able to successfully receive the information in the intermediate format coming from processing 1310. Since processing 1310 may produce the information at high speed, individual databases may not be able to keep up with this offered load.

The vertical dotted line is a demarcation point between packet capture device 1300 and database(s) 1302. Thus, packet capture device 1300 and database(s) 1302 may be physically distinct devices connected over a network. Alternatively, database(s) 1302 may reside on packet capture device 1300.

Packet capture module 1304 represents components including network interface module 1102, volatile memory 1104, volatile memory 1106, storage controller 1108, and one or more processors used to move captured data packets between these components. Particularly, interface module 1102 may be FPGA-based network interface 406, volatile memory 1104 may be temporary packet storage memory 408, volatile memory 1106 may be memory 702 or 706, and storage controller 1108 may be storage controller 708. But other options are possible.

Notably, an array of one or more processing elements (e.g., instances of host processors and dedicated system memory 402) may be used to read chunks of data packets from packet capture module 1304 and write these chunks to packet cache SSDs 1306. These processing elements are represented by the callout of processing elements 1312. Notably processing elements 1312 receive, into a first memory unit, a chunk of data packets. A first processor of processing elements 1312 reads the chunk from the first memory unit and writes the chunk to a second memory unit. A second processor of processing elements 1312 reads the chunk from the second memory unit and writes the chunk to an SSD of packet cache SSDs 1306.

Alternatively, and as discussed in the context of FIG. 11, network interface module 1102 receives data packets from one or more network interfaces, and provides these data packets to volatile memory 1104 for temporary storage and buffering. The processor(s) read chunks of data packets from volatile memory 1104 and write these to volatile memory 1106. Storage controller 1108 may obtain chunks of data packets from volatile memory 1106 and write these to packet cache SSDs 1306. As noted above, this arrangement serves to absorb jitter so that packet storage can occur at high speeds.

Packet cache SSDs 1306 may be high speed storage 1110, which in turn may be based on long-term packet storage 404A. As noted above, high speed storage 1110 may include an array of low-latency SSDs. Using SSDs rather than HDDs dramatically improves performance because HDD seek times make simultaneous writing to and reading from HDDs prohibitively slow. SSDs do not suffer from this latency. Thus, packet cache SSDs 1306 absorbs jitter of the incoming data packets so that the applications can operate in a lossless fashion.

Applications 1308 may include one or more of the applications mentioned above and described in more detail below. One or more processing elements (as embodied by host processors and dedicated system memory 402) may be dedicated to executing each of these applications. These processing elements are represented by the callout of processing elements 1314. Thus, processing elements 1314 can be assigned to applications in a flexible fashion in order to load balance and improve throughput. In some cases, applications 1308 may represent several applications operating in parallel and/or serially.

One or more processing clusters may also be dedicated to processing 1310. These operations may involve receiving representations of captured data packets from applications 1308, arranging these into text files (e.g., XML, JSON, or CSV) or binary format, and then storing the files in database(s) 1302. Thus, processing 1310 may include a database client module specifically configured to interface (e.g., push data) to database(s) 1302. But other types of processing are possible. These processing elements are represented by the callout of processing elements 1316. Thus, processing elements 1316 can also be assigned to aspects of processing 1310 in a flexible fashion in order to load balance and improve throughput.

In some embodiments, at least some of the operations discussed in the context of applications 1308 and processing 1310 may be carried out by custom FPGAs or GPUs. Using these FPGAs or GPUs may serve to further speed processing-intensive applications.

Figure 13B:
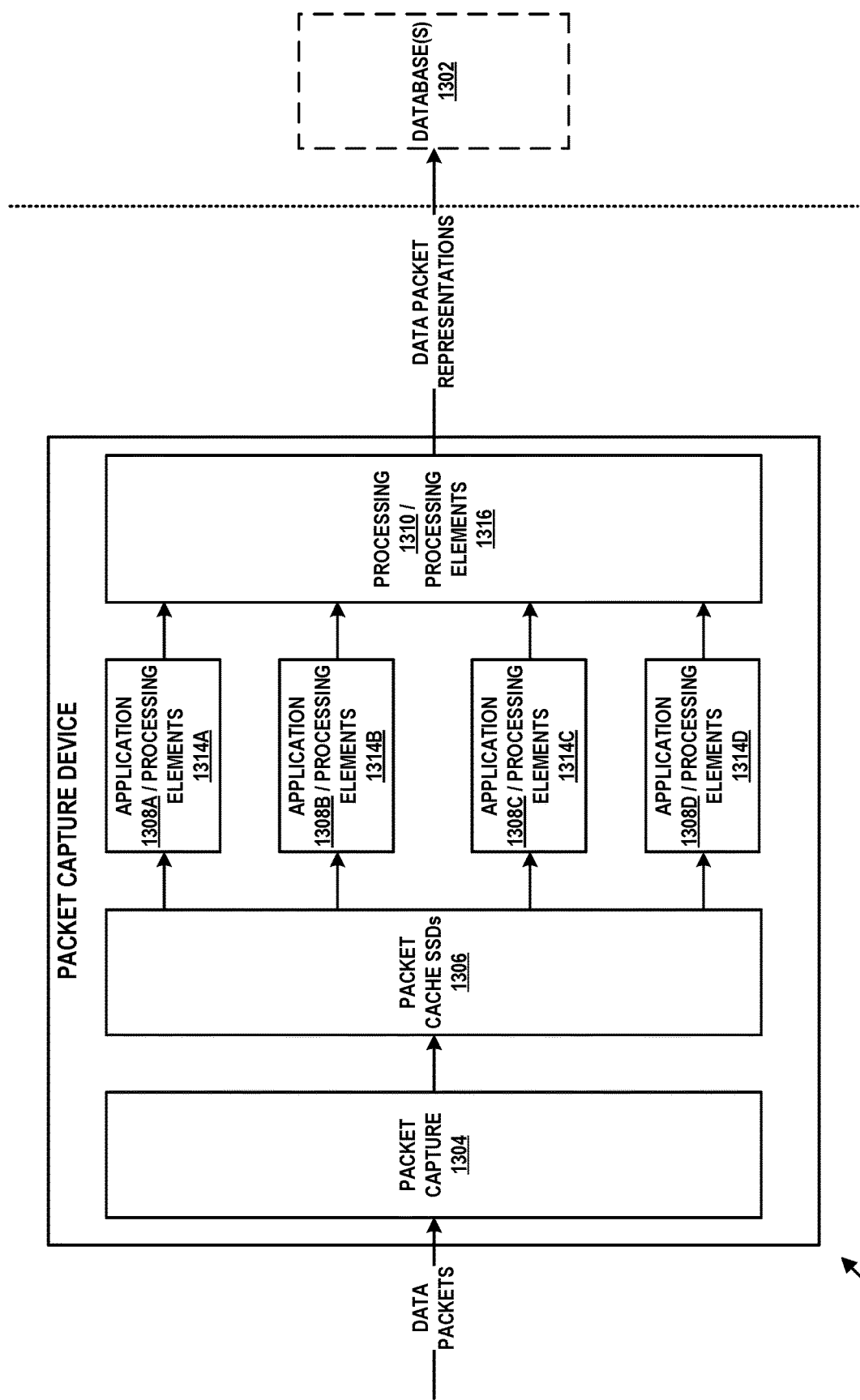
FIG. 13B depicts a more detailed schematic of the packet capture device arranged for flow processing, in accordance with example embodiments.

A more detailed overview is shown in FIG. 13B. Particularly, applications 1308 are broken out into instances (applications 1308A, 1308B, 1308C, and 1308D) that each execute on one or more dedicated processing elements (1314A, 1314B, 1314C, and 1314D, respectively). In some cases, multiple instances of an application can be assigned to different processing elements. Thus, for example, application 1308C and 1308D may be instances of the same application executing on processing elements 1314C and 1314D. Similarly, one processing element could be used to execute multiple applications. This mapping of instances of applications to processing elements allows flexible scaling of applications to the needs of the user. For instance, compute-intensive applications can be scaled up to use multiple processing elements as warranted. While four instances of applications mapped to processing elements are shown in FIG. 13B, this number could scale up or down based on configuration or demand.

Processing 1310 may also be assigned to dedicated processing elements, in this case processing elements 1316. Thus, processing 1310 can also scale independently of the applications. Processing 1310 may also be referred to as a "processing application," but should not be confused with applications 1308A, 1308B, 1308C, and 1308D.

In some cases, applications 1308A, 1308B, 1308C, and 1308D may each represent multiple serialized applications per block—that is, without loss of generality, application 1308A may represent a filtering application followed by a protocol decoding application. In turn, processing elements 1314A may have individual units that are dedicated to each of the filtering application and the protocol decoding application.

Notably, each of the processing elements may operate simultaneously, in parallel, and on the same set of captured data packets. Thus, when an array of processing elements reads a captured data packet (or chunk thereof) from packet cache SSDs 1306, it may do so without removing the data packet (or chunk) from packet cache SSDs 1306. In other cases, it will consume the data packet (or chunk) and remove it from packet cache SSDs 1306.

Figure 13C:
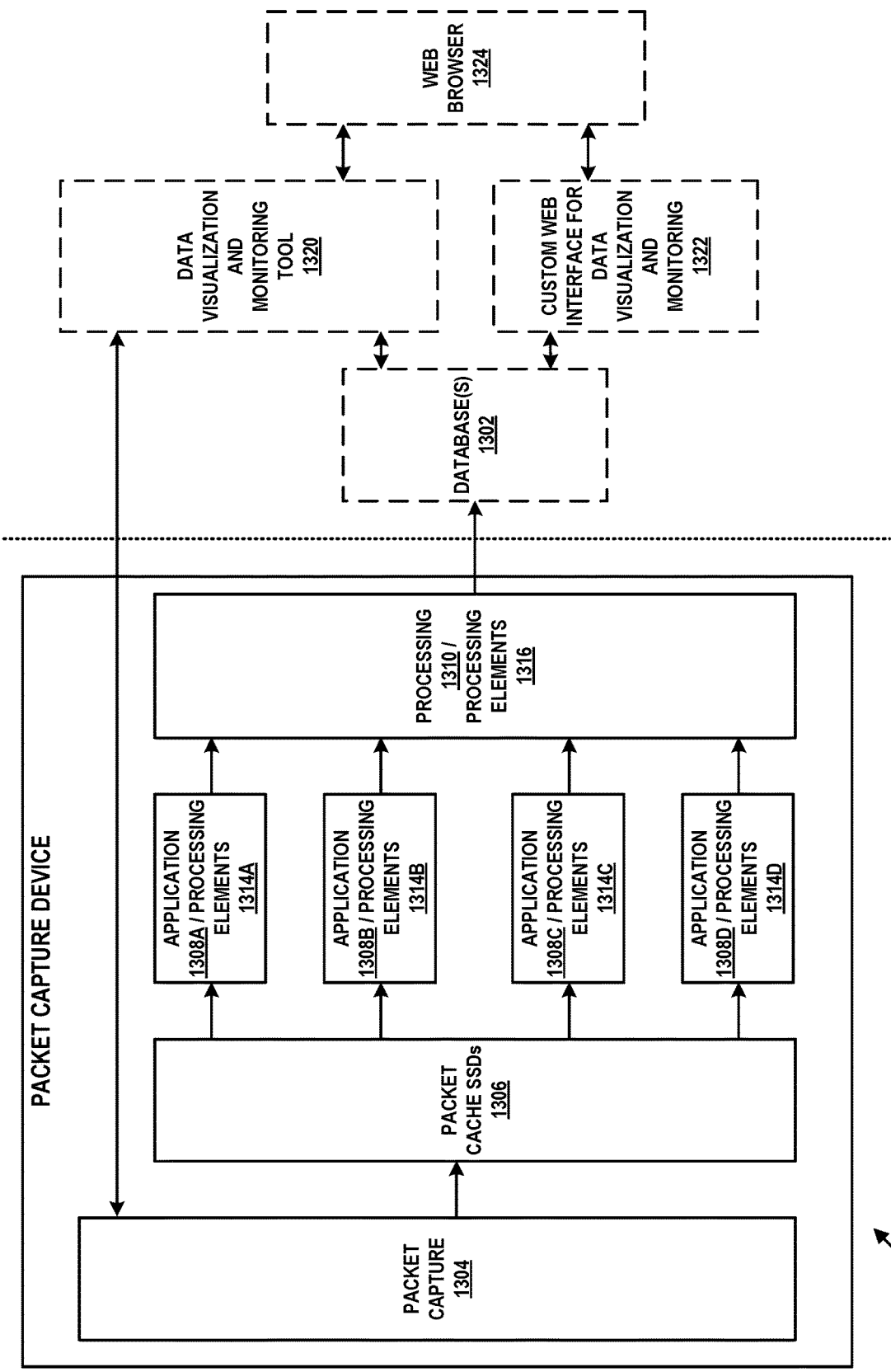
FIG. 13C depicts a more detailed schematic of the packet capture device arranged for flow processing, in accordance with example embodiments.

FIG. 13C illustrates packet capture device 1300 and database(s) 1302 within the context of a bigger system. This system includes data visualization and monitoring tool 1320 (tool 1320), custom web interface for data visualization and monitoring 1322 (web interface 1322), and web browser 1324.

Tool 1320 may be an analytics and interactive visualization such that creates dashboards with charts or graphs of various types. Examples include GRAFANA®, KIBANA®, and DATADOG®. Tool 1320 may query and receive, from database(s) 1302, data packet representations in the intermediate format or formatted otherwise, and then display charts and/or graphs of these representations viewable on web browser 1324. These charts and graphs may be interactive, allowing the user to filter and drill down on data of interest. Further, as shown in FIG. 13C, tool 1320 may be able to remotely activate (start), deactivate (stop), and/or otherwise control packet capture 1304.

Web interface 1322 may provide similar information perhaps in a more limited fashion. Further, web interface may be built into or integrated with database(s) 1302. Thus, reactive to requests from web browser 1324, web interface 1322 may display static or interactive charts and/or graphs of the data packet representations. In some embodiments, only one or the other of tool 1320 and web interface 1322 might be present.

The following sections describe the applications in detail along with alternative arrangements of the hardware.

VI. HIGH SPEED NETWORK FLOW GENERATION

A network flow is a series of data packets that contain the same identifying protocol fields. A common way of identifying a flow is through the 5-tuple of source IP address, destination IP address, and protocol fields of an IP header, as well as the source port number and destination port number of a TCP or UDP header. But more, fewer, or different identifying protocol fields or other metadata may be used to identify flows. For example, some embodiments herein may use one or more of a source Ethernet address, destination Ethernet address, one or more VLAN tags, an Ethernet protocol type of an Ethernet header, one or more multiprotocol label switching (MPLS) tags or traffic class fields from an MPLS header, the result of an hash function (e.g., SHA1) calculated on all metadata as described above for each data packet, or the physical port through which the packet was captured. Other ways of identifying flows are possible. Notably, the term "flow" used in this section should not be confused with the use of the same term above to refer to the direction in which packets are processed in the system.

Regardless, the data packets that make up a flow are generally between two particular devices in a network, and usually represent part or all of a discrete transaction. These transactions may include web page requests, web page downloads, music or video streams, email deliveries, and so on. Being able to identify network flows can be important—or at least helpful —in network troubleshooting, debugging, and transaction verification. Some flows are as few as two data packets, while others can be hundreds of thousands of data packets or more. For these purposes, the content of the flow is often not as important as the fact that the flow took place, when the flow took place, the total number of data packets, and/or the total number of bytes in the flow. Thus, flows may be represented with their identifying protocol fields, metadata regarding the time the flow began or ended, the number of data packets in the flow, the number of bytes in the flow, and/or various other content or information regarding the flow. As this information may be parsed out of PCAP representations of data packets.

Figure 14A:
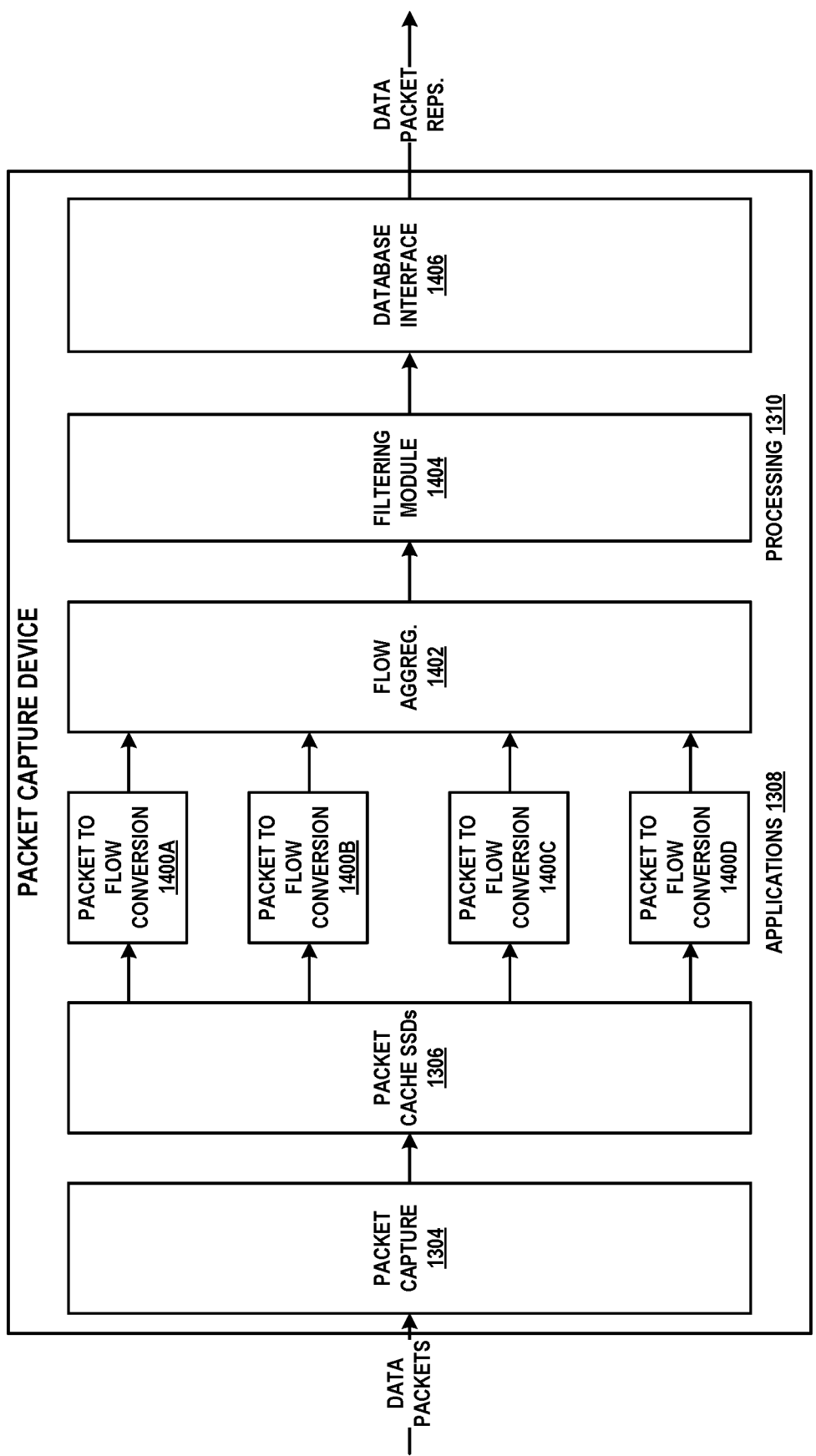
FIG. 14A depicts a further schematic of the packet capture device arranged for flow processing, in accordance with example embodiments.

FIG. 14A depicts an arrangement of packet capture device 1300 for high speed flow identification. Particularly, FIG. 14A shows applications 1308 including four independent packet to flow conversion applications 1400A, 1400B, 1400C, and 1400D executing in parallel. Further, processing 1310 has been divided into flow aggregator 1402, filtering module 1404, and database interface 1406. The four conversion applications 1400A, 1400B, 1400C, and 1400D for purposes of example, and more or fewer of these applications may be present.

This architecture allows for flexible and arbitrary load balancing across conversion applications 1400A, 1400B, 1400C, and 1400D. As noted above, chunks of data packets can be written to packet cache SSDs 1306 in an arbitrary fashion. Thus, data packets from individual flows may be in different chunks and therefore may be stored in different SSDs of packet cache SSDs 1306. In order to properly characterize the flows of which these data packets are members, there needs to be a way to merge flow information that spans multiple chunks across these SSDs.

To do this, each instance of the packet to flow conversion application operates independently on chunks. Particularly, an instance of this application receives a chunk from packet cache SSDs and identifies the packets therein (recall that packets do not span chunks, so this identifying can be on a chunk-by-chunk basis). For each of the packets, its flow is identified and statistics regarding the flow are incremented. These statistics may be counts of data packets, bytes, TCP flags that are set, or other data. Once statistics are recorded, the associated packet is discarded. In some cases, the data packets are truncated so that only their first 64-96 bytes are considered, as these bytes typically contain all of the relevant flow information. Doing so reduces storage requirements.

Each instance of the application may have its own timer that may be set to fire once every t seconds. The value of t may be anywhere from 0.1 to 10, for example, with some embodiments using a value of 1 second. When the timer fires, the instance of the application provides its current gathered statistics to flow aggregator 1402.

Converting the data packets into these flow-based statistical representations may result in a reduction in size of approximately 10-fold. Thus, if data packets are arriving at conversion applications 1400A, 1400B, 1400C, and 1400D at a rate of 50 gigabits per second, the gathered statistics provided to flow aggregator 1402 may be at a total rate of approximately 5 gigabits per second. As a consequence, fewer processing and memory resources are required downstream of conversion applications 1400A, 1400B, 1400C, and 1400D.

Further, each processing element (e.g., host processors and dedicated system memory 402) may be capable of identifying flows at about 10 gigabits per second of throughput. Therefore, without the load balancing across processing elements in a fashion similar to these embodiments (e.g., if too much load is introduced to any one particular processing element due to a single network flow), the overall throughput of the system may be limited to less than its actual total capacity.

FIG. 14B provides an example representations of a flow. Representation 1410 may be generated from a flow of UDP packets between a host with the source IP address of 192.168.0.14 and a destination host with an IP address of 192.168.0.30. The source UDP port is 10662 and the destination UDP port is 5004. Representation 1410 also contains metadata indicating a timestamp of the most recently captured data packet in the flow, a unique flow identifier (FlowCnt), a device on which the data packets were captured, the total number of data packets captured in the flow, the total number of bytes in the flow, and the total number of bits in the flow. Representation 1410 also contains information identifying any VLAN tags, MPLS tags, and counts of TCP parameters (all null in this case) in the flow.

Further, representation 1410 includes a hash value that may be calculated over some or all of the other values shown in representation 1410. For example, the hash value may be calculated over the Ethernet addresses, VLAN tags, MPLS tags, IP address, IP protocol field, and TCP/UDP port numbers. This hash value provides a simple way of determining the flow to which any data packet belongs, and also facilitates storing the flow information in a hash table or similar data structure. For instance, a data packet may be identified within a chunk, and the hash value calculated over at least some of the relevant values shown in representation 1410. If the identified flow is already present as an entry in the hash table, statistics from the data packet may be added to the flow's entry. If the flow is not already present in the hash table, the flow may be added as a new entry to the hash table.

As shown in FIG. 14B, representation 1410 may be an entry in the hash table for an associated flow. Notable, the hash is "f12f2b43d6b775da29216a33c43327a20c644a8c" for the flow, and 1,393,327 data packets of the flow (TotalPkt) have been captured. These data packets contained 1,914,431,298 bytes (TotalByte), and thus 15,315,450,384 bits (Totalbits). Representation 1412 depicts the contents of the entry when a further 1000-byte data packet of the flow is added to it. While the hash value stays the same, the total number of data packets in the flow increases by 1, the total bytes increases by 1000, and the total bits increases by 8000. All other fields remain the same, aside from the timestamp field which is updated to indicate the capture time of the new packet.

Representations 1410 and 1412 are shown formatted in JSON. JSON is a convenient intermediate format for flow representations because it is hierarchical and structured, text-based, human-readable, and highly-compressible. However, other formats, such as XML or CSV may be used. Some embodiments may benefit from more compact binary intermediate formats. Thus, various intermediate formats exist.

Turning back to FIG. 14A, the conversion of data packets to flow representations takes place in parallel across a number of processing elements executing conversion applications 1400A, 1400B, 1400C, and 1400D. As noted above, every t seconds, each of conversion applications 1400A, 1400B, 1400C, and 1400D may flush these flow representations to flow aggregator 1402 (since conversion applications 1400A, 1400B, 1400C, and 1400D operate asynchronously from one another, flow aggregator 1402 might not receive the representations from the conversion applications at the same time).

Flow aggregator 1402 may merge the representations of the same flow from different conversion applications into a common representation for a single time period of t seconds (see above). For instance, if both conversion applications 1400A and 1400B processed data packets from a particular flow into separate flow representations, flow aggregator may receive these representations and combine them. This may involve determining that hashes of both flow representations have the same has value, then summing certain values in the representations of these flows, such as the total packets, total bytes, total bits, counts of TCP flags, and so on. Once all flows that can be merged are merged, flow aggregator provides the representations of the merged flows to filtering module 1404.

Because each flow is calculated for a time period of t seconds, a single flow represents all data in a fixed time period. For example, suppose there is 1 megabit of data transferred for a single flow entry, a time period of t seconds. The bandwidth for this flow is 1 megabit/t seconds. If t is 1 second, it is 1 megabit/second. Latency approximations are calculated by looking at timestamps of TCP segment sequence numbers and their corresponding TCP acknowledgement numbers. If a TCP segment with sequence number 100 was observed at time T0 and a corresponding TCP acknowledgement numbers of 100 is observed at time T1, an approximation of the latency of the flow is T1−T0 seconds. As TCP segments and corresponding acknowledgements can have many sample points in a flow, this technique can be used for multiple such segments and acknowledgments to approximate the latency of the flow. Other possibilities involve estimating the latency based on similarly calculated differences between corresponding TCP SYN and TCP ACK packets using TCP session initiation. Filtering module 1404 can be configured to apply various types of filters to the merged flow in order to further reduce the amount of data that is to be stored in the database. In some embodiments, packet capture device 1300 may receive data packets from two million unique flows per second, which oversubscribes the processing capacity of a database cluster. Thus, it is advantageous to reduce the amount of data to be stored in the database.

For example, filtering module 1404 may apply a whitelist to pass only flows with specified Ethernet addresses, IP addresses, and/or port numbers. Other flow parameters could be used for whitelisting. Flows not matching the whitelist are discarded. In another example, only the top m flows (e.g., in terms of data packet count or byte count) are stored in the database, and all other flows are discarded.

Database interface 1406 may receive the filtered flow representations and store them across a database. As noted above, the database may be a cluster of database servers executing on multiple computing devices. Database interface 1406 balances the data to be stored across these computing devices. In some cases, the format of the flow representations stored to the database may be binary rather than textual.

FIG. 14C is a flow chart illustrating an example embodiment. The process illustrated by FIG. 14C may be carried out by one or more processors and memories of a packet capture device, for example.

Block 1420 may involve performing, by a first array of processing elements and in an independent and asynchronous fashion, a first set of operations that involve: (i) reading a chunk of data packets from a non-volatile memory, wherein the data packets were received by way of a network interface module in a binary format, and wherein the non-volatile memory is configured to temporarily store the data packets, (ii) identifying flows of data packets within the chunk, and (iii) generating flow representations for the flows, wherein the flow representations are in an intermediate format that aggregates header information and metadata associated with the data packets respectively corresponding to the flows.

Block 1422 may involve performing, by a second array of processing elements, a second set of operations, wherein the second set of operations involve: (i) receiving the flow representations from the first array of processing elements, (ii) identifying and aggregating common flows across the flow representations into an aggregated flow representation, (iii) based on a filter specification, removing one or more of the flows from the aggregated flow representation, and (iv) writing, by way of an interface, information from the aggregated flow representation to a database.

The arrays of processing elements may include groups of processing elements that independently and asynchronously perform the first set of operations on multiple chunks in parallel, with each chunk being performed upon by a different group. Further, the second set of operations may occur at least partially in parallel to the first set of operations.

In some embodiments, identifying the flows comprises: (i) identifying, as the flows, respective subsets of data packets within the chunk that have particular combinations of header field values; and (ii) representing each of the flows as an entry in the intermediate format.

In some embodiments, the header information is from one or more of data link layer, network layer, and transport layer fields. The header information may include data link addresses, network addresses, or transport layer port numbers. The header may also be encapsulated by another protocol such as GRE.

In some embodiments, the metadata associated with the data packets include one or more of a count of the data packets or a count of bytes in the data packets, a device identifier, or a physical port through which the data packets.

In some embodiments, aggregating the common flows across the flow representations into the aggregated flow representation comprises summing respective packet counts or byte counts from the common flows in the aggregated flow representation.

In some embodiments, identifying flows of data packets within the chunk comprises calculating, based on header field values of the data packets within the chunk, respective hash values, wherein the hash values uniquely denote respective flows to which the data packets belong.

In some embodiments, a further array of processing elements reads data packets from the network interface module in hard real-time with latencies within a first threshold.

In some embodiments, the first set of operations and the second set of operations are performed in soft real-time with average latency within a second threshold, wherein the second threshold is greater than the first threshold.

In some embodiments, the non-volatile memory comprises an array of SSDs.

In some embodiments, the database is external to a device containing the first array of processing elements and the second array of processing elements. In some embodiments, the database is a non-relational database.

In some embodiments, the intermediate format is one of JSON, XML, or a second binary format.

In some embodiments, different processing elements perform operations each of: identifying and aggregating common flows, removing the one or more of the flows from the aggregated flow representation, and writing the information from the aggregated flow representation to the database.

In some embodiments, the filter specification passes the flows that match a whitelist or the filter specification passes the flows that are in a set of top m flows in terms of number of data packets or number of bytes, wherein m is between 1 and 10,000. For example, m may be 2, 5, 10, 100, etc.

In some embodiments, the network interface module is configured to: (i) receive n packets; (ii) capture 1 of the n packets; and (iii) transmit n−1 of the n packets to a subsequent packet capture system that is arranged in series with the system (see below for details).

Some embodiments may involve a further array of processing elements configured to provide a virtual machine, wherein a packet processing application is executable on the virtual machine, and wherein a zero copy forwarding buffer allows the packet processing application to read data packets from the non-volatile memory (see below for details).

VII. HIGH SPEED PROTOCOL DECODING AND CORRELATION

Figure 15A:
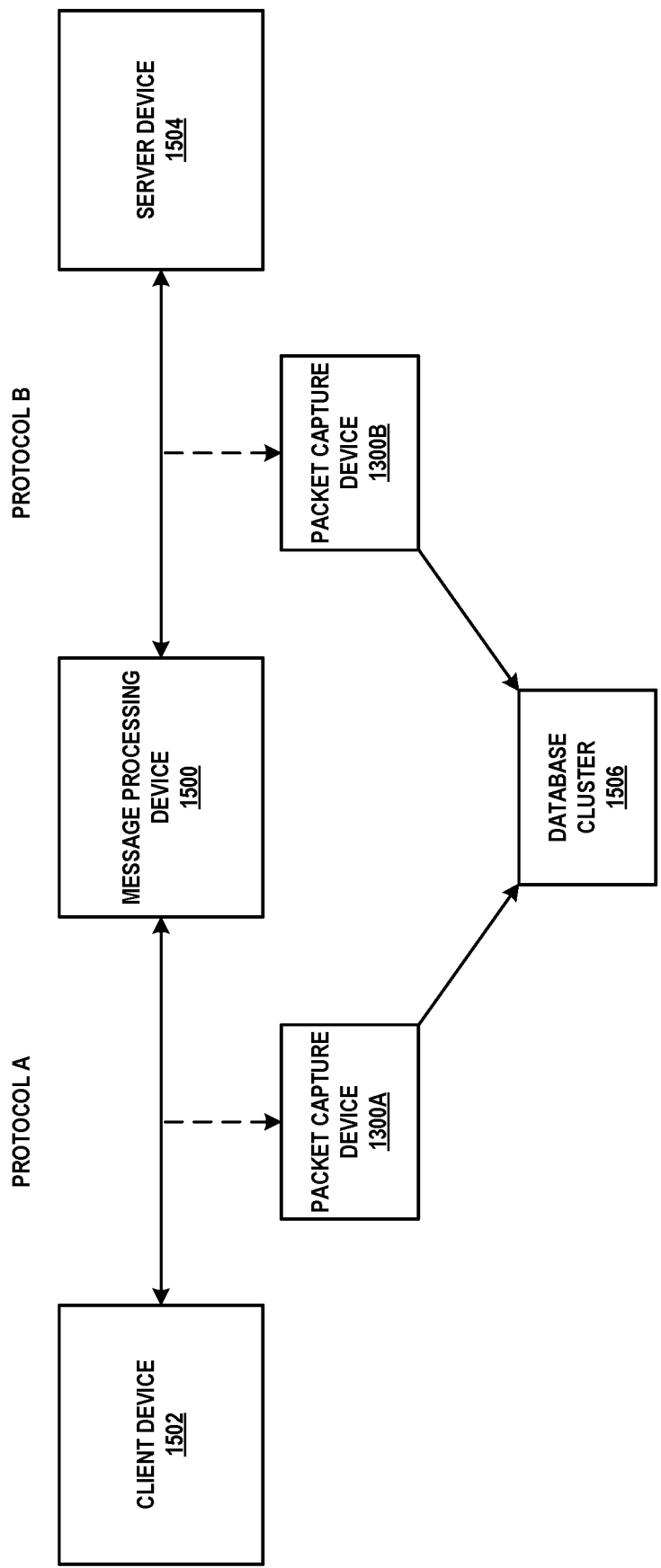
FIG. 15A depicts a network architecture, in accordance with example embodiments.

Another possible embodiment of packet capture device 1300 involves high speed protocol decoding, verification, and debugging. FIG. 15A depicts a possible environment for such embodiments, though other environments exist.

In the environment, message processing device 1500 is disposed between client device 1502 and server device 1504. In other words, there is at least one network segment connecting client device 1502 to message processing device 1500, and at least one network segment connecting message processing device 1500 to server device 1504. Thus, message processing device 1500 may have multiple network interfaces, one on the segment connecting it to client device 1502 and another on the segment connecting it to server device 1504. Message processing device may be a proxy server, for example, or any other intermediate device.

Client device 1502 may or may not communicate directly with server device 1504. For instance, client device may communicate with message processing device 1500 using protocol A, message processing device 1500 translates between protocol A and protocol B, and message processing device 1500 communicates on behalf of client device 1502 with server device 1504 using protocol B. In other embodiments, message processing device 1500 might not exist between a client device and a server device. In such cases, only packet capture device 1300A may be deployed. Protocol decoding and correlation is between traffic from client device 1502 to server device 1504, and from server device 1504 to client device 1502—for example correlating a request message to a response message.

As a concrete example, client device 1502 may transmit a first packet in accordance with protocol A to message processing device 1500. Message processing device 1500 may translate the content of this packet to conform to protocol B, and transmit a second packet in accordance with protocol B to server device 1504. Server device 1504 may respond by transmitting a third packet in accordance with protocol B to message processing device 1500. Message processing device 1500 may translate the content of this packet to conform to protocol A, and transmit a fourth packet in accordance with protocol A to client device 1502. In other embodiments, the same protocol (e.g., protocol A) may be used on both sides of message processing device 1500, thus message processing device 1500 may be performing protocol forwarding rather than translation.

In these message processing environments, there are at least three main goals that can be achieved by introducing packet capture device 1300—troubleshooting (e.g., determining why some transactions fail), transaction verification (is message processing device 1500 properly translating between protocols A and B), and determining performance metrics (how much latency is being introduced by each of message processing device 1500 and server device 1504). These goals are addressed by placing packet capture device 1300A on a network segment between client device 1502 and message processing device 1500, and placing packet capture device 1300B on a network segment between message processing device 1500 and server device 1504. In this arrangement, packet capture device 1300A and packet capture device 1300B can passively receive and process all data packets traversing these respective segments. In some cases, packet capture device 1300A and packet capture device 1300B may receive data packets from multiple such pairs of network segments involving multiple message processing devices and more than two protocols.

In these embodiments, packet capture device 1300A and packet capture device 1300B are configured to decode specific protocols (e.g., protocols A and B, respectively) and provide representations thereof to database cluster 1506. At a later point in time, the visualization tools discussed in the context of FIG. 13C can be used to view the transactions.

Notably, these embodiments make use of a slightly different arrangement of packet capture device 1300. This arrangement is depicted in FIG. 15B.

Figure 15B:
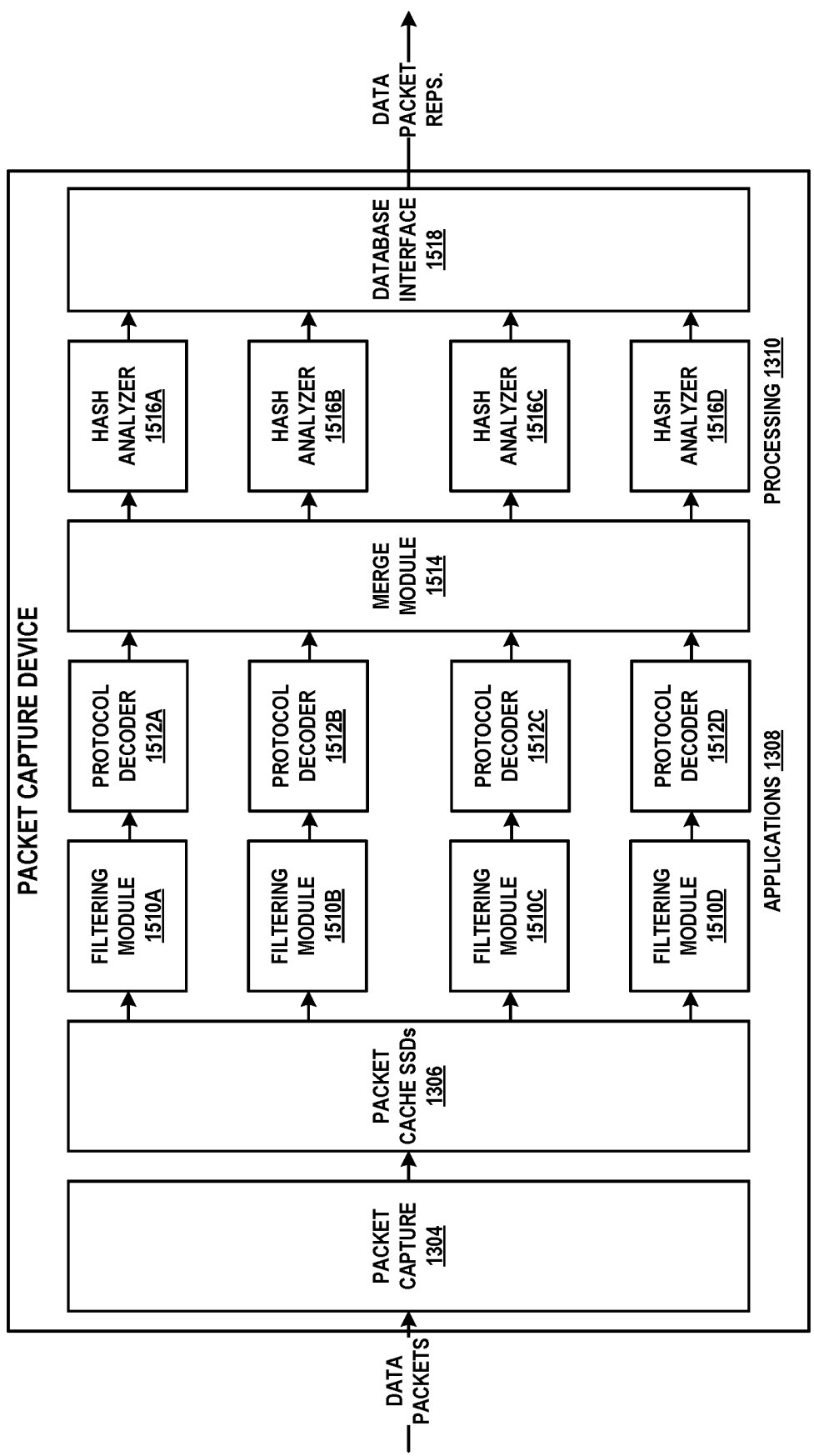
FIG. 15B depicts a packet capture device arranged for packet decoding, in accordance with example embodiments.

As shown in FIG. 15B, packet capture device 1300 still contains packet capture module 1304 and packet cache SSDs 1306. Four independent filtering modules 1510A, 1510B, 1510C, and 1510D execute in parallel, reading chunks of data packets from packet cache SSDs 1306 and applying filters to the data packets therein. Each of these filtering modules may execute on a dedicated set of one or more processing elements. The number of filtering modules may be arranged so that load can be balanced across the filtering modules without overwhelming the processing or memory capacity of any one.

Filtering modules 1510A, 1510B, 1510C, and 1510D may apply various types of whitelists, blacklists, or access control lists to any one or more protocol fields within the captured data packets. For example, a white list may be arranged to pass only packets with a particular source IP address and destination port number. Other filter specifications are possible. A possible goal of this filtering is to reduce the volume of data packets to be processed by downstream modules, as well as to pass only data packets of specific protocols of interest that packet capture device 1300 is configured to decode (e.g., protocols A and B above).

In some embodiments, the Berkeley Packet Filter (BPF) syntax may be used to define the filters. This syntax involves various types of primitives represented as a name or a number that identifies fields in a network protocol header or a payload. Each primitive may be preceded by one or more qualifiers. Multiple primitives and their associated qualifiers may be combined using Boolean logic.

The following filter expression examples further illustrate how primitives and qualifiers can work together. The BPF string "dst host 192.168.0.1" defines a filter that matches all packets with a destination host that has an IP address of 192.168.0.1. The BPF string "ether host 86:0b:00:12:23:34" defines a filter that matches all packets transmitted from or to a host with an Ethernet address of 86:0b:00:12:23:34. The BPF string "src port 80" defines a filter that matches all packets transmitted from a source port of 80. As noted, Boolean combinations of these are possible. Thus, the BPF string "dst host 192.168.0.1 or src port 80" defines a filter that matches all packets (i) with a destination host that has an IP address of 192.168.0.1, or (ii) are transmitted from a source port of 80. Once a BPF string is defined and in place, only packets matching that string are passed through the filter.

Protocol decoders 1512A, 1512B, 1512C, and 1512D may use various techniques to decode the data packets. A computationally efficient technique is described below. For the moment, it is safe to assume that protocol decoders

1512A, 1512B, 1512C, and 1512D are configured to decode a specific set of target protocols (e.g., protocols A and B above) into JSON or other intermediate formats. These intermediate formats are provided to merge module 1514. Protocol decoders 1512A, 1512B, 1512C, and 1512D may each execute independently on a dedicated set of one or more processing elements.

Merge module 1514 may aggregate the intermediate formats of data packets into hash tables. Thus, information in each of these intermediate formats from protocol decoder 1512, a single or combined field may be used as a key for one or more of the hash tables. As an example, the combination of destination IP address, IP protocol, and destination UDP port number may be used. Alternatively, any other unique identifier in the output from protocol decoder 1512 may be used. The latter technique is helpful as a higher-level network protocol typically has a unique identifier embedded within itself. For example a cookie in a group of HTTP transactions remains constant for a single user. This would allow data visualization and monitoring tool 1302 to show all HTTP traffic for a single user.

In some embodiments, there may be multiple hash tables with the different keys that are all associated with the same message group. Thus, getting a full view of the information associated with a particular message group may require reading information from multiple hash tables using multiple keys. An example of this is correlating a message group for a single user, who has used multiple different network protocols, such as HTTP for web browsing, SMTP for email, a vendor-specific protocol for voice-over-IP, etc. Each protocol may have a different unique key that is embedded within the network protocol.

Regardless, merge module may, for each intermediate format of a data packet received from protocol decoders 1512A, 1512B, 1512C, and 1512D, identify the protocol of the data packet, locate the key, and then use this key to store the intermediate representation in the hash table. This may result in data packets of specific message groups having their associated intermediate formats all having the same key and therefore being placed or appended into the same entry of the hash table. Merge module 1514 may also execute on a dedicated set of one or more processing elements.

Hash analyzers 1516A, 1516B, 1516C, and 1516D may read the aggregated intermediate representations from the hash table and conduct further processing on these representations. This reading may be triggered by the presence of a protocol-specific amount of information (e.g., two data packets of information, four data packets of information, 10,000 bytes of information, 50,000 bytes of information) in the hash table entry for a given key. In some cases, the hash table may be stored on one or more SSDs and a copy of this information may persist in the hash table for up to 24 hours or more before being overwritten in a first-in-first-out fashion.

Each of hash analyzers 1516A, 1516B, 1516C, and 1516D may independently operate on a different entry from the hash table. In this fashion, analysis on a message group and other analyses may be carried out in parallel for different message groups that share the same hash key. Alternatively, hash analyzers 1516A, 1516B, 1516C, and 1516D may independently operate on entries from the same message group. Thus, hash analyzers 1516A, 1516B, 1516C, and 1516D may each execute independently on a dedicated set of one or more processing elements.

Database interface 1518 receives output from hash analyzers 1516A, 1516B, 1516C, and 1516D (which may also be in a text-based format, such as JSON, or in a binary format). Database interface 1518 further provides this information to one or more databases. For example, as noted above, a cluster of NoSQL databases may be used.

In FIG. 15B, applications 1308 may encompass the filtering modules and protocol decoders, while processing 1310 may encompass the merge module, hash analyzers, and database interface. But other arrangements are possible. Further, more or fewer than four instances of the filtering modules, protocol decoders, and hash analyzers may be present.

Figure 15C:
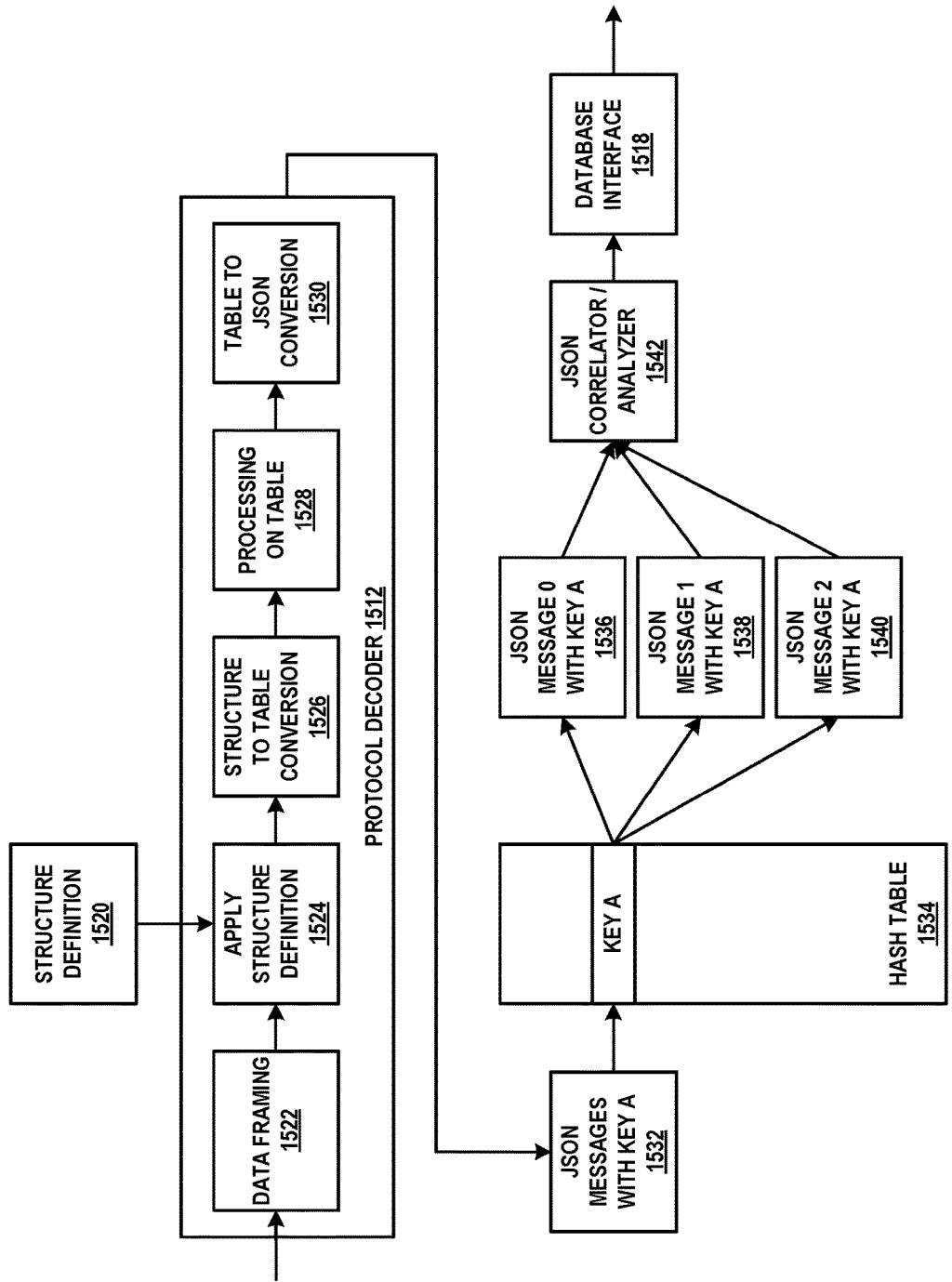
FIG. 15C depicts a more detailed schematic of the packet capture device arranged for packet decoding, in accordance with example embodiments.

A possible embodiment is shown in FIG. 15C for custom decoding of payload data. Therein, protocol decoder 1512 receives data packets (perhaps individually or in the form of chunks) into block 1522, which de-frames the application payload. This may involve combining TCP segments into messages, including re-ordering out of order TCP segments.

Block 1520 is a data structure (e.g., a "struct" of the C programming language) that defines the format of the payload. For example, this may include specifications of fields and the sizes thereof. This allows users to easily specify protocols for customized decoding. An example of such a structure for ICMPv4 is shown below.

```
typedef struct
{
    u8              Type;
    u8              Code;
    u16             CSum;
    u16             ID;
    u16             Seq;
} ICMPHeader_t;
```

At block 1524, this structure is applied to the de-framed application payload. At block 1526, the structure is automatically translated into an internal LUA table representation (e.g., using a foreign function interface (FFI)). LUA is an interpreted, object-oriented programming language that uses tables (e.g., associative arrays) to implement compound data structures. LUA also supports reflection and introspection APIs so that the values stored in custom tables can be obtained and manipulated without requiring that the user writes new code. Notably, this allows objects in LUA that are unknown at compile time to be manipulated and used at run time.

Block 1528 carries out processing on the LUA table, such as aggregating multiple fields to generate a unique key as described above. This simplifies downstream processing. Block 1530 converts the LUA table format to an intermediate format such as JSON. Given the LUA introspection and reflection abilities, this occurs automatically without the user having to define the JSON schema.

Block 1532 places JSON entries (representing messages from the data packets) into hash table 1534. For example, JSON entries with a key of A are placed in hash table 1534 in accordance with this key. Blocks 1536, 1538, and 1530 show that JSON entries stored in hash table 1534 using the key of A can be retrieved serially or in parallel.

Block 1542 analyzes the information from these and or other JSON entries and other hash tables, and provides them to database interface 1518. The latter stores either the resulting JSON in one or more databases or converts the JSON to another format for storage and then stores representations of the entries in that format. Notably, information is put into the hash table on a per-packet or per-message basis, but is retrieved on a per-key basis.

A further application that such a system can be used for is latency monitoring. Consider again the architecture of FIG. 15A. Suppose that packet capture device 1300A is located topologically close to client device 1502 (e.g., on the same local area network segment) and packet capture device 1300B is located topologically close to server device 1504. In such an arrangement, highly-accurate measurements of unidirectional and round trip latency between client device 1502 and server device 1504 may be obtained.

For example, ICMP echo request (ping) packets may be transmitted from client device 1502 to server device 1504. These echo request packets may include a timestamp and a sequence number, as well as a payload that is typically padded with zeroes. In response to receiving an echo request packet, server device 1504 may transmit, to client device 1502, an echo response packet that contains the timestamp and sequence number. After receiving the echo response packet, client device can correlate the sequence numbers and compare the current time to the timestamp to determine round-trip latency between itself and server device 1504.

With packet capture device 1300A and packet capture device 1300B arranged as stated, unidirectional latencies between client device 1502 and server device 1504 that are accurate within a few nanoseconds can be determined. For example, the ping command can be executed from a command line with a parameter (e.g., "ping 192.168.1.1 -d 0xa1b2c3d4e5f6") that places this key in the payload portion of the generated ICMP packets, and can later be used for correlating the ICMP packets captured at packet capture device 1300A and packet capture device 1300B. The targeted recipient of an ICMP echo request with such a key may copy the key to the corresponding ICMP echo reply. Further, some embodiments may involve more than two packet capture devices in the path of the ICMP packets and configured to capture these packets.

The hardware/software configuration of packet capture device 1300A will be described below. Since the hardware/software configuration of packet capture device 1300B is largely identical (aside, of course, from assigned IP addresses, Ethernet addresses, and related information) to that of packet capture device 1300A, only the components of packet capture device 1300A will be discussed in detail.

Figure 15D:
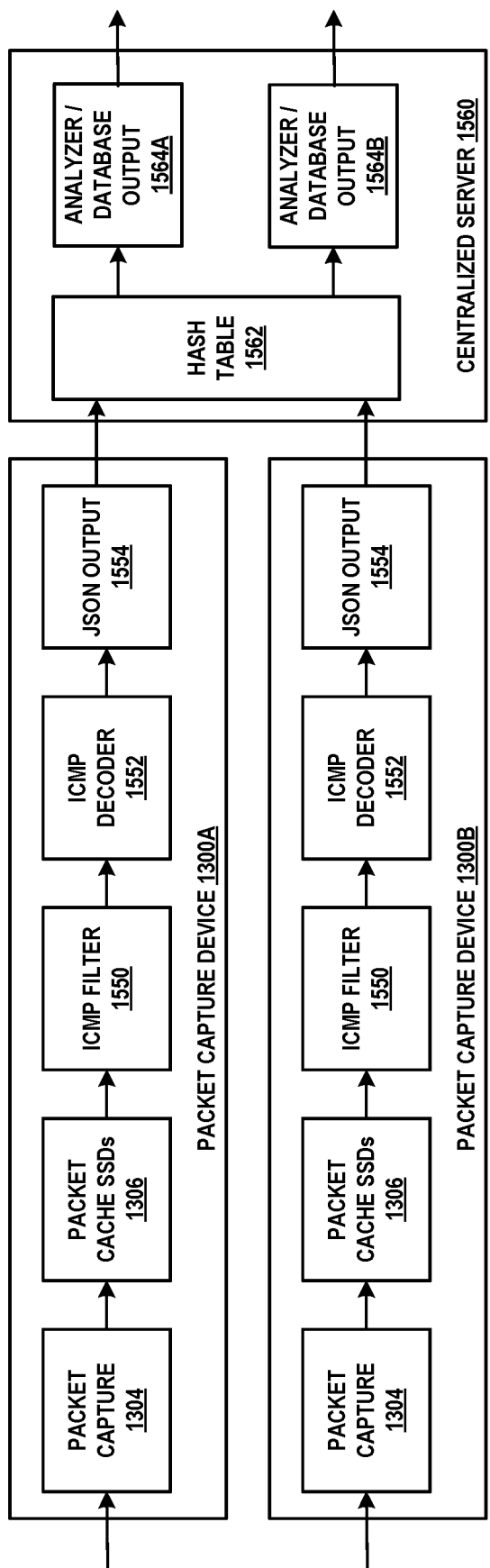
FIG. 15D depicts an implementation of the packet capture device arranged for packet decoding, in accordance with example embodiments.

In FIG. 15D, packet capture device 1300A includes packet capture module 1304 and packet cache SSDs 1306. ICMP filter 1550 may be a configuration of a filtering module of FIG. 15B (e.g., filtering module 1510A) arranged to pass only ICMP packets or ICMP packets with specific source and/or destination IP addresses or Ethernet addresses. ICMP decoder 1552 may be a configuration of a protocol decoder from FIG. 15B (e.g., protocol decoder 1512A) configured to decode ICMP packets and generate corresponding representations of these packets in an intermediate format such as JSON. Particularly, FIG. 15D shows ICMP decoder 1552 producing JSON output 1554 (e.g., including capture timestamp, source and/or destination Ethernet addresses, source and/or destination IP addresses, the ping timestamp, sequence number, and/or key), which packet capture device 1300A provides to centralized server 1560. ICMP filter 1550 and ICMP decoder 1552 may operate on the ICMP packets of each chunk as a group, and thus JSON output 1554 may represent multiple ICMP packets, potentially from multiple invocations of ICMP producing multiple ICMP flows.

Note that implementation of a packet capture device configured for ICMP is just one example. Packet capture devices can be configured in a similar fashion for one or more other types of protocols.

Since only ICMP packets are processed in this configuration and these packets are expected to be relatively low-volume (e.g., one ICMP echo request generated per second), only one instance of ICMP filter 1550 and ICMP decoder 1552 are shown in each of packet capture device 1300A and 1300B. But these modules can be scaled up to multiple instances if needed.

Centralized server 1560 may be another instance of the packet capture device or a more general computer. It receives information regarding captured ICMP packets, and stores them in hash table 1562 using the key as index. Then, analyzer/database output 1564A and 1564B process the information in hash table 1562 to determine hop latency, network segment latency, and round trip times with nanosecond accuracy. This information can be stored in database cluster 1506 for further review. In some embodiments, centralized server 1560 may be part of database cluster 1506.

Put another way, client device 1502 may transmit an ICMP echo request packet to server device 1504 with a particular key. Packet capture device 1300A may capture this packet, filter and convert it as described to JSON, and transmit the JSON representation to centralized server 1560. Packet capture device 1300B may also capture this packet (or the corresponding packet produced by message processing device 1500), filter and convert it as described to JSON, and transmit the JSON representation to centralized server 1560. Server device 1504 receives the ICMP echo request packet and replies with an ICMP echo response packet. Packet capture device 1300B may capture this packet, filter and convert it as described to JSON, and transmit the JSON representation to centralized server 1560. Packet capture device 1300A may also capture this packet (or the corresponding packet produced by message processing device 1500), filter and convert it as described to JSON, and transmit the JSON representation to centralized server 1560.

In this fashion, centralized server 1560 has received four JSON representations of the flow, two of the ICMP echo request and two of the ICMP echo response, all with the same key. Accurate latency calculations between client device 1502 and server device 1504 can be determined from these representations. For example, these latency calculations may determine the delays introduced by message processing device 1500 and/or server device 1504.

FIG. 15E is a flow chart illustrating an example embodiment. The process illustrated by FIG. 15E may be carried out by one or more processors and memories of a packet capture device, for example.

Block 1570 may include performing, by a first array of processing elements and in an independent and asynchronous fashion, a first set of operations that involve: (i) reading a chunk of data packets from a non-volatile memory, wherein the data packets were received by way of a network interface module in a binary format (ii) filtering the data packets within the chunk so that a subset of the data packets remain, (iii) reading a content specification for a particular type of data packet, wherein the content specification indicates how to construct one or more unique transaction keys for the particular type of data packet or message therein, and (iv) decoding the data packets in the subset from the binary format to an intermediate format based on the content specification, wherein the intermediate format includes a transaction key.

Block 1572 may include performing, by a second array of processing elements, a second set of operations, wherein the second set of operations involve: (i) receiving the data packets as decoded by the first array of processing elements, (ii) storing, in a hash table indexed by the transaction key, the data packets as decoded in the intermediate format, (iii) reading the data packets as stored, (iv) analyzing the data packets as read to identify a pre-determined set of characteristics, and (v) writing, by way of an interface, the characteristics identified by the analysis to a database.

The arrays of processing elements may include groups of processing elements that independently and asynchronously perform the first set of operations on multiple chunks in parallel, with each chunk being performed upon by a different group. Further, the second set of operations may occur at least partially in parallel to the first set of operations.

In some embodiments, reading the chunk of data packets and filtering the data packets are carried out by different instances of the processing elements as reading the content specification and decoding the data packets.

In some embodiments, the content specification defines an arrangement of fields within the particular type of data packet, wherein the transaction key is based on values from one or more of the fields.

In some embodiments, decoding the data packets in the subset from the binary format to the intermediate format comprises: (i) converting the content specification to a table that can be programmatically introspected; (ii) mapping values of fields of the data packets in the subset to entries in the table; and (iii) converting the entries in the table to the intermediate format.

In some embodiments, storing the data packets as decoded comprises: (i) identifying, in the hash table, a location associated with the transaction key; and (ii) storing entries for the data packets as decoded in the location.

In some embodiments, storing the data packets as decoded in the intermediate format and analyzing the data packets as read are carried out by different instances of the second array of processing elements.

In some embodiments, the pre-determined set of characteristics includes latency characteristics, packet count characteristics, byte count characteristics, or values in fields of the data packets as read.

In some embodiments, a further array of processing elements reads data packets from the network interface module in hard real-time with latencies within a first threshold.

In some embodiments, the first set of operations and the second set of operations are performed in soft real-time with average latency within a second threshold, wherein the second threshold is greater than the first threshold.

In some embodiments, the non-volatile memory comprises an array of SSDs.

In some embodiments, the database is external to a device containing the first array of processing elements and the second array of processing elements.

In some embodiments, the database is a non-relational database.

In some embodiments, the intermediate format is one of JSON, XML, or a second binary format.

In some embodiments, the network interface module is configured to: (i) receive n packets; (ii) capture 1 of the n packets; and (iii) transmit n−1 of the n packets to a subsequent packet capture system that is arranged in series (see below for details).

Some embodiments may involve a virtual machine, configured to execute on a further array of processing elements, wherein a packet processing application executes on the virtual machine, and wherein a zero copy forwarding buffer allows the packet processing application to read data packets from the non-volatile memory without any packet loss (see below for details).

VIII. SCALING HIGH SPEED PACKET CAPTURE

Further embodiments allow any of the packet capture device architectures described herein to be scaled up to allow multiple packet capture devices to operate in tandem. This facilitates a higher overall throughput of the packet capture system by splitting incoming packet load between the packet capture devices.

Figure 16A:
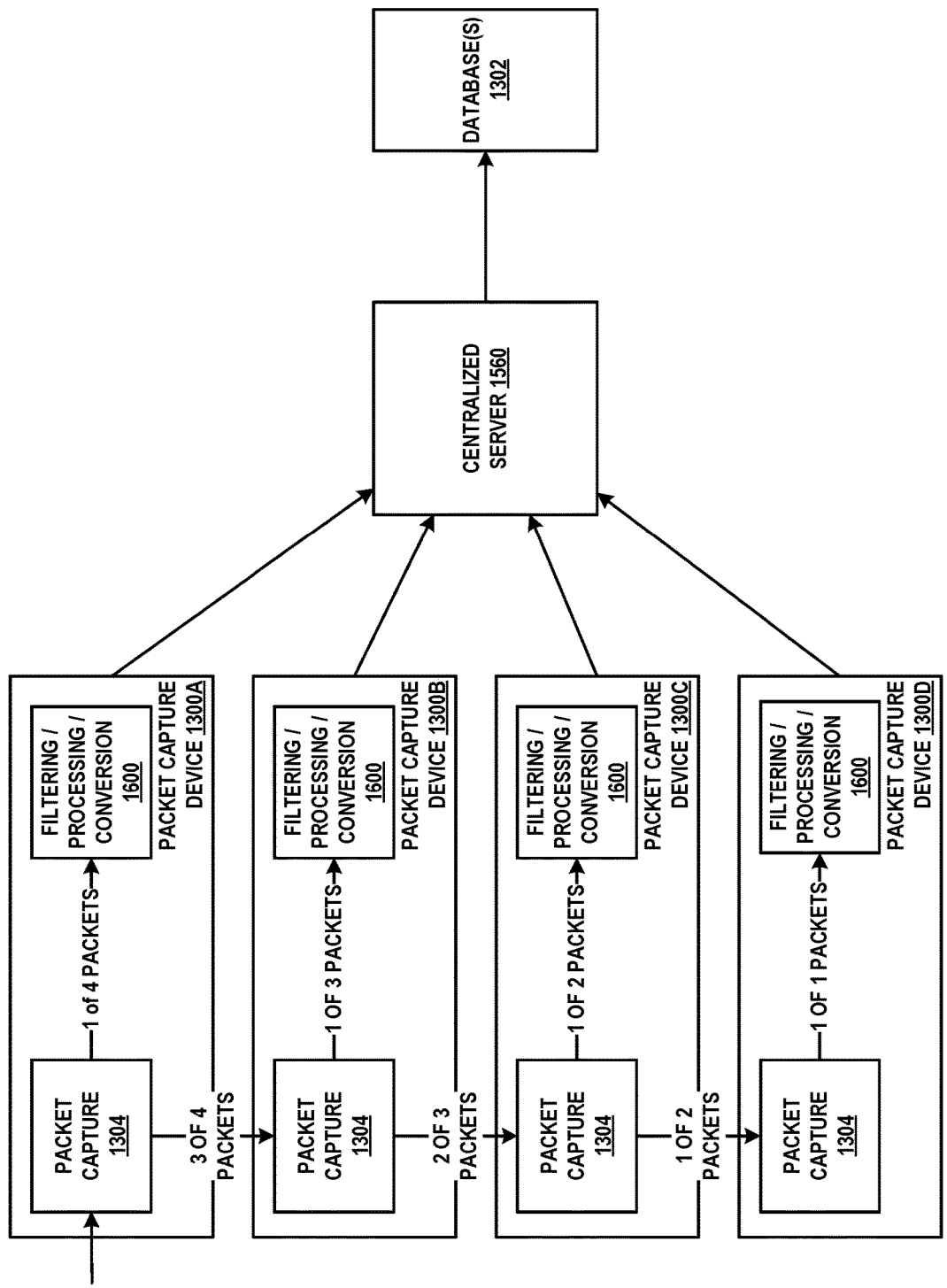
FIG. 16A depicts an arrangement of packet capture devices in tandem, in accordance with example embodiments.

Such an arrangement is depicted in FIG. 16A for four packet capture devices. Packet capture devices 1300A, 1300B, 1300C, and 1300D operate in tandem to load balance packet capture and processing tasks. Notably, packet capture module 1304 of packet capture device 1300A captures 1 of every 4 incoming packets, and forwards the remaining 3 on to packet capture device 1300B. Similarly, packet capture module 1304 of packet capture device 1300B captures 1 of every 3 incoming packets, and forwards the remaining 2 on to packet capture device 1300C. Likewise, packet capture module 1304 of packet capture device 1300C captures 1 of every 2 incoming packets, and forwards the remaining 1 on to packet capture device 1300D. Packet capture device 1300D captures all packets that it receives.

More generally, suppose that there are $n>0$ packet capture devices arranged in tandem as shown. The ith packet capture device in this arrangement captures 1 of every $n-i+1$ packets (where $n \geq i > 0$), and forwards the remaining $n-i$ packets to the next packet capture device in the sequence. Thus, 1 out of every n packets is captured and operated upon by filtering/processing/conversion module(s) 1600 of each packet capture device. Each instance of filtering/processing/conversion module(s) 1600 may take on the roles of the filtering module, protocol decoder, merge module, hash analyzer, and/or database interface of FIG. 15B, for example.

Further, each packet capture device may transmit representations of packets and/or flows in an intermediate format to centralized server 1560. Centralized server 1560 may then correlate these representations and store them in database(s) 1302.

Figure 16B:
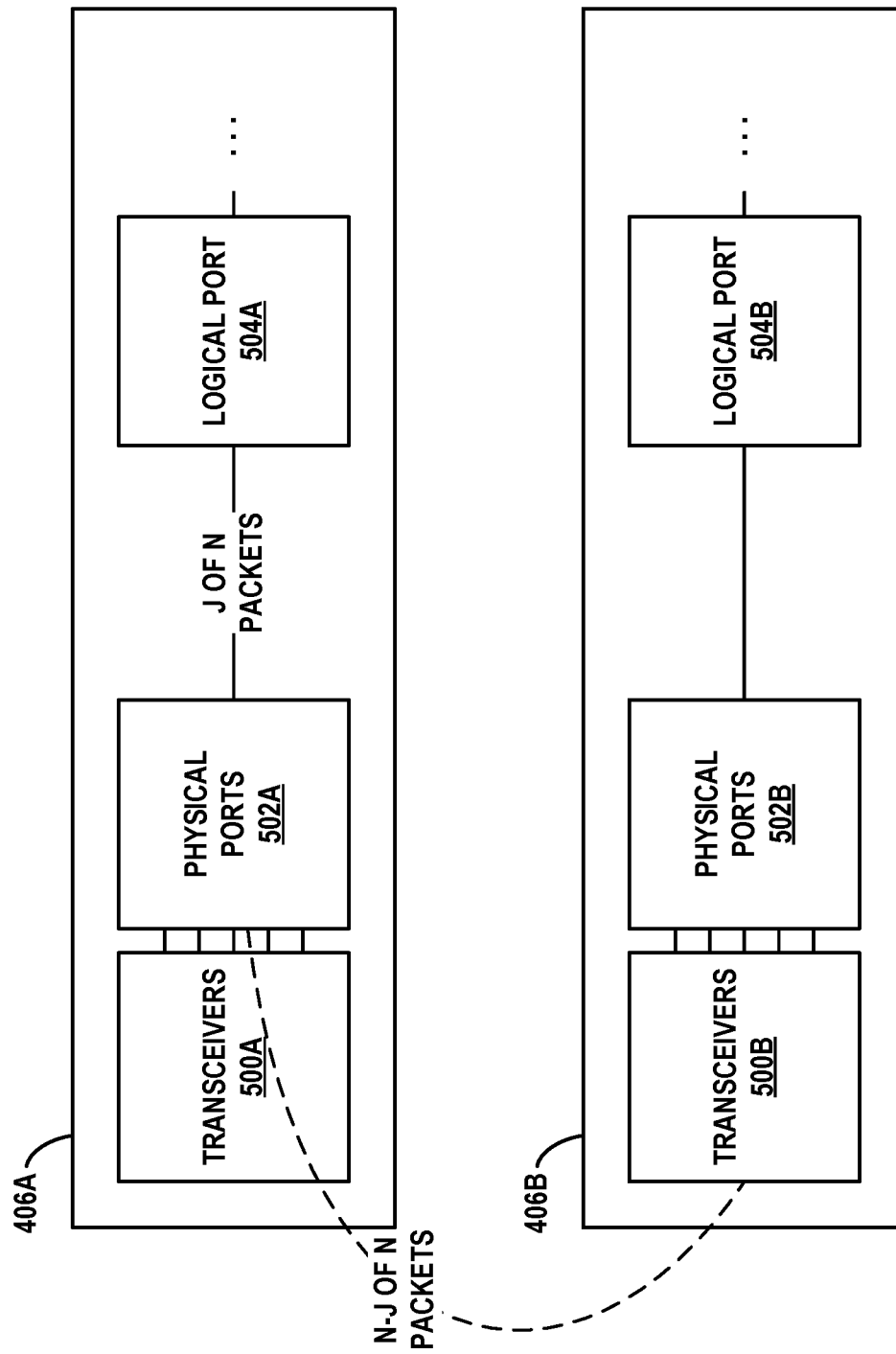
FIG. 16B depicts an arrangement of a packet capture interface with j of n filtering, in accordance with example embodiments.

FIG. 16B depicts a possible implementation of how the packet capture devices can perform these operations. FPGA-based network interface 406A and FPGA-based network interface 406B are embodiments of FPGA-based network interface 406 with several components not shown for purposes of simplicity. Physical ports 502A of FPGA-based network interface 406A includes a j-of-n filter for data packets. For example, physical ports 502A may be configured to pass j packets of every n on to logical port 504A for further packet capture processing, while routing the remaining n−j of every n packets to FPGA-based network interface 406B.

To do so, physical ports 502A may be arranged to transmit these n−j of every n packets out of transceivers 500A and into transceivers 500B of FPGA-based network interface 406B. Transceivers 500B may then provide these packets to physical ports 502B. The latter may be configured with another filter that (i) selects a subset of the received packets for forwarding to logical port 504B and further packet capture processing, and (ii) forward the remaining packets to a third packet capture device that is not shown in FIG. 16B. Alternatively, if FPGA-based network interface 406B is in the last packet capture device arranged in sequence, physical ports 502B might not apply a filter and may instead forward all packets on to logical port 504B for further packet capture processing.

As described above, j may be 1 but other values of j are possible. Further, n may take on any reasonable value (e.g., 2, 3, 4, 5, 8, 10, 16, etc.).

IX. IN-PLACE PACKET CAPTURE PROCESSING VIA VIRTUALIZATION

Figure 17:
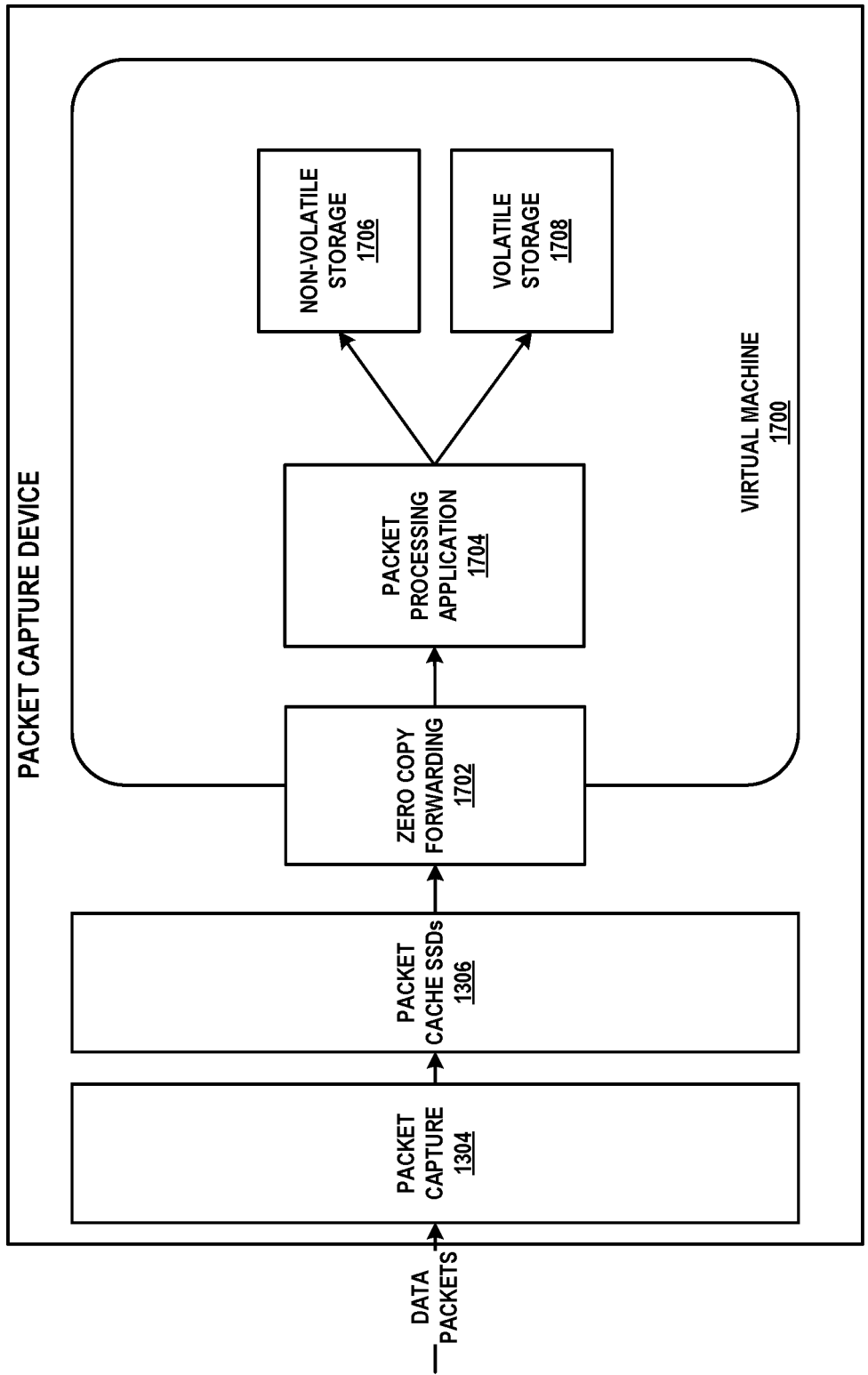
FIG. 17 depicts an arrangement of a packet capture device hosting a virtual machine, in accordance with example embodiments.

FIG. 17 depicts another possible embodiment of a packet capture device using the same hardware described above. In this case, packet capture device 1300 is configured to include packet capture module 1304, packet caches SSDs 1306, and one or more processing elements executing virtual machine 1700.

In general, a virtual machine is an emulation of a computing system, and mimics the functionality (e.g., processor, memory, and communication resources) of a physical computer. One physical computing system, such as packet capture device 1300, may support up to thousands of individual virtual machines. In some embodiments, virtual machines may be managed by a centralized server device or application that facilitates allocation of physical computing resources to individual virtual machines, as well as performance and error reporting. Virtual machines are often employed in order to allocate computing resources in an efficient, as needed fashion. Providers of virtualized computing systems include VMWARE® and MICROSOFT®. In some embodiments, a virtual machine may refer to a containerized application and/or its associated software infrastructure. Thus, for purposes of this disclosure, a virtual machine may refer to a DOCKER® container, a COREOS® rkt container, or some other forms of container.

Captured data packets are provided to virtual machine 1700 by way of zero copy forwarding 1702. These data packets are processed by packet processing application 1704, and then the results of this processing (e.g., packet-level or flow-level details or summaries) are stored either long-term in non-volatile storage 1706 or short-term in volatile storage 1708 within the virtualized system.

Thus, packet capture device 1300 can be a "host" that runs a "guest" operating system in virtual machine 1700. Packet capture device 1300 acts as a queue/packet cache for virtual machine 1700. Further, zero copy forwarding 1702 may be an implementation of LINUX® XDP, which provides efficient, high bandwidth, zero packet loss transfer of packets from an interface or storage to an application in the form of a FIFO queue with flow control.

The advantages of this system is that the guest operating system needs no modifications and can run without any knowledge of the packet capture system around it. It can also use standard well documented interface designations to receive packet capture data, such as the LINUX® networking system. In other words the physical ports of packet capture device 1300 may appear to virtual machine 1700 in a familiar UNIX format, such as "if0", "if1", "eth0", "eth1", etc.

There are multiple advantages to this approach. The guest operating system and application need no modifications, as uses existing interfaces. Also, no packet loss occurs, as the guest operating system must drain the FIFO queue before packet capture device 1300 sends more data packets. Moreover, packet processing application 1704 can process incoming data packets without any hard real-time processing constraints. This vastly reduces the chance for packet loss and incorrect analysis. Additionally, this architecture provides a highly-secure and confidential system—packet capture can be separated from packet analysis. Thus, packet processing application 1704 can manipulate captured packets using proprietary techniques without packet capture device 1300 being explicitly aware of this manipulation.

X. CONCLUSION

The present disclosure is not to be limited in terms of the particular embodiments described in this application, which are intended as illustrations of various aspects. Many modifications and variations can be made without departing from its scope, as will be apparent to those skilled in the art. Functionally equivalent methods and apparatuses within the scope of the disclosure, in addition to those described herein, will be apparent to those skilled in the art from the foregoing descriptions. Such modifications and variations are intended to fall within the scope of the appended claims.

The above detailed description describes various features and operations of the disclosed systems, devices, and methods with reference to the accompanying figures. The example embodiments described herein and in the figures are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations.

With respect to any or all of the message flow diagrams, scenarios, and flow charts in the figures and as discussed herein, each step, block, and/or communication can represent a processing of information and/or a transmission of information in accordance with example embodiments. Alternative embodiments are included within the scope of these example embodiments. In these alternative embodiments, for example, operations described as steps, blocks, transmissions, communications, requests, responses, and/or messages can be executed out of order from that shown or discussed, including substantially concurrently or in reverse order, depending on the functionality involved. Further, more or fewer blocks and/or operations can be used with any of the ladder diagrams, scenarios, and flow charts discussed herein, and these ladder diagrams, scenarios, and flow charts can be combined with one another, in part or in whole.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical operations or actions in the method or technique. The program code and/or related data can be stored on any type of computer readable medium such as a storage device including RAM, a disk drive, or another storage medium.

The computer readable medium can also include non-transitory computer readable media such as computer readable media that store data for short periods of time like register memory and processor cache. The computer readable media can further include non-transitory computer readable media that store program code and/or data for longer periods of time. Thus, the computer readable media may include secondary or persistent long term storage, like ROM, optical or magnetic disks, compact-disc read only memory (CD-ROM), for example. The computer readable media can also be any other volatile or non-volatile storage systems. A computer readable medium can be considered a computer readable storage medium, for example, or a tangible storage device.

Moreover, a step or block that represents one or more information transmissions can correspond to information transmissions between software and/or hardware modules in the same physical device. However, other information transmissions can be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purpose of illustration and are not intended to be limiting, with the true scope being indicated by the following claims.

What is claimed is:

1. A system comprising:
a first plurality of processors configured to perform a first set of operations that involve: (i) reading, by a plurality of conversion applications, chunks of data packets independently and in parallel from memory, (ii) identifying flows of the data packets within the chunks, (iii) generating a plurality of flow representations for the flows, one or more flow representations per conversion application, and (iv) discarding the data packets for which the flows were identified; and
a second plurality of processors configured to perform a second set of operations that involve: (i) receiving the flow representations from the first plurality of processors, (ii) identifying and aggregating common flows across the plurality of flow representations into an aggregated flow representation, and (iii) writing information from the aggregated flow representation to a database.

2. The system of claim 1, wherein the first set of operations and the second set of operations are performed in parallel.

3. The system of claim 1, wherein the first set of operations and the second set of operations are performed by at least two different devices.

4. The system of claim 1, further comprising:
a third plurality of processors configured to execute a protocol decoding application, wherein execution of the protocol decoding application involves: (i) receiving the data packets, (ii) applying a data structure containing a protocol format definition to a payload contained within the data packets, and (iii) based on the applying of the data structure to the payload, generating a representation of sections of the payload in a structured data format.

5. The system of claim 4, wherein the third plurality of processors overlaps at least in part with the second plurality of processors.

6. The system of claim 4, wherein execution of the protocol decoding application also involves storing the sections of the payload in an associative array, and wherein generating the representation of the sections of the payload comprises generating the representation of the sections from the associative array.

7. The system of claim 4, wherein the structured data format is based on JavaScript Object Notation (JSON), and wherein the representation of the sections of the payload are defined without a JSON schema.

8. The system of claim 1, wherein the plurality of flow representations are in an intermediate format that aggregates header information and metadata associated with the data packets respectively corresponding to the flows, and wherein the metadata includes one or more of a count of the data packets or a count of bytes in the data packets, a device identifier for the system, or a physical port through which the data packets were received by the system.

9. The system of claim 1, wherein aggregating the common flows across the plurality of flow representations into the aggregated flow representation comprises summing respective packet counts or byte counts from the common flows in the aggregated flow representation.

10. The system of claim 1, wherein identifying flows of data packets within the chunks comprises calculating, based on header field values of the data packets within the chunks, respective hash values, wherein the respective hash values uniquely denote corresponding flows to which the data packets belong.

11. The system of claim 1, further comprising:
a third plurality of processors configured to read data packets from a network interface module in hard real-time with latencies within a first threshold.

12. The system of claim 11, wherein the first set of operations and the second set of operations are performed in soft real-time with average latency within a second threshold, wherein the second threshold is greater than the first threshold.

13. The system of claim 1, wherein different processors of the second plurality of processors perform operations each of: identifying and aggregating common flows, removing the flows from the aggregated flow representation, and writing the information from the aggregated flow representation to the database.

14. The system of claim 1, wherein a filter specification passes the flows that match a whitelist or the filter specification passes the flows that are in a set of top m flows in terms of number of data packets or number of bytes, wherein m is between 1 and 10,000.

15. The system of claim 1, further comprising:
a further array of processors configured to provide a virtual environment, wherein a packet processing application is executable on the virtual environment, and wherein a forwarding buffer allows the packet processing application to read data packets from the memory.

16. A method comprising:
performing, by a first plurality of processors, a first set of operations that involve: (i) reading, by a plurality of conversion applications, chunks of data packets independently and in parallel from memory, (ii) identifying flows of the data packets within the chunks, (iii) generating a plurality of flow representations for the flows, one or more flow representations per conversion application, and (iv) discarding the data packets for which the flows were identified; and
performing, by a second plurality of processors, a second set of operations that involve: (i) receiving the flow representations from the first plurality of processors, (ii) identifying and aggregating common flows across the plurality of flow representations into an aggregated flow representation, and (iii) writing information from the aggregated flow representation to a database.

17. The method of claim 16, further comprising:
performing, by a third plurality of processors configured to execute a protocol decoding application: (i) receiving the data packets, (ii) applying a data structure containing a protocol format definition to a payload contained within the data packets, and (iii) based on the applying of the data structure to the payload, generating a representation of sections of the payload in a structured data format.

18. The method of claim 17, wherein the third plurality of processors overlaps at least in part with the second plurality of processors.

19. The method of claim 17, wherein execution of the protocol decoding application also involves storing the sections of the payload in an associative array, and wherein generating the representation of the sections of the payload comprises generating the representation of the sections from the associative array.

20. The method of claim 17, wherein the structured data format is based on JavaScript Object Notation (JSON), and wherein the representation of the sections of the payload are defined without a JSON schema.

* * * * *